(12) United States Patent
Millward et al.

(10) Patent No.: US 8,815,497 B2
(45) Date of Patent: Aug. 26, 2014

(54) SEMICONDUCTOR CONSTRUCTIONS AND METHODS OF FORMING PATTERNS

(71) Applicant: Micron Technology, Inc., Boise, ID (US)

(72) Inventors: Dan Millward, Boise, ID (US); Kaveri Jain, Boise, ID (US); Zishu Zhang, Fremont, CA (US); Lijing Gou, Boise, ID (US); Anton J. deVillers, Clifton, NY (US); Jianming Zhou, Boise, ID (US); Yuan He, Boise, ID (US); Michael Hyatt, Boise, ID (US); Scott L. Light, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/941,747

(22) Filed: Jul. 15, 2013

(65) Prior Publication Data
US 2013/0302981 A1 Nov. 14, 2013

Related U.S. Application Data

(62) Division of application No. 12/836,495, filed on Jul. 14, 2010, now Pat. No. 8,486,611.

(51) Int. Cl.
*G03F 7/26* (2006.01)

(52) U.S. Cl.
USPC .......................................... 430/314; 430/330

(58) Field of Classification Search
USPC .......................................... 430/314, 330, 313
See application file for complete search history.

(56) References Cited

U.S. PATENT DOCUMENTS

| | | |
|---|---|---|
| 2002/0111039 A1 | 8/2002 | Moore |
| 2007/0224823 A1 | 9/2007 | Sandhu |
| 2008/0176767 A1 | 7/2008 | Millward |
| 2008/0182402 A1 | 7/2008 | Li et al. |
| 2008/0193658 A1* | 8/2008 | Millward ................ 427/401 |
| 2009/0200646 A1 | 8/2009 | Millward et al. |

OTHER PUBLICATIONS

Bita, Ion et al., Supporting Online Material for "Graphoepitaxy of Self Assembled Block Copolymers on Two-Dimensional Periodic Patterned Templates" Aug. 15, 2008, Science 321, 939-943.
Ruiz, Ricardo et al., "Density Multiplication and Improved Lithography by Directed Block Copolymer Assembly", Aug. 15, 2008 Science 321, 936-939.

* cited by examiner

*Primary Examiner* — Caleen Sullivan
(74) *Attorney, Agent, or Firm* — Wells St. John P.S.

(57) ABSTRACT

Some embodiments include methods of forming patterns. A semiconductor substrate is formed to comprise an electrically insulative material over a set of electrically conductive structures. An interconnect region is defined across the electrically conductive structures, and regions on opposing sides of the interconnect region are defined as secondary regions. A two-dimensional array of features is formed over the electrically insulative material. The two-dimensional array extends across the interconnect region and across the secondary regions. A pattern of the two-dimensional array is transferred through the electrically insulative material of the interconnect region to form contact openings that extend through the electrically insulative material and to the electrically conductive structures, and no portions of the two-dimensional array of the secondary regions is transferred into the electrically insulative material.

24 Claims, 56 Drawing Sheets

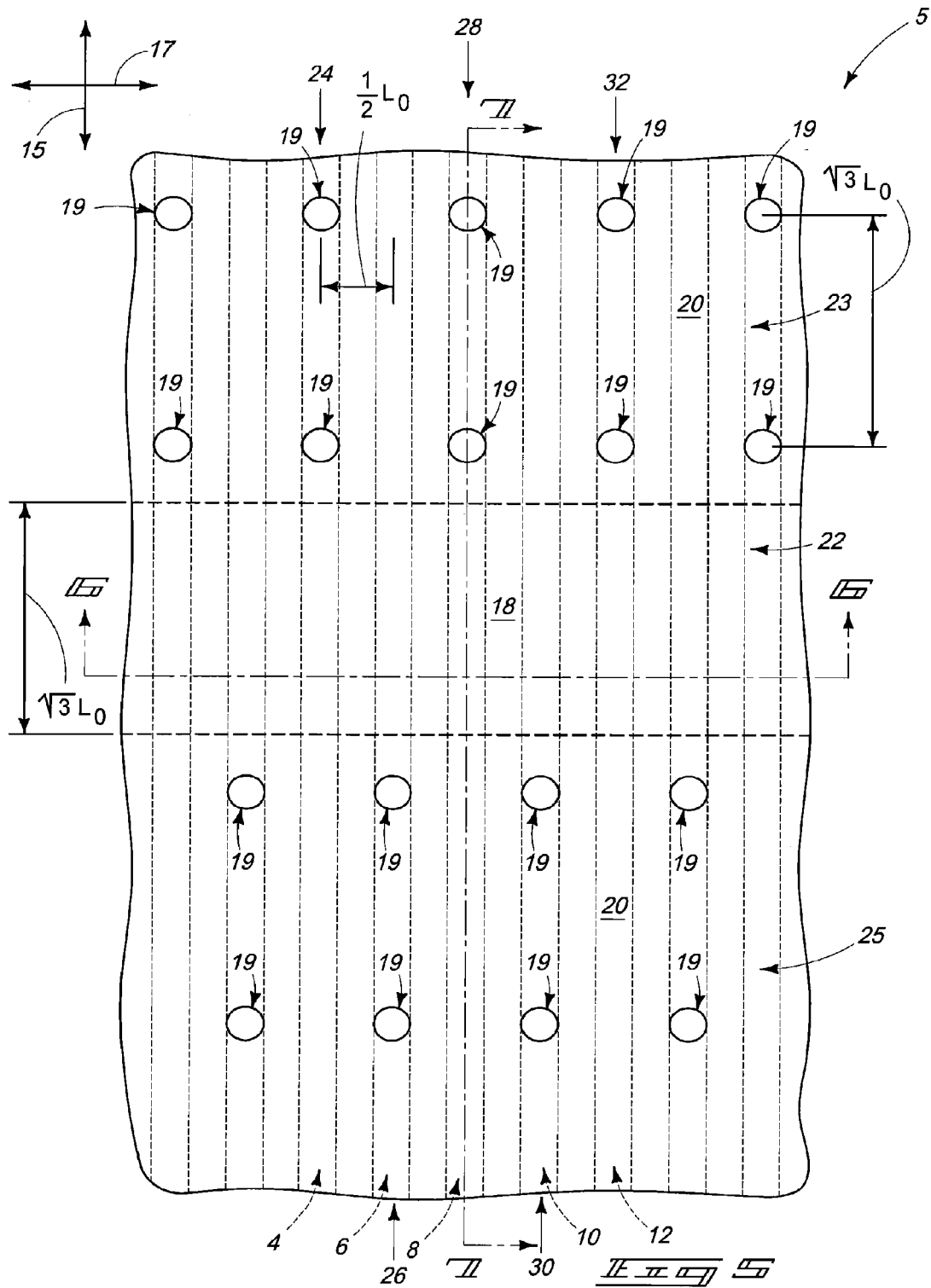

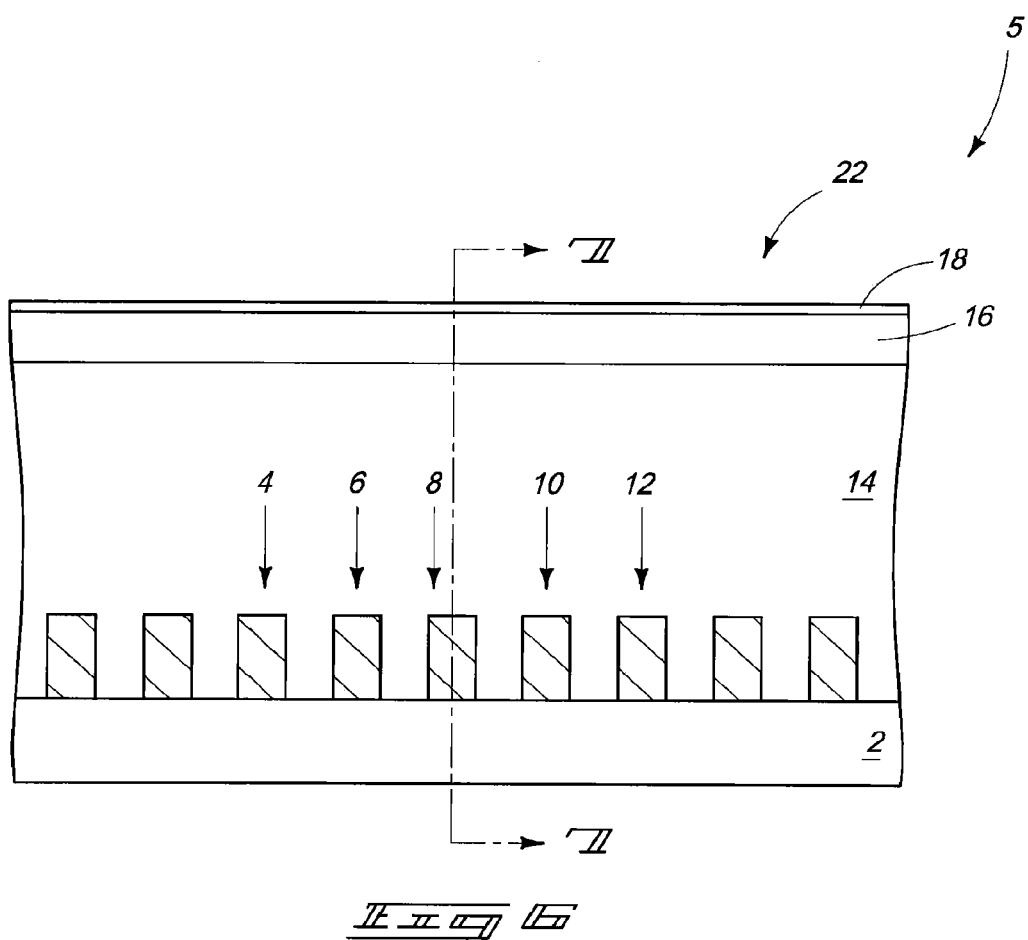

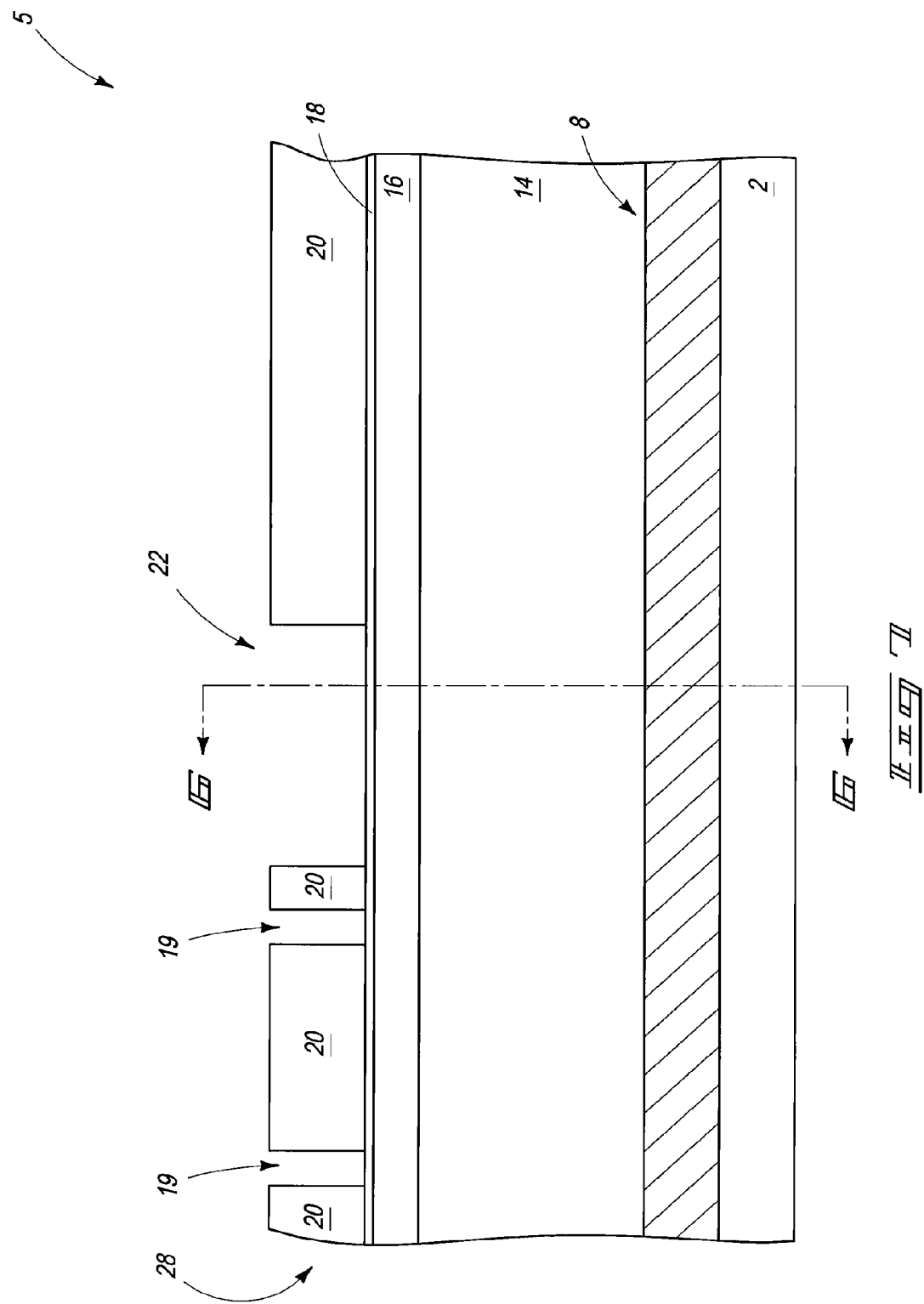

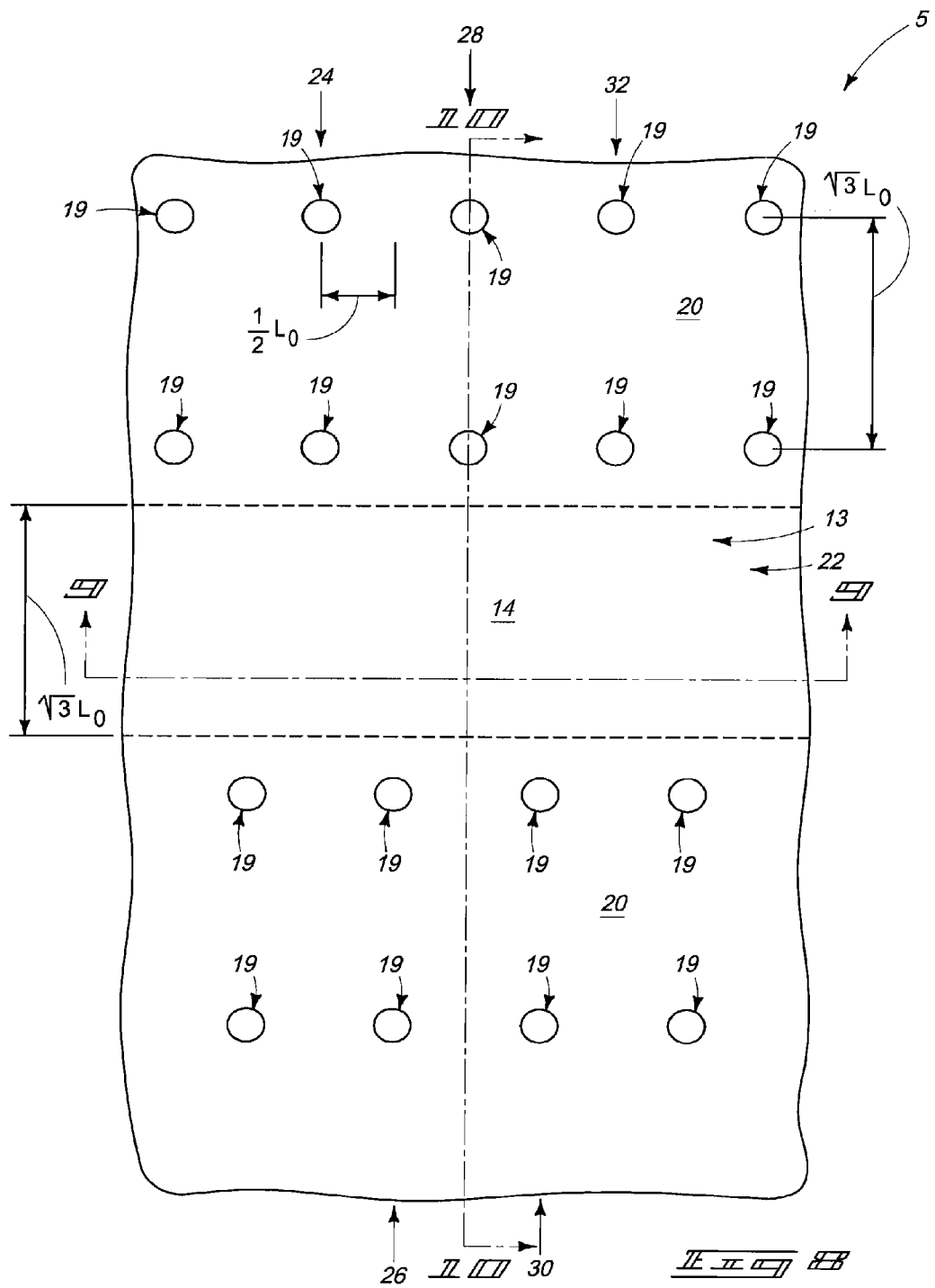

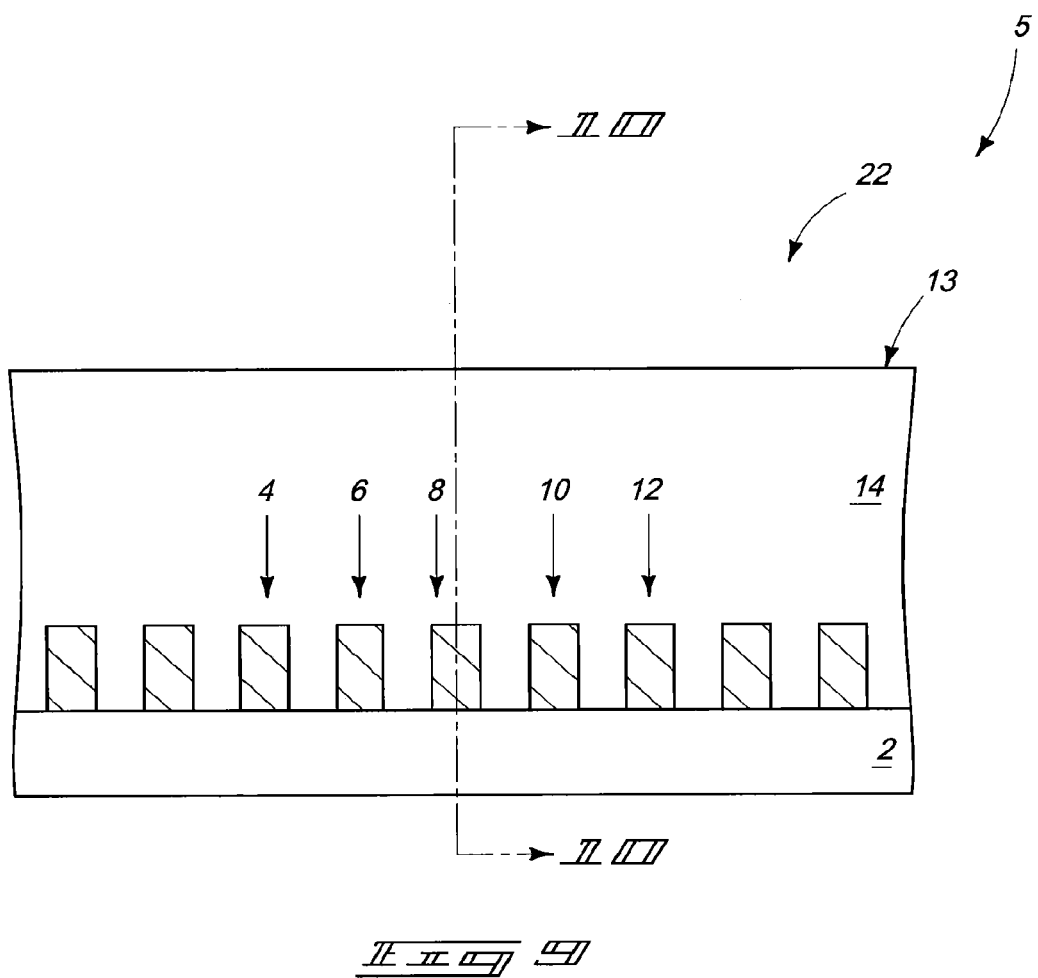

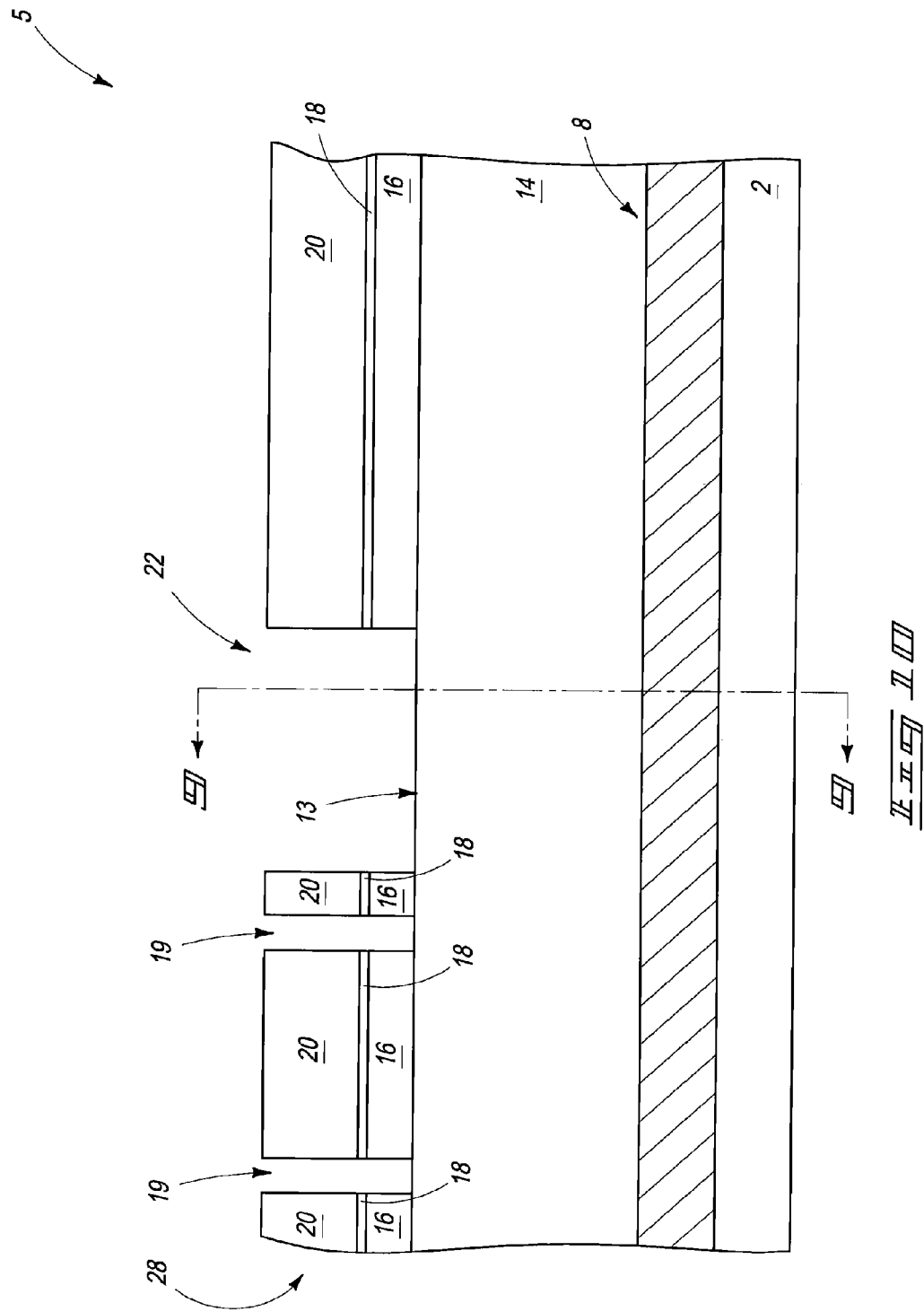

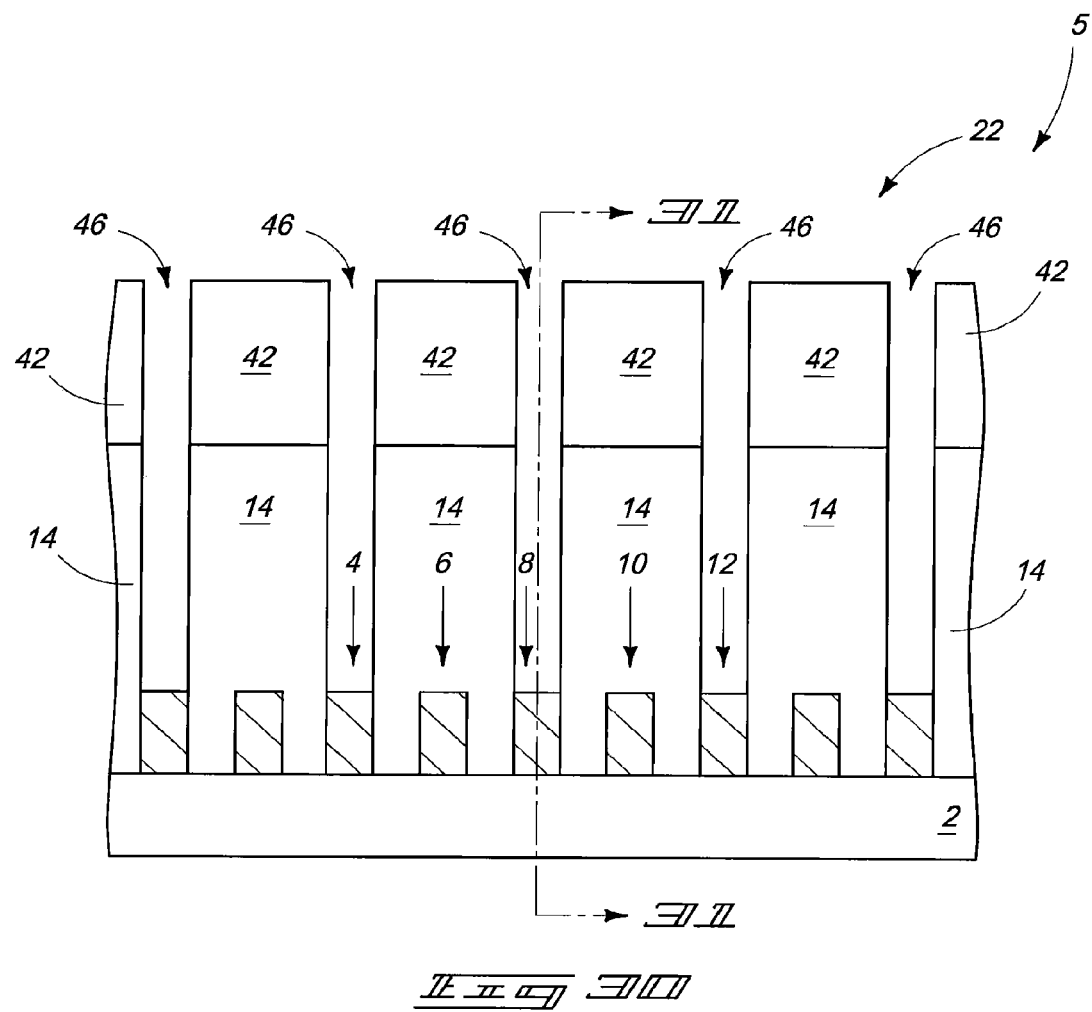
_FIG 30_

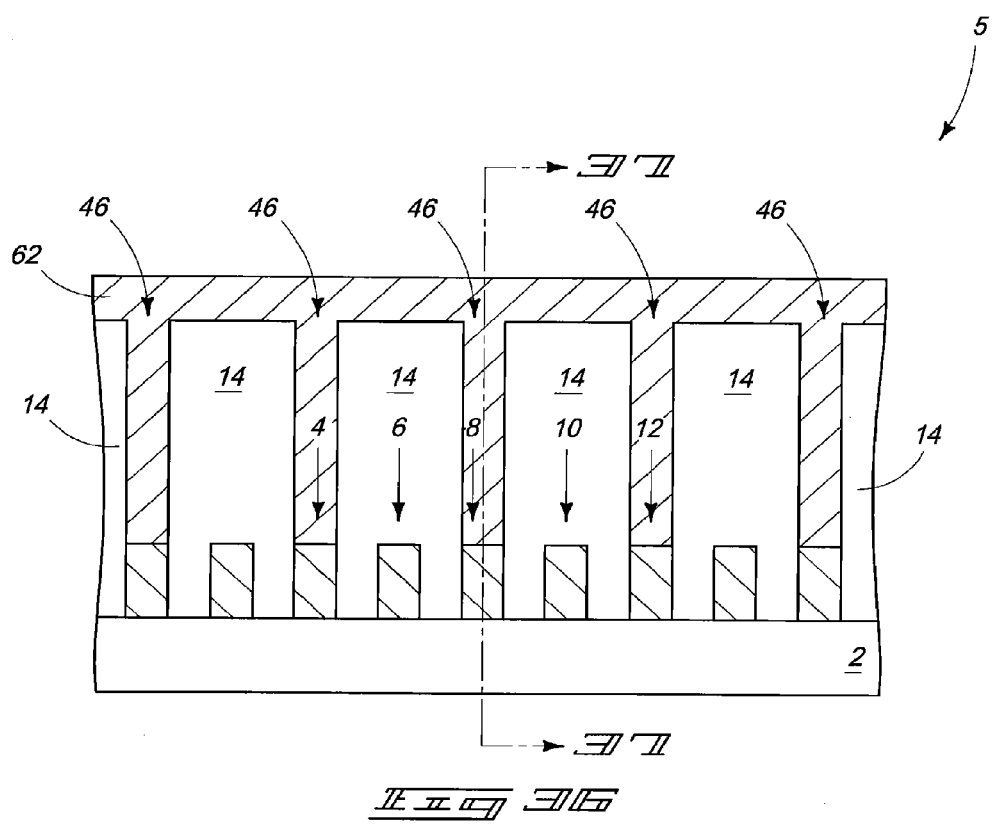

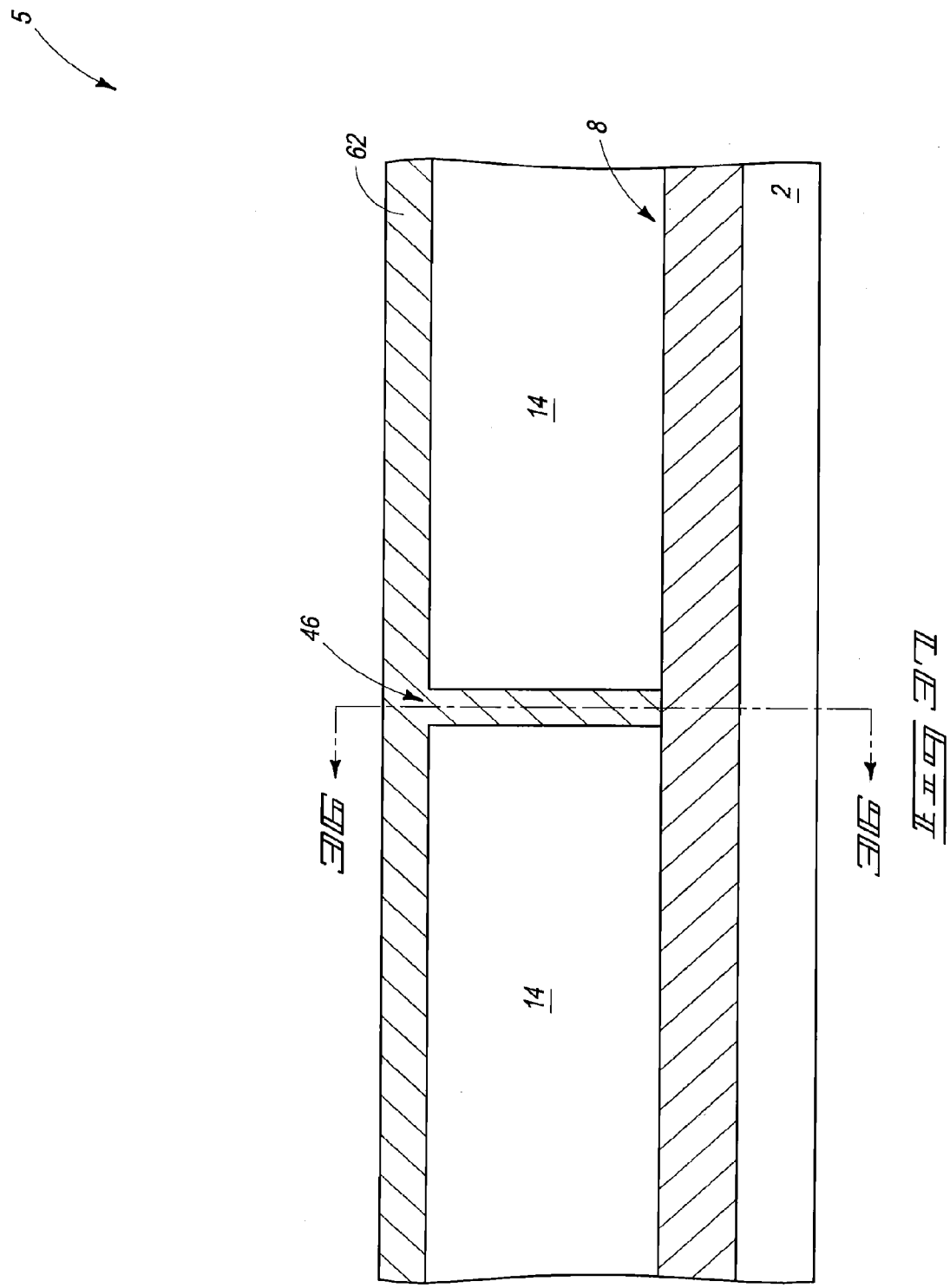

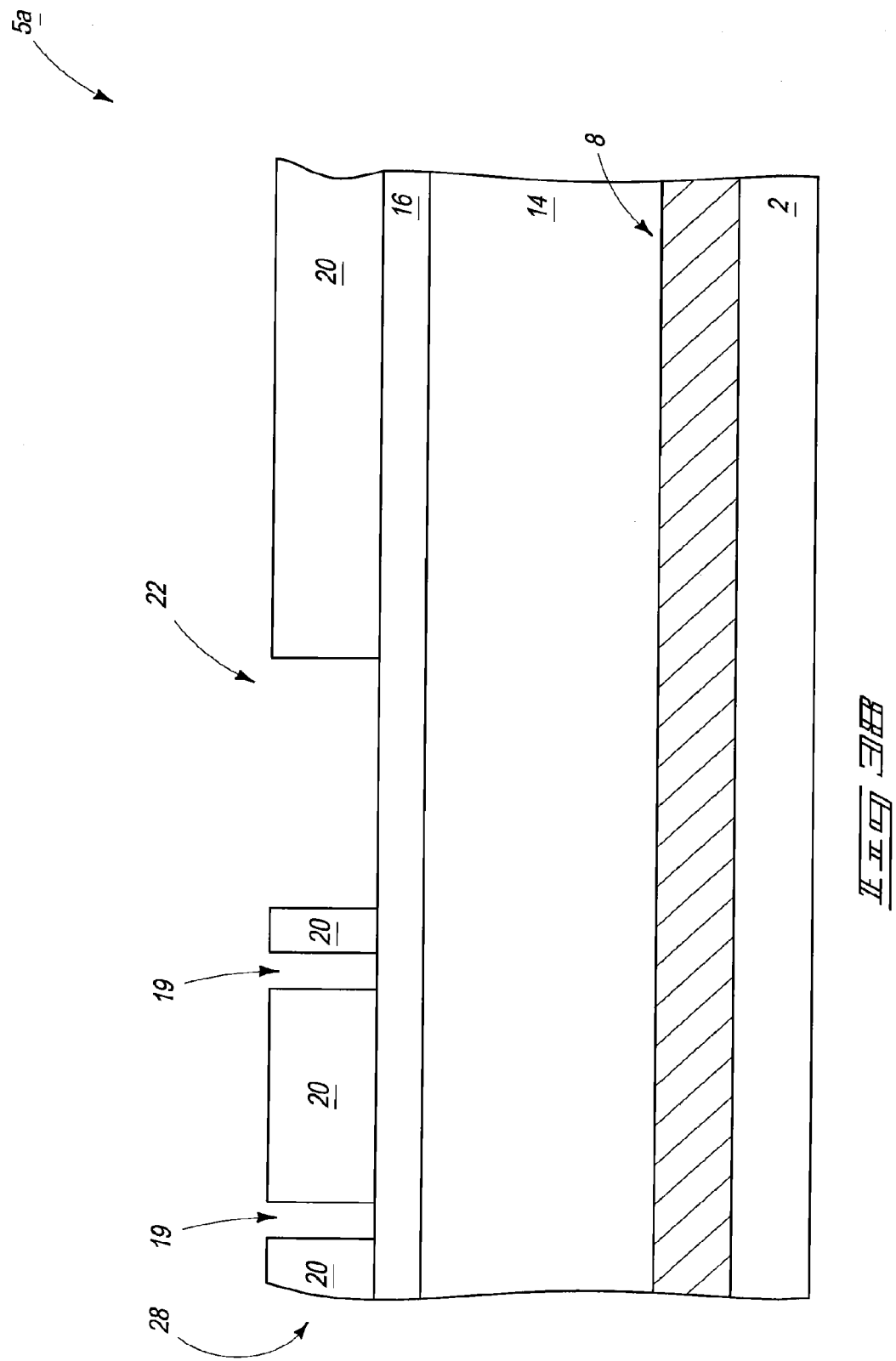

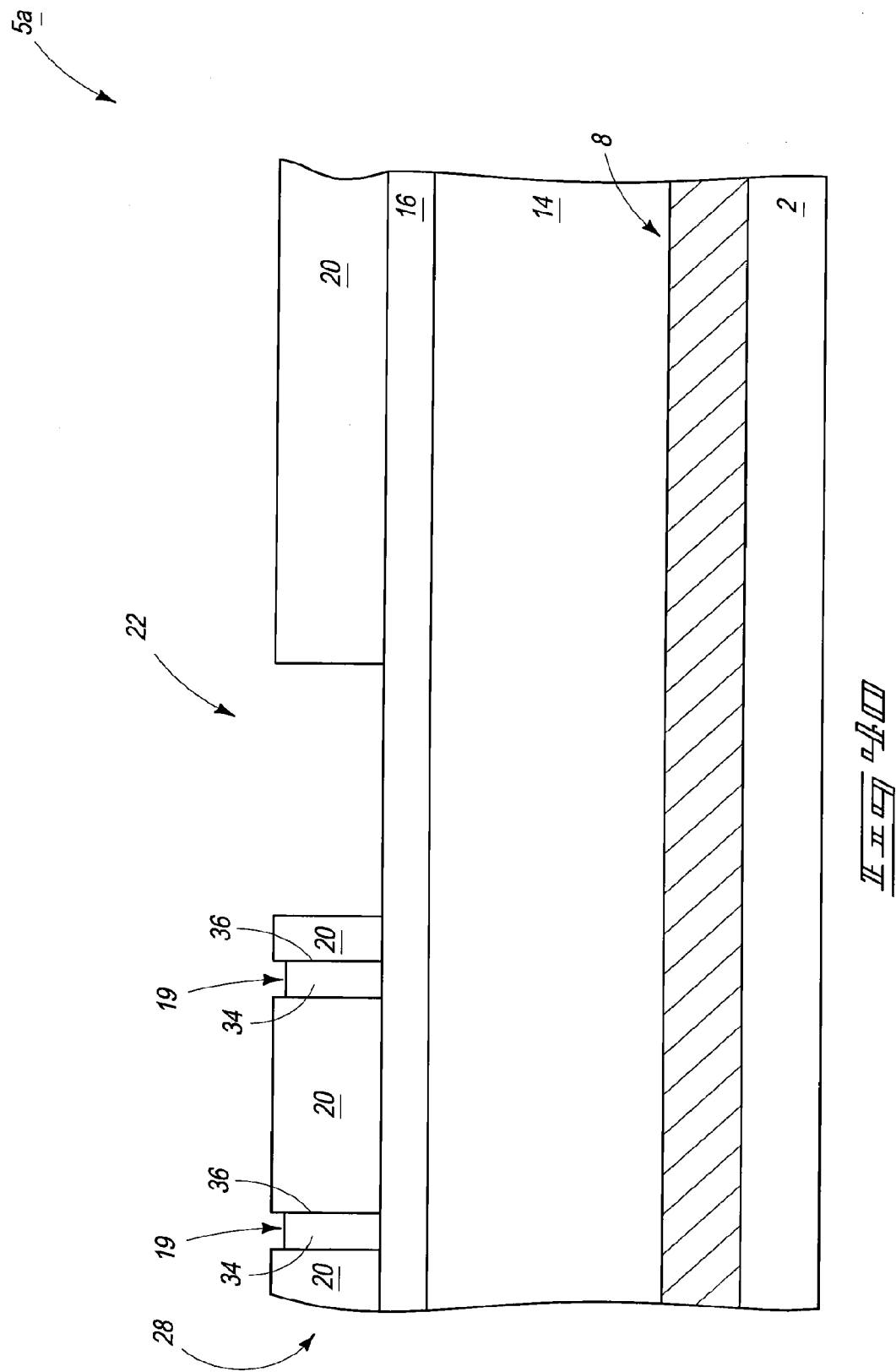

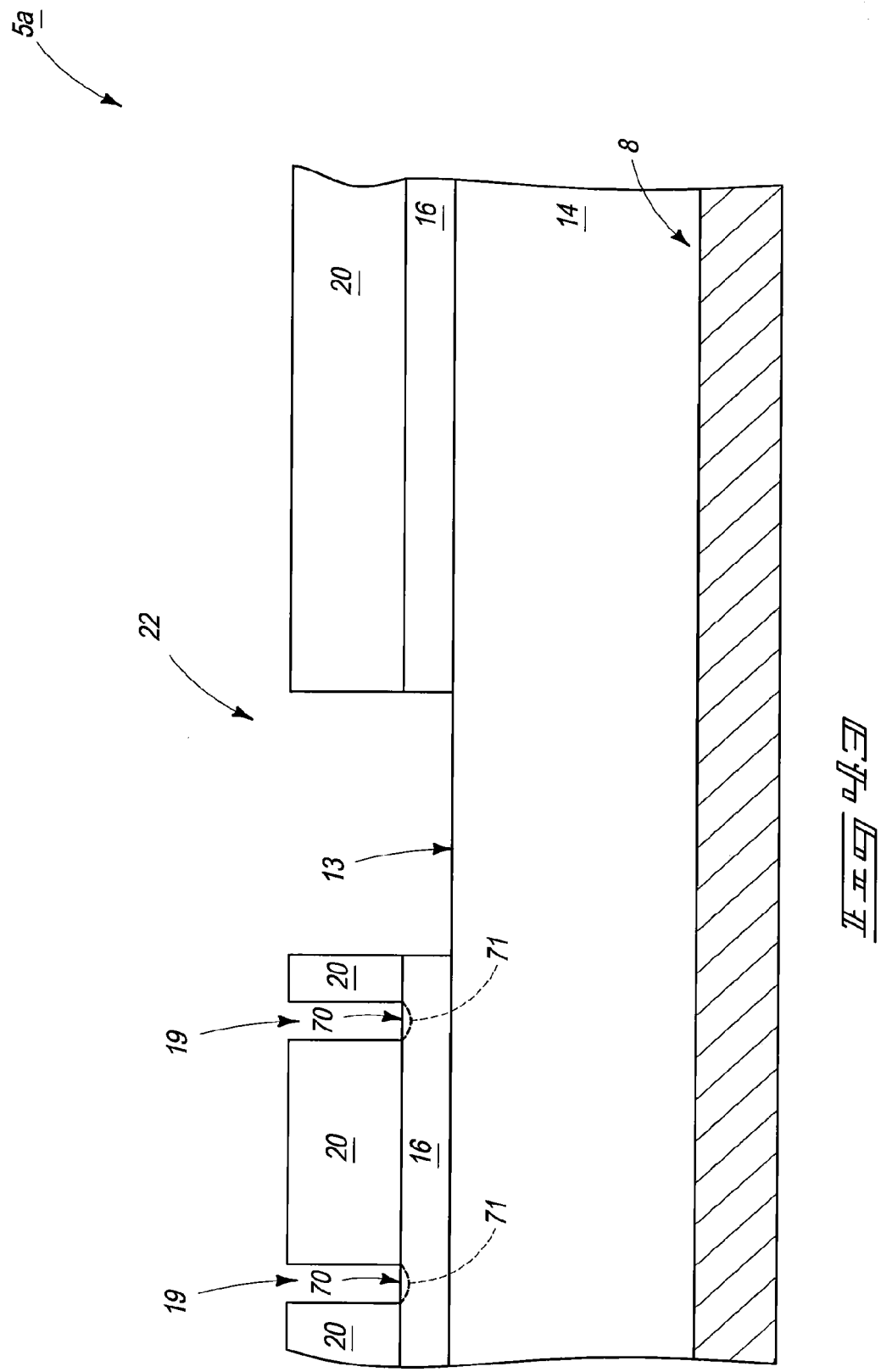

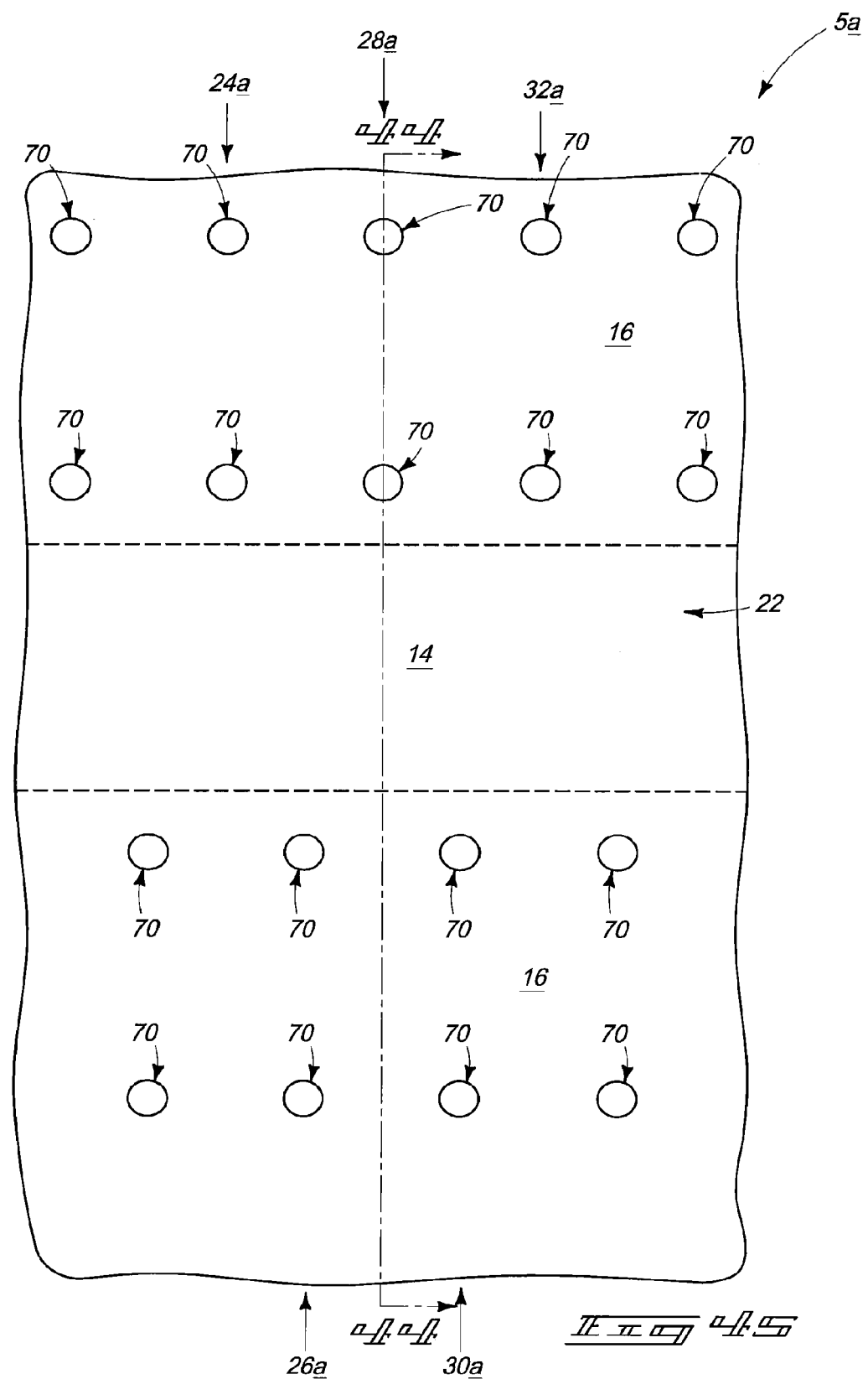

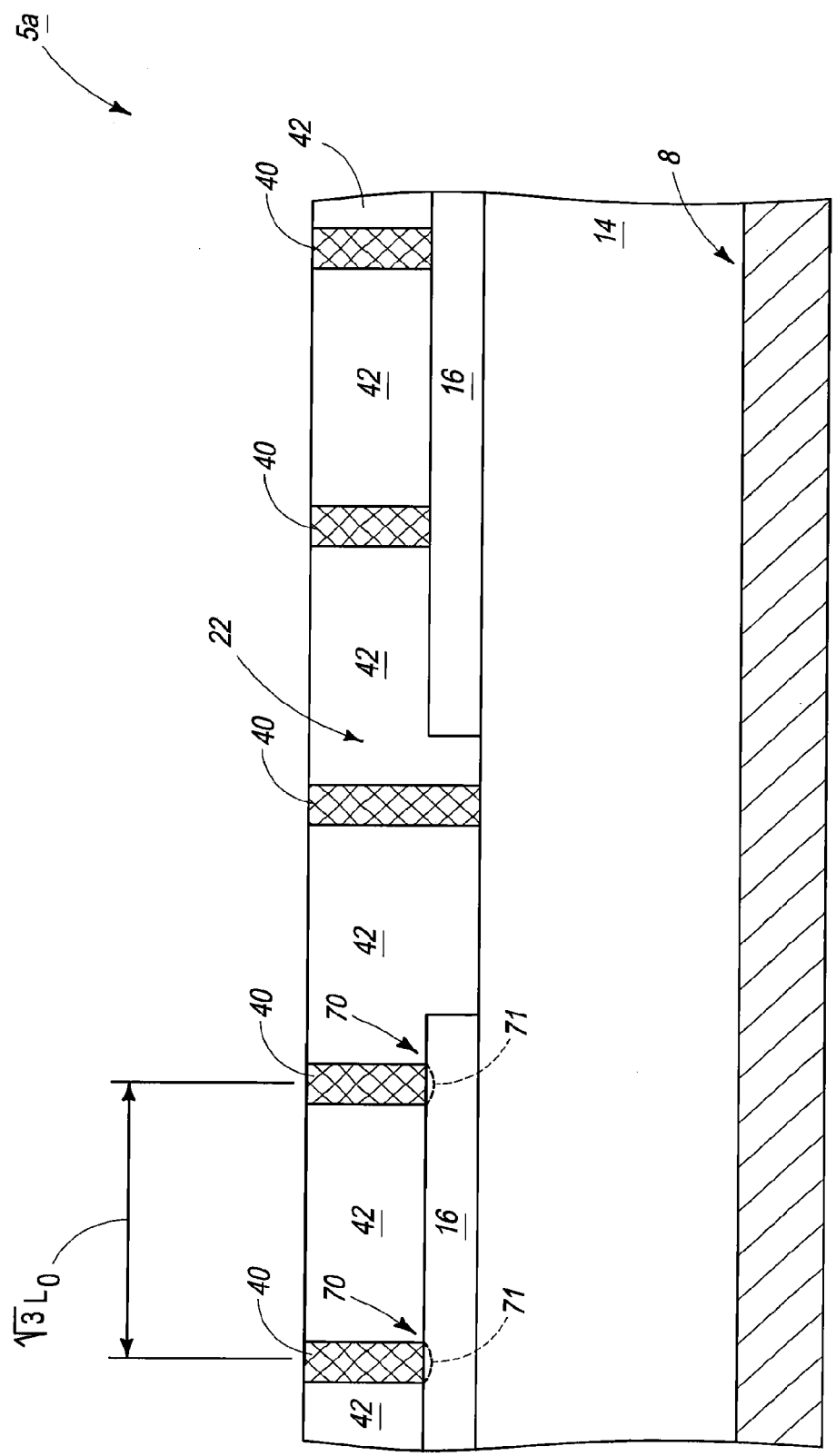

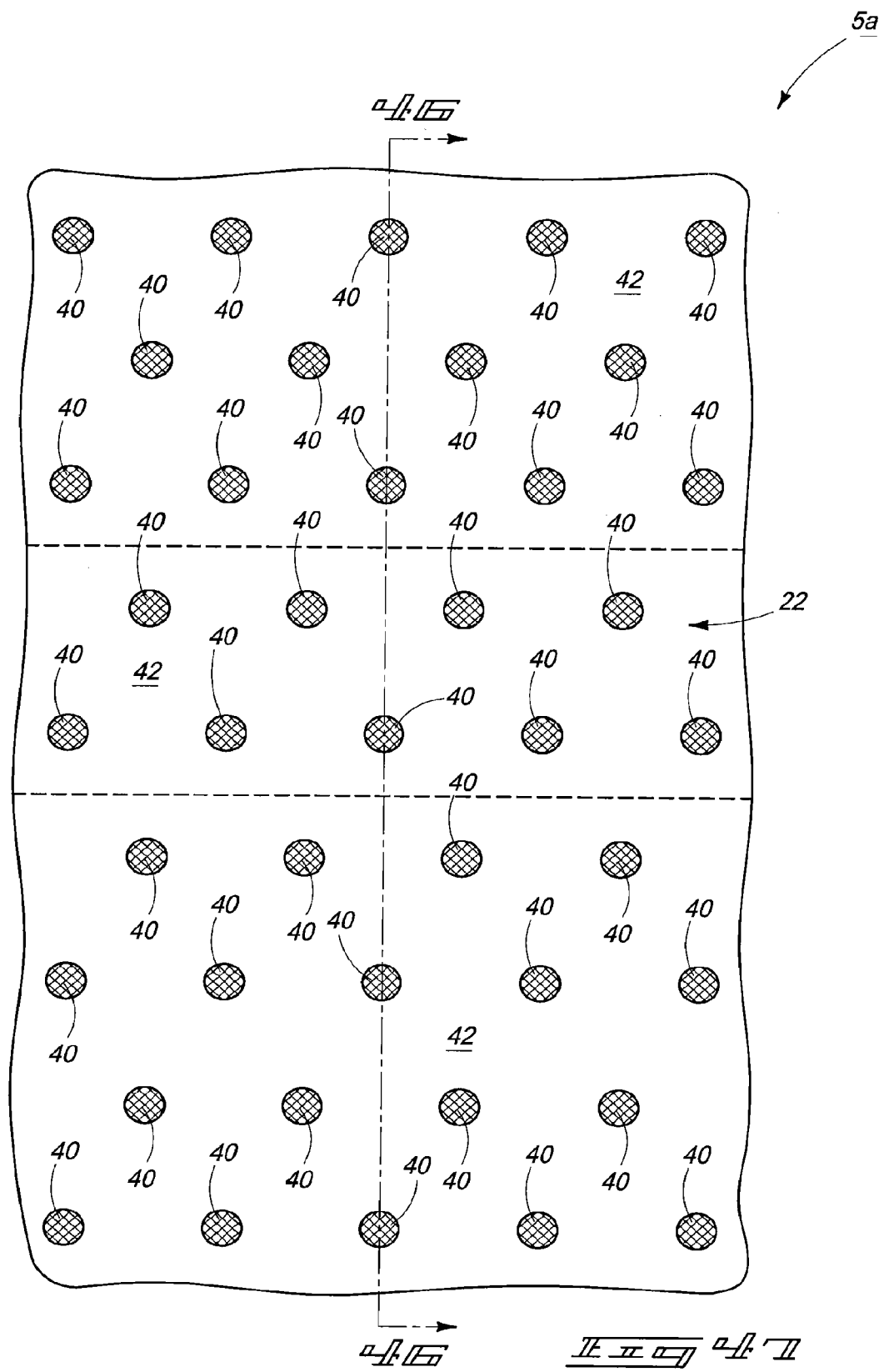

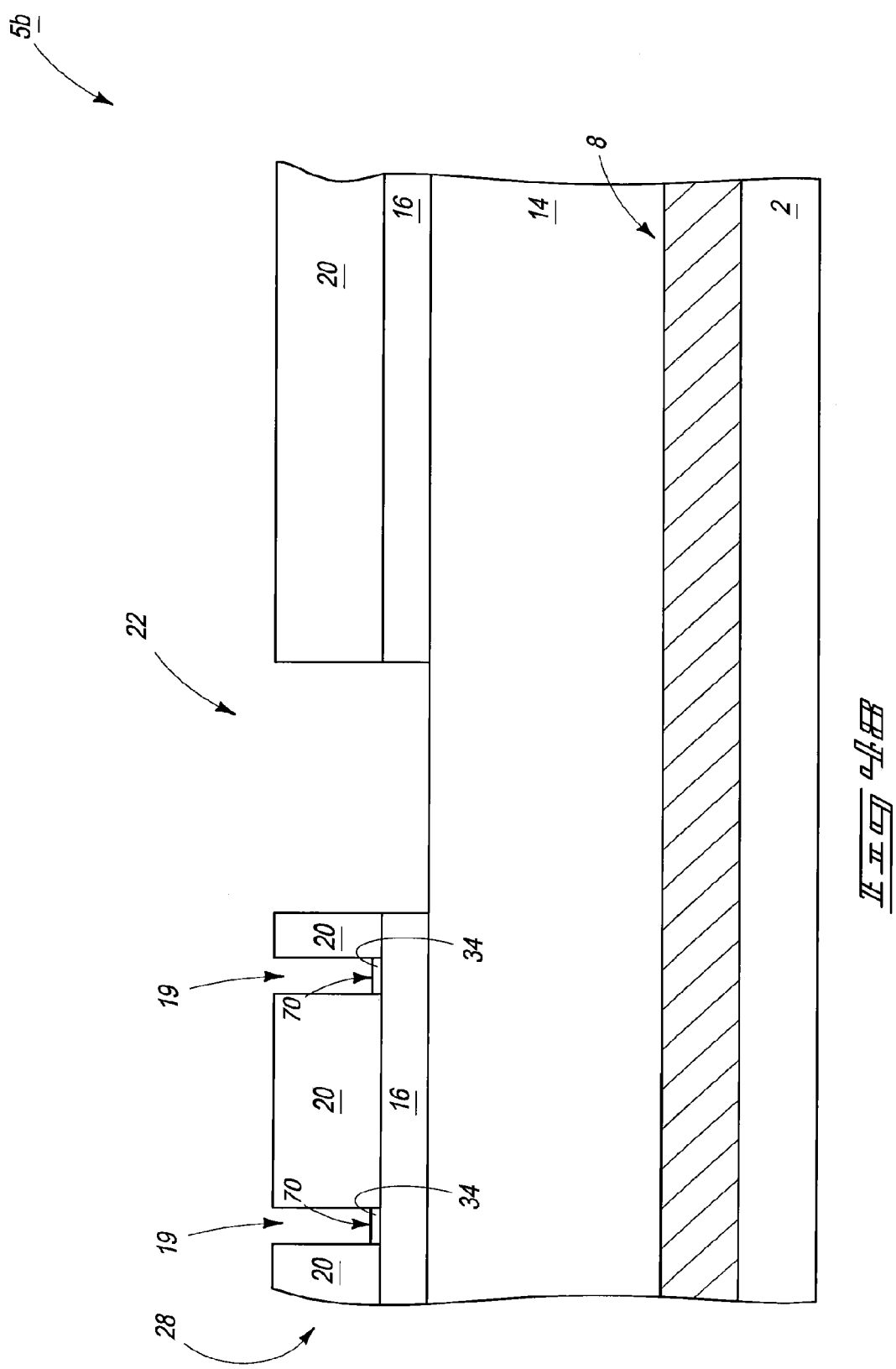
FIG. 4.88

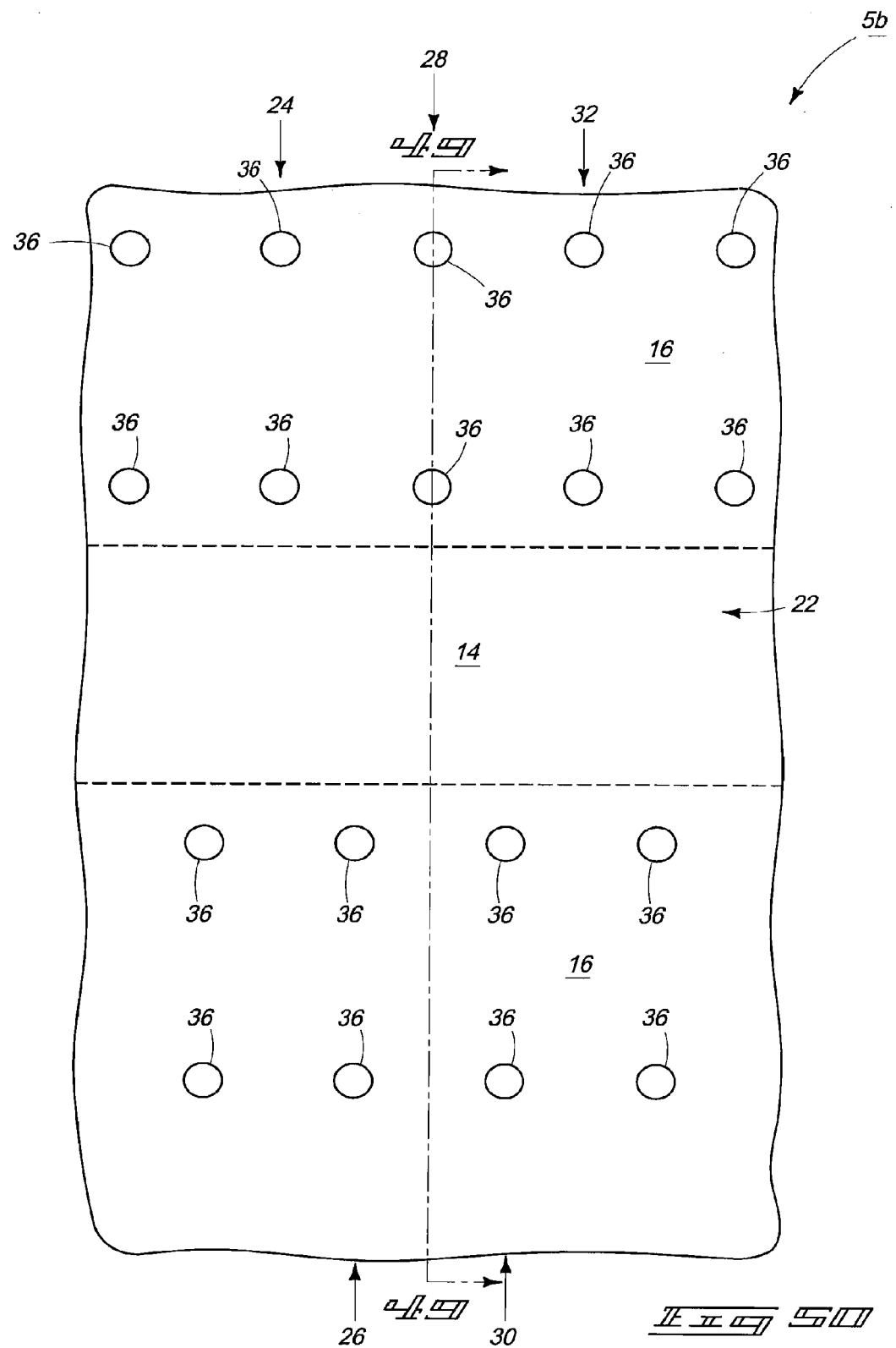

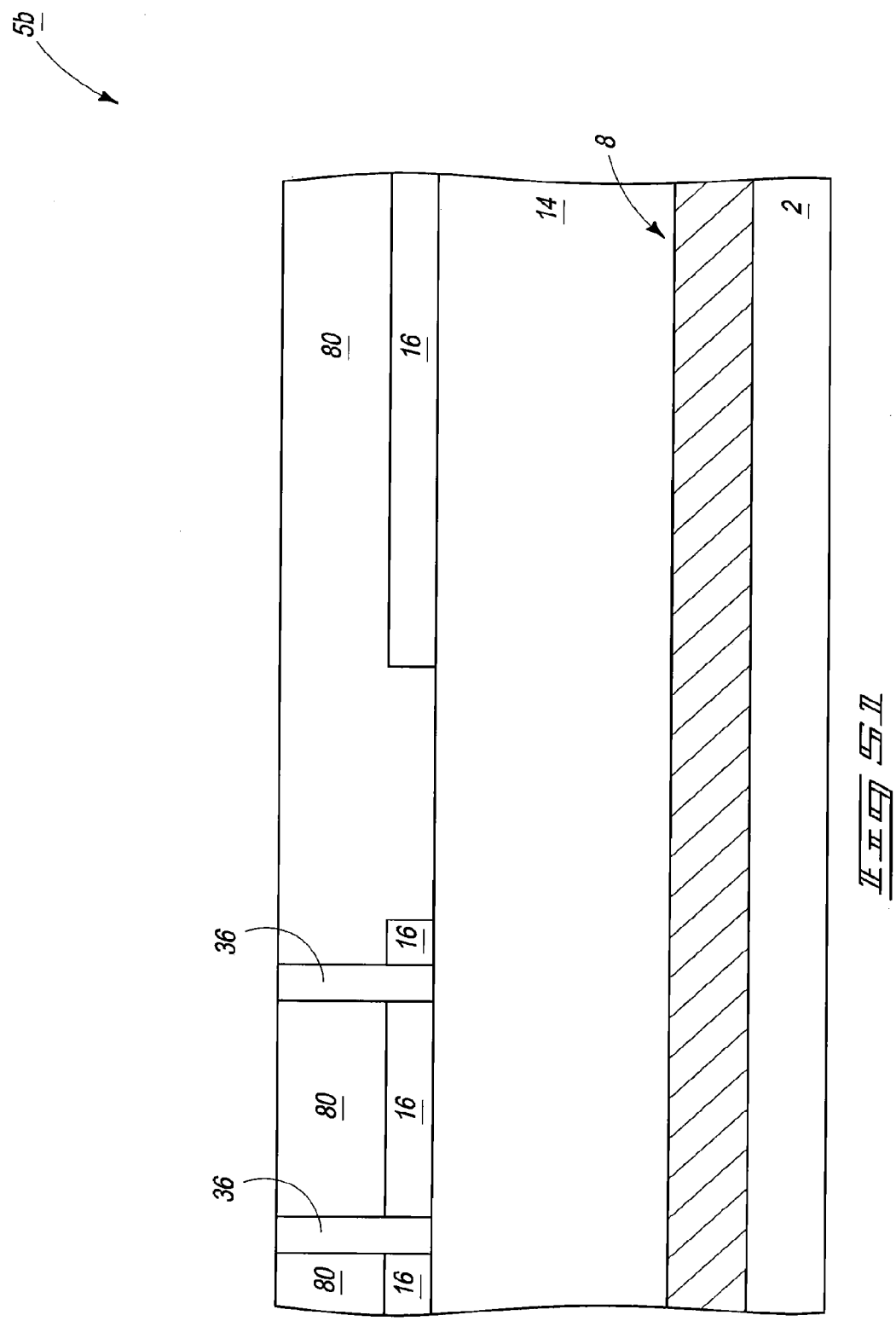

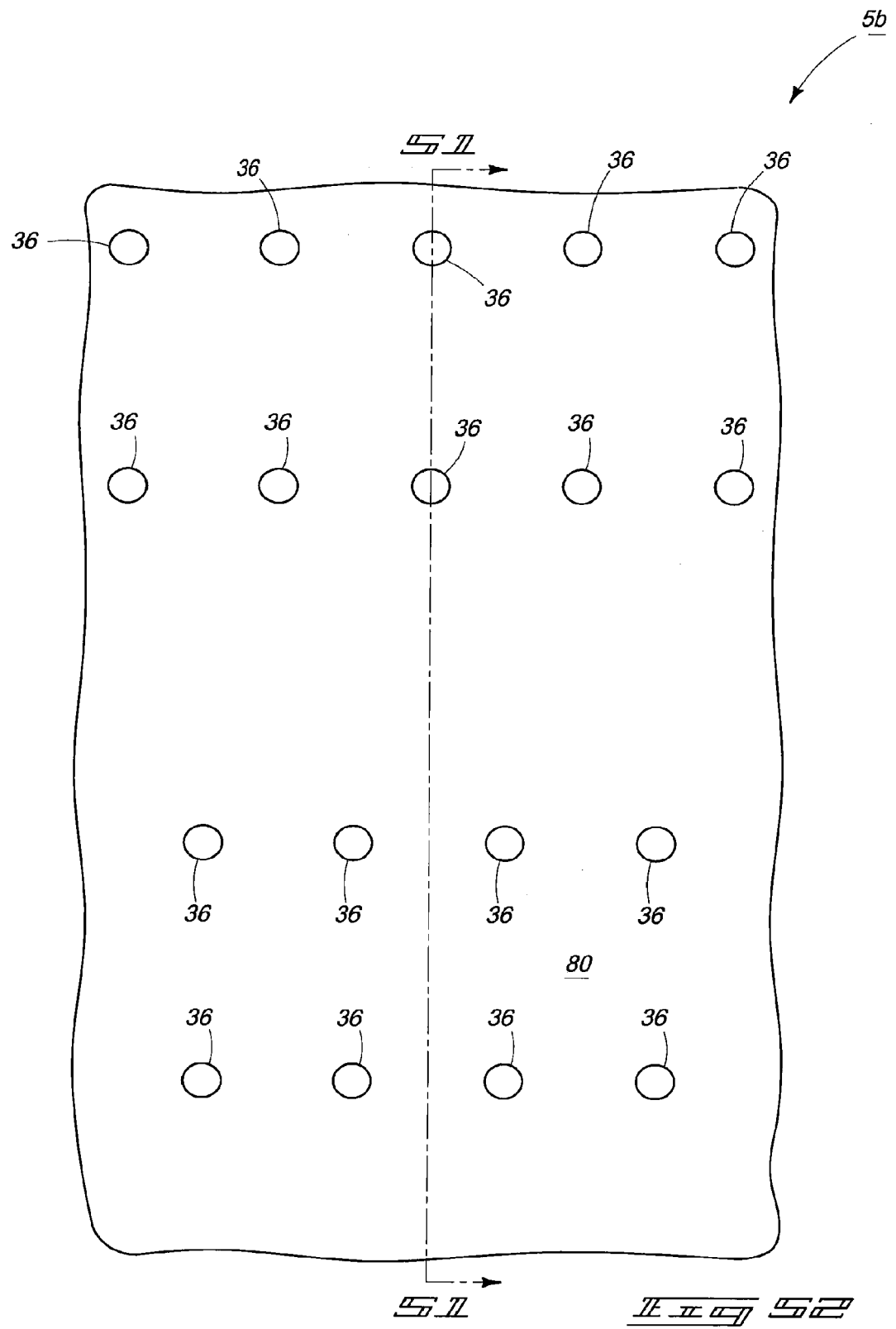

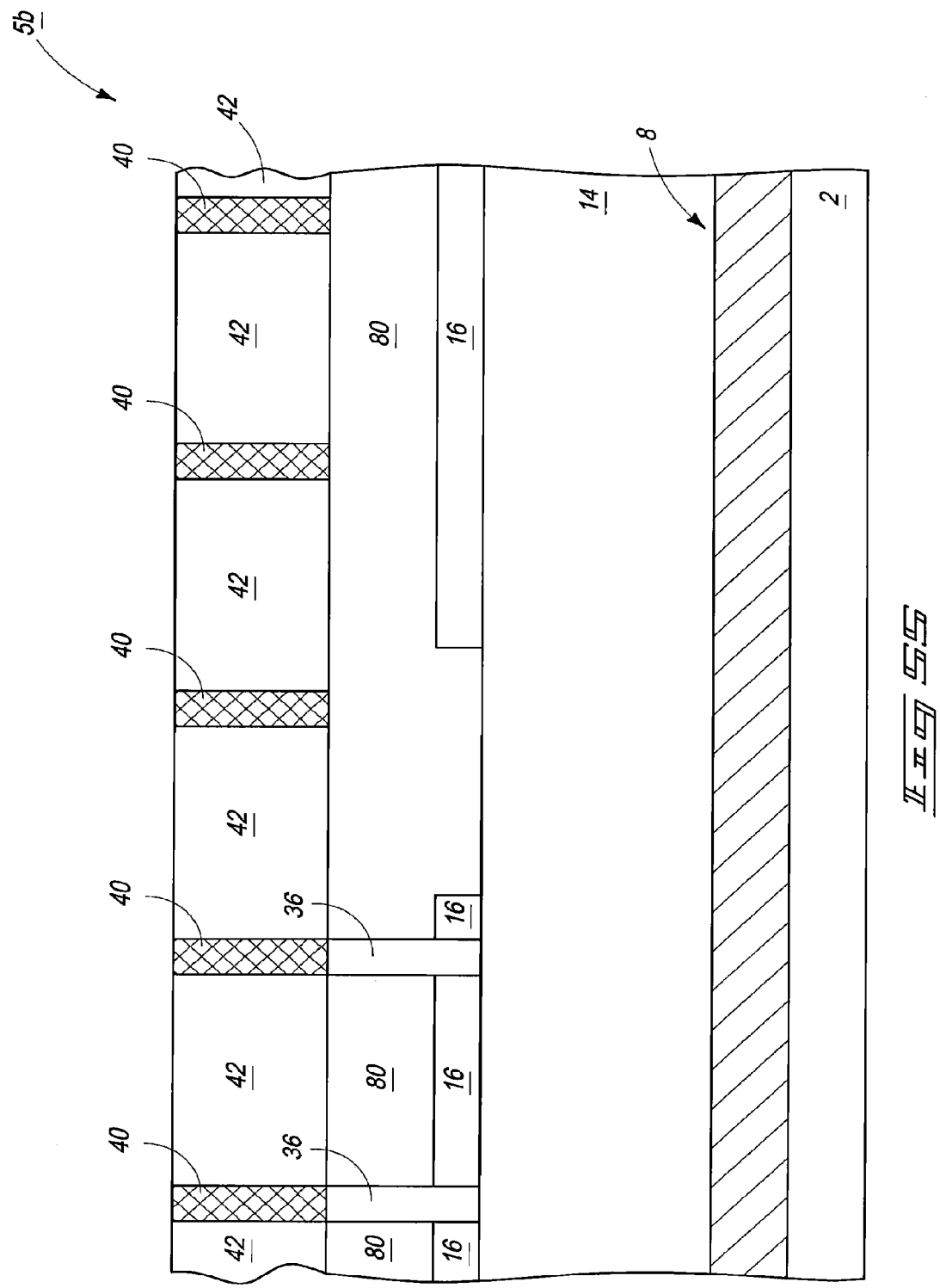

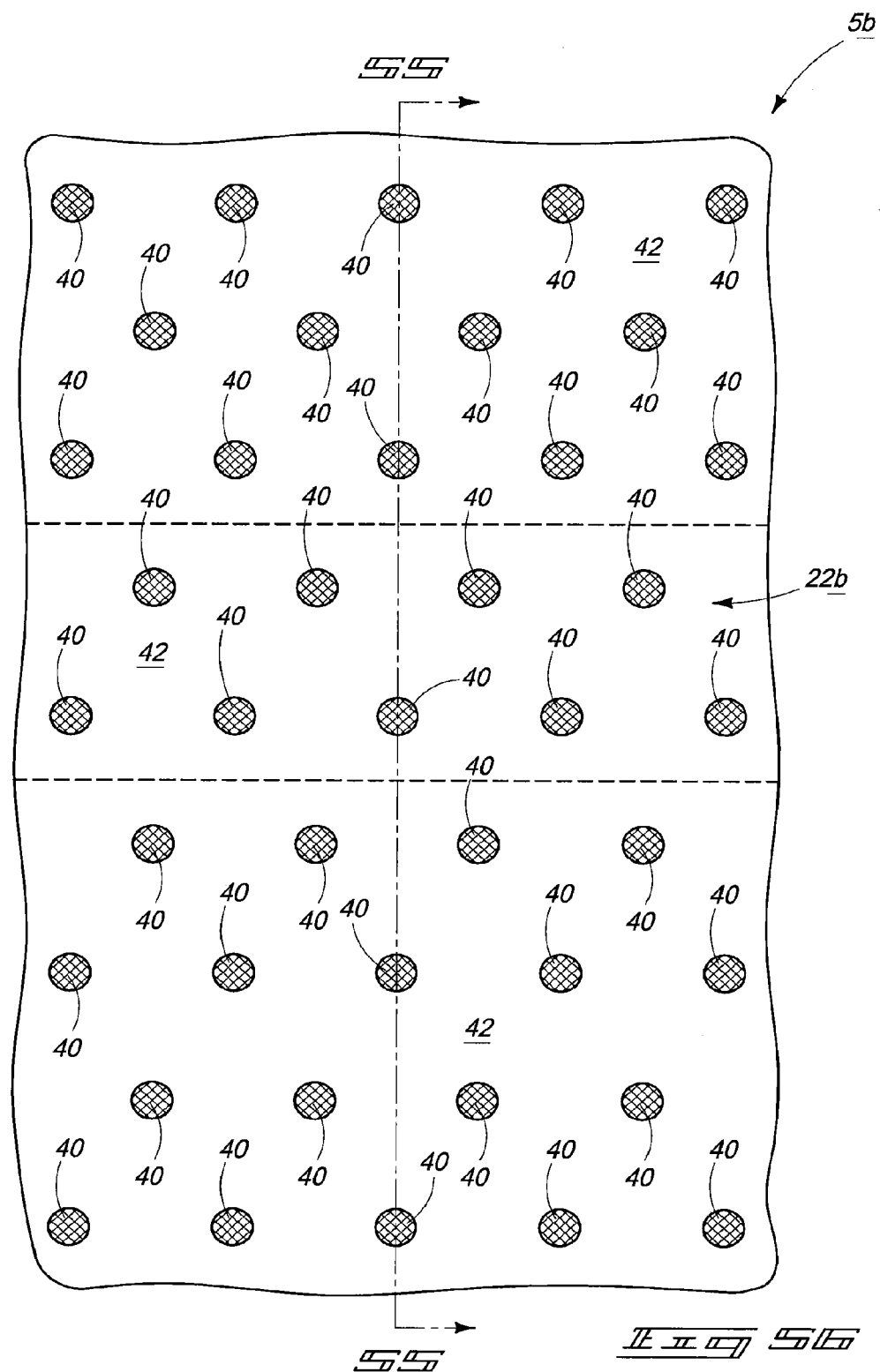

SEMICONDUCTOR CONSTRUCTIONS AND METHODS OF FORMING PATTERNS

RELATED PATENT DATA

This patent resulted from a divisional application of U.S. patent application Ser. No. 12/836,495, filed Jul. 14, 2010, entitled "Semiconductor Constructions And Methods Of Forming Patterns", naming Dan Millward, Kaveri Jain, Zishu Zhang, Lijing Gou, Anton deVilliers, Jianming Zhou, Yuan He, Michael Hyatt, and Scott L. Light, as inventors, the disclosure of which is incorporated by reference.

TECHNICAL FIELD

Semiconductor constructions and methods of forming patterns.

BACKGROUND

Numerous applications exist in which it is desired to form repeating patterns having a small pitch (for example, a pitch of less than about 50 nanometers). For instance, integrated circuit fabrication may involve formation of a repeating pattern of memory-storage units (e.g., NAND unit cells, dynamic random access memory [DRAM] unit cells, crosspoint memory unit cells, etc.).

A variety of methods have been developed for creating patterned masks suitable for patterning underlying materials during fabrication of integrated circuit components. A continuing goal of integrated circuit fabrication is to increase integrated circuit density, and accordingly to decrease the size of individual integrated circuit components. There is thus a continuing goal to form patterned masks having increasing densities of various patterned features.

There can be particular difficulties in forming suitable masks for patterning openings to make contacts to tightly packed circuitry (for example, for patterning contact openings to the various circuit lines associated with NAND or other memory), and the difficulties are becoming ever more challenging with increasing levels of integration. Accordingly, it would be desirable to develop new methods for patterning contact openings.

BRIEF DESCRIPTION OF THE DRAWINGS

FIGS. 5-7 are a diagrammatic top view and a pair of diagrammatic cross-sectional side views of the semiconductor construction of FIGS. 3 and 4 at a processing stage subsequent to that of FIGS. 3 and 4. The view of FIG. 6 is along the lines 6-6 of FIGS. 5 and 7, and the view of FIG. 7 is along the lines 7-7 of FIGS. 5 and 6.

FIGS. 8-10 are a diagrammatic top view and a pair of diagrammatic cross-sectional side views of the semiconductor construction of FIGS. 3 and 4 at a processing stage subsequent to that of FIGS. 5-7. The view of FIG. 9 is along the lines 9-9 of FIGS. 8 and 10, and the view of FIG. 10 is along the lines 10-10 of FIGS. 8 and 9.

FIGS. 29-31 are a diagrammatic top view and a pair of diagrammatic cross-sectional side views of the semiconductor construction of FIGS. 3 and 4 at a processing stage subsequent to that of FIGS. 26-28. The view of FIG. 30 is along the lines 30-30 of FIGS. 29 and 31, and the view of FIG. 31 is along the lines 31-31 of FIGS. 29 and 30.

FIGS. 32-34 are a diagrammatic top view and a pair of diagrammatic cross-sectional side views of the semiconductor construction of FIGS. 3 and 4 at a processing stage subsequent to that of FIGS. 29-31. The view of FIG. 33 is along the lines 33-33 of FIGS. 32 and 34, and the view of FIG. 34 is along the lines 34-34 of FIGS. 32 and 33.

FIGS. 35-37 are a diagrammatic top view and a pair of diagrammatic cross-sectional side views of the semiconductor construction of FIGS. 3 and 4 at a processing stage subsequent to that of FIGS. 32-34. The view of FIG. 36 is along the lines 36-36 of FIGS. 35 and 37, and the view of FIG. 37 is along the lines 37-37 of FIGS. 35 and 36.

FIGS. 38-44 are diagrammatic cross-sectional side views of a semiconductor construction at various processing stages of another example embodiment.

FIG. 45 is a diagrammatic top view of the semiconductor construction of FIG. 44. The view of FIG. 44 is along the line 44-44 of FIG. 45.

FIGS. 46 and 47 are a diagrammatic cross-sectional side view, and a diagrammatic top view, respectively, of the semiconductor construction of FIG. 38 at a processing stage subsequent to that of FIGS. 34 and 45. The view of FIG. 46 is along the line 46-46 of FIG. 47.

FIG. 48 is a diagrammatic cross-sectional side view of a semiconductor construction at a processing stage subsequent to that of FIG. 41 in accordance with another example embodiment.

FIGS. 49 and 50 are a diagrammatic cross-sectional side view, and a diagrammatic top view, respectively, of a semiconductor construction at a processing stage of another example embodiment. The view of FIG. 49 is along the line 49-49 of FIG. 50.

FIGS. 51 and 52 are a diagrammatic cross-sectional side view, and a diagrammatic top view, respectively, of the semiconductor construction of FIGS. 49 and 50 at a processing stage subsequent to that of FIGS. 49 and 50. The view of FIG. 51 is along the line 51-51 of FIG. 52.

FIGS. 53 and 54 are a diagrammatic cross-sectional side view, and a diagrammatic top view, respectively, of the semiconductor construction of FIGS. 49 and 50 at a processing stage subsequent to that of FIGS. 51 and 52. The view of FIG. 53 is along the line 53-53 of FIG. 54.

FIGS. 55 and 56 are a diagrammatic cross-sectional side view, and a diagrammatic top view, respectively, of the semiconductor construction of FIGS. 49 and 50 at a processing stage subsequent to that of FIGS. 53 and 54. The view of FIG. 55 is along the line 55-55 of FIG. 56.

DETAILED DESCRIPTION OF THE ILLUSTRATED EMBODIMENTS

Copolymers are polymers derived from two or more monomeric species, and contain two or more homopolymer subunits linked by covalent bonds. The union of the homopolymer subunits may utilize an intermediate linkage known as a junction block.

The embodiments described herein may utilize block copolymers. Block copolymers may be in the form of diblock copolymers, triblock copolymers, etc. Example diblock copolymers include polystyrene-b-poly (2-vinylpyridine) (PS-b-P2VP); polystyrene-b-poly(ethylene oxide) (PS-b-PEO); polystyrene-b-poly(methylmethacrylate) (PS-b-PMMA); and polystyrene-b-poly(dimethyl-siloxane) (PS-b-PDMS). The "b" utilized in each of the above chemical formulas indicates a block linkage. Other example block copolymers include materials discussed in U.S. Patent Publication No. 2007/0293041.

Diblock copolymers may be generically represented as A-B, where the "A" represents one of the homopolymer subunits, the "B" represents the other of the homopolymer subunits, and the hyphen represents a covalent bond.

A useful property of some block copolymers is that the homopolymer subunits of the copolymers preferentially interact with like subunits, and avoid interactions with dissimilar subunits. For instance, in some diblock copolymers (A-B), the subunits A preferentially interact with other A, the subunits B preferentially interact with other B, and the subunits A and B preferentially avoid interactions with one another; depending on various factors, such as the length of the blocks, the overall volume fraction of each block, the magnitude of the Flory-Huggins interaction parameter between block A and B, etc. The copolymers may thus self-assemble into repeating patterns. For instance, some diblock copolymers may self-assemble into a repeating pattern that may be represented as A-B:B-A:A-B:B-A:A-B. In such pattern, the hyphens represent covalent bonds and the colons represent non-covalent interactions. The self-assembly of copolymers may be utilized to form patterns over substrates.

Figure 1:
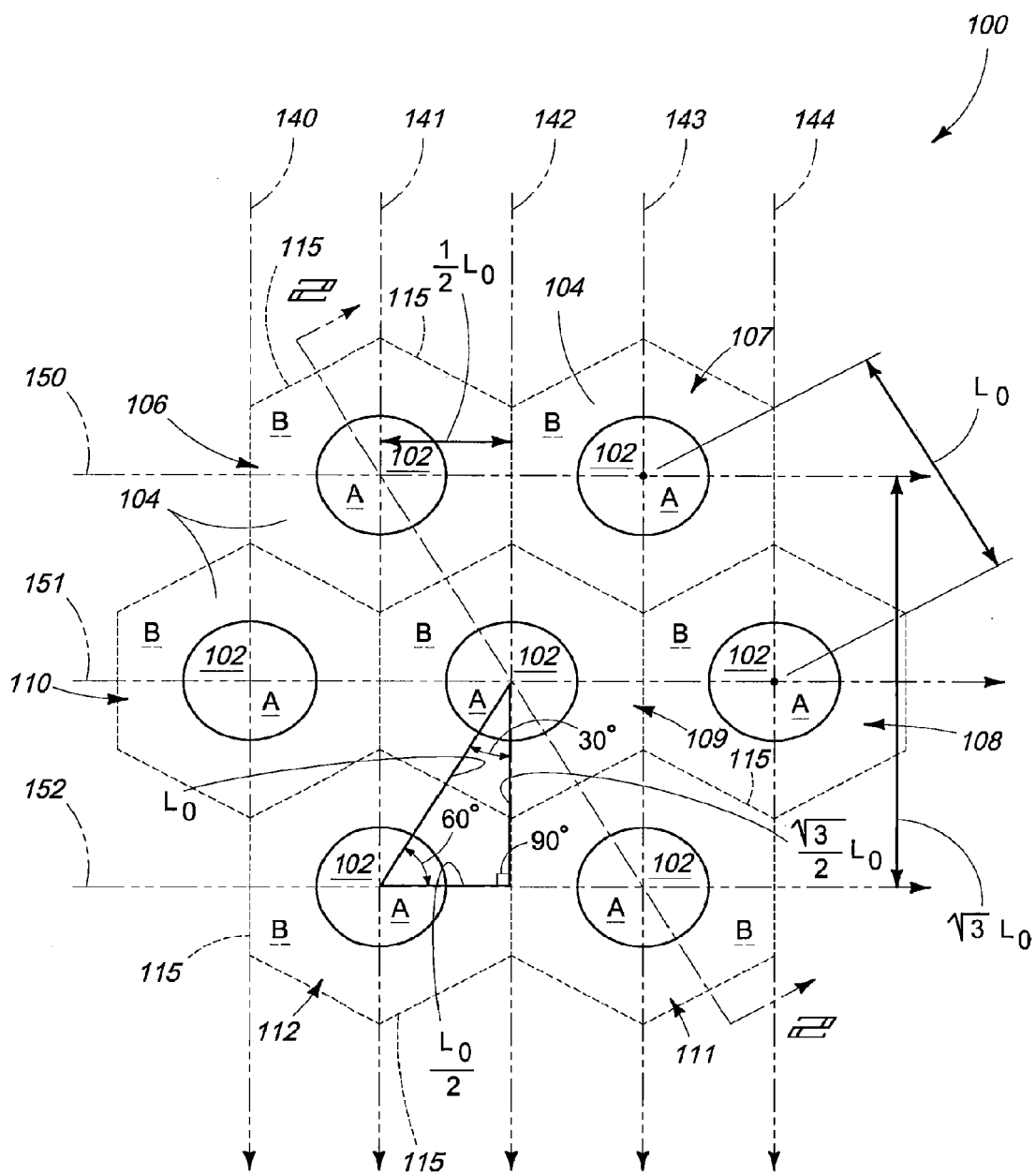
FIGS. 1 and 2 are a top view and a cross-sectional side view, respectively, showing a diagrammatic representation of block copolymer domains arranged within hexagonal closest packed unit cells. The view of FIG. 2 is along the line 2-2 of FIG. 1.
Figure 2:
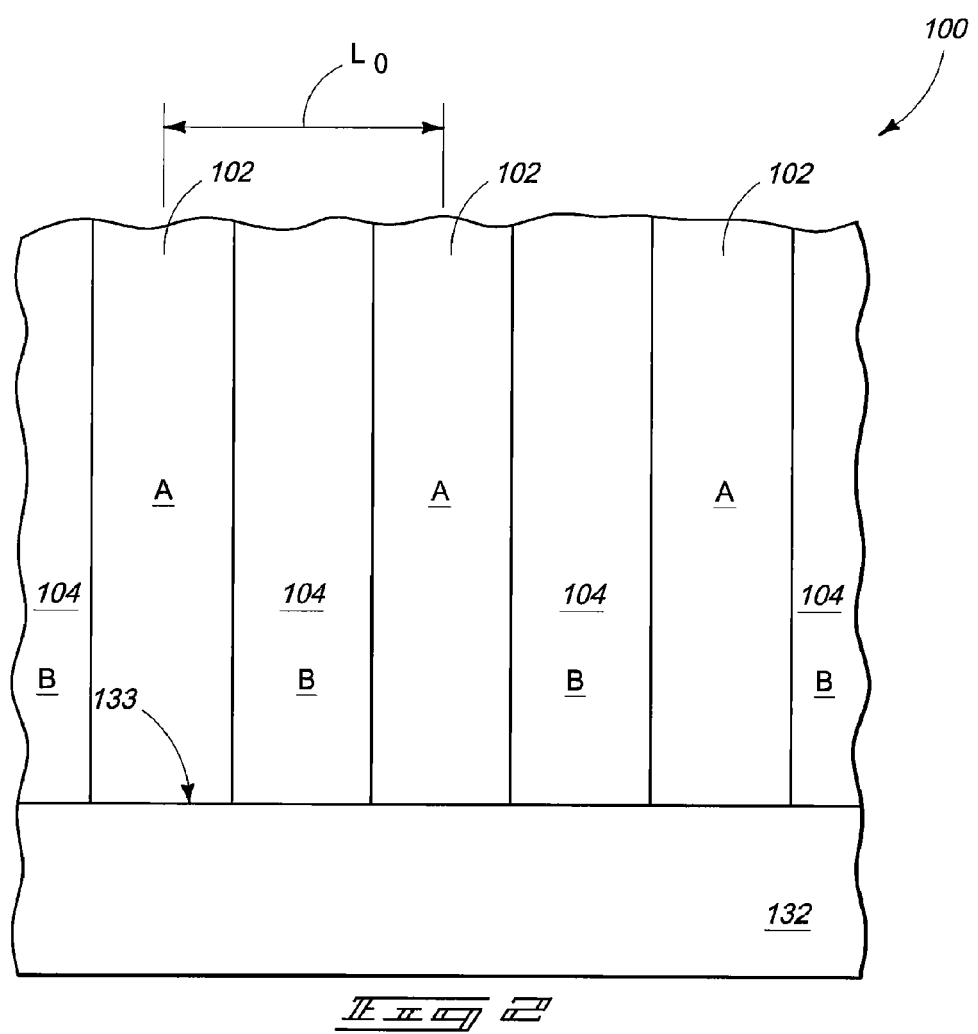

FIGS. 1 and 2 show an example pattern that may be formed by self-assembly of a diblock copolymer. Specifically, FIGS. 1 and 2 illustrate a semiconductor construction 100 in which diblock copolymer has self-assembled to form hexagonal closest packed unit cells. The unit cells are shown in FIG. 1 as cells 106-112, and boundaries between the unit cells are shown as dashed lines 115 (the boundaries 115 are provided for diagrammatic purposes only, and would not be visible in the actual self-assembled copolymer). The unit cells comprise an A domain 102 (which is the domain comprising the A subunits of the diblock copolymer) surrounded by a B domain 104 (which is the domain comprising the B subunits of the diblock copolymer). The A domains 102 correspond to cylinders extending normal (i.e., perpendicular) to an upper surface 133 of an underlying semiconductor substrate 132. Although the A domains and B domains are shown as cylinders and surrounding regions, respectively, in other applications the pattern may be reversed so that the cylinders are the B domains and the surrounding regions are the A domains.

The hexagonal closest packing forms a pattern having a honeycomb-type appearance. In some of the embodiments described below, a pattern corresponding to hexagonally closest packed unit cells is incorporated into an integrated circuit fabrication process. In such embodiments it can be useful to consider the pattern of FIG. 1 to comprise a two dimensional array of the A domain cylinders; with such array having columns 140-144 extending along a first direction, and having rows 150-152 extending orthogonally to the columns.

The pattern formed from the self-assembled diblock copolymer has an inherent periodicity (which may also be referred to as an inherent pitch value) shown as $L_0$. The inherent periodicity is a closest perpendicular spacing between adjacent A domains. Various other spacings within the pattern formed by the diblock copolymer may be calculated from geometrical relationships within such pattern. For instance, a triangle is illustrated between unit cells 109, 111 and 112; and such triangle is used to show that the center-to-center distance between row 151 and the adjacent row 152 is $L_0*\sin 60°$, which is equivalent to $$\frac{\sqrt{3}}{2}L_0.$$

The perpendicular distance between the adjacent rows may be used to determine the center-to-center distance between adjacent A domain cylinders in the columns. Specifically, the center-to-center distance between adjacent A domain cylinders in the columns is twice the magnitude of the distance between adjacent rows, and thus is $\sqrt{3}L_0$. For instance, the column 143 comprises the A domain cylinder of unit cell 107 adjacent to the A domain cylinder of unit cell 111, and the center-to-center distance between such adjacent A domain cylinders is $\sqrt{3}L_0$.

FIG. 1 also shows that the adjacent columns 140-144 are spaced from one another by a center-to-center distance of $\frac{1}{2}L_0$. For instance, the spacing between columns 141 and 142 is $\frac{1}{2}L_0$.

Although FIGS. 1 and 2 show the hexagonal closest packed pattern of self-assembled diblock copolymer to rigidly comprise strict mathematical relationships, in practice there may be minor variations across the pattern due to practical limitations in achieving uniform surfaces, chemistries, environment, and other parameters that may influence the final pattern. Thus, the mathematical relationships discussed above are approximate relationships relative to actual patterns formed utilizing diblock copolymer.

The pattern of FIGS. 1 and 2 of surface-normal cylinders arranged in hexagonal closest packed unit cells is one of many patterns that may be obtained with block copolymer. Other example patterns include surface-normal cylinders arranged in cubic unit cells, spherical micelles arranged in hexagonal closest packed unit cells, and spherical micelles arranged in cubic unit cells. The example embodiments that follow describe applications which use self-assembled block copolymer arranged in hexagonal closest packed unit cells. However, other block copolymer patterns may be utilized in other embodiments with processing analogous to that of the shown example embodiments. The film morphology within self-assembled block copolymer, including the size and shape of the microphase-separated domains, may be influenced by various parameters. Such parameters may include the molecular weight and volume fraction of the various subunits of the block copolymer.

One difficulty that may be encountered in attempting to utilize block copolymer to form patterns suitable for integrated circuit fabrication is that it can be problematic to align the patterns formed with the block copolymer to other patterns. Some of the embodiments described herein utilize a pattern of features to partially define a two-dimensional array. The features are formed by processing other than self-assembly of block copolymer, and define the array in an orientation so that the array is aligned with underlying circuitry. Subsequently, block copolymer is formed (e.g., spread) across the features, and across a region proximate the features, and is then subjected to conditions that induce self-assembly within the block copolymer. The pattern from the features propagates through the block copolymer during the self-assembly so that the block copolymer completes the two-dimensional array defined by the features. The self-assembled pattern formed within the block copolymer is thus aligned with the underlying circuitry. Example embodiments are described with reference to FIGS. 3-56.

Figure 3:
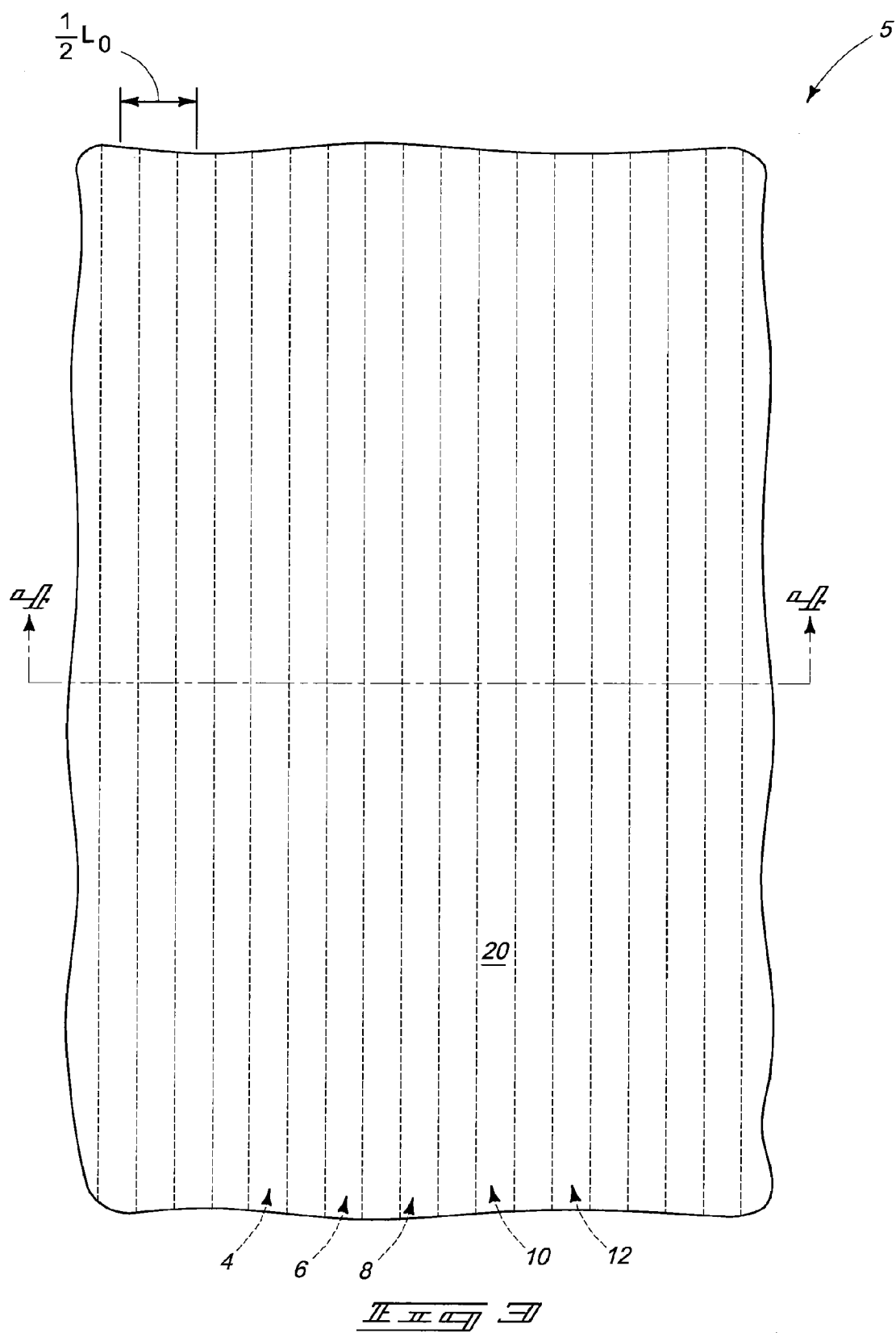
FIGS. 3 and 4 are a diagrammatic top view and a diagrammatic cross-sectional side view, respectively, of a semiconductor construction at a processing stage of an example embodiment. The view of FIG. 4 is along the line 4-4 of FIG. 3.
Figure 4:
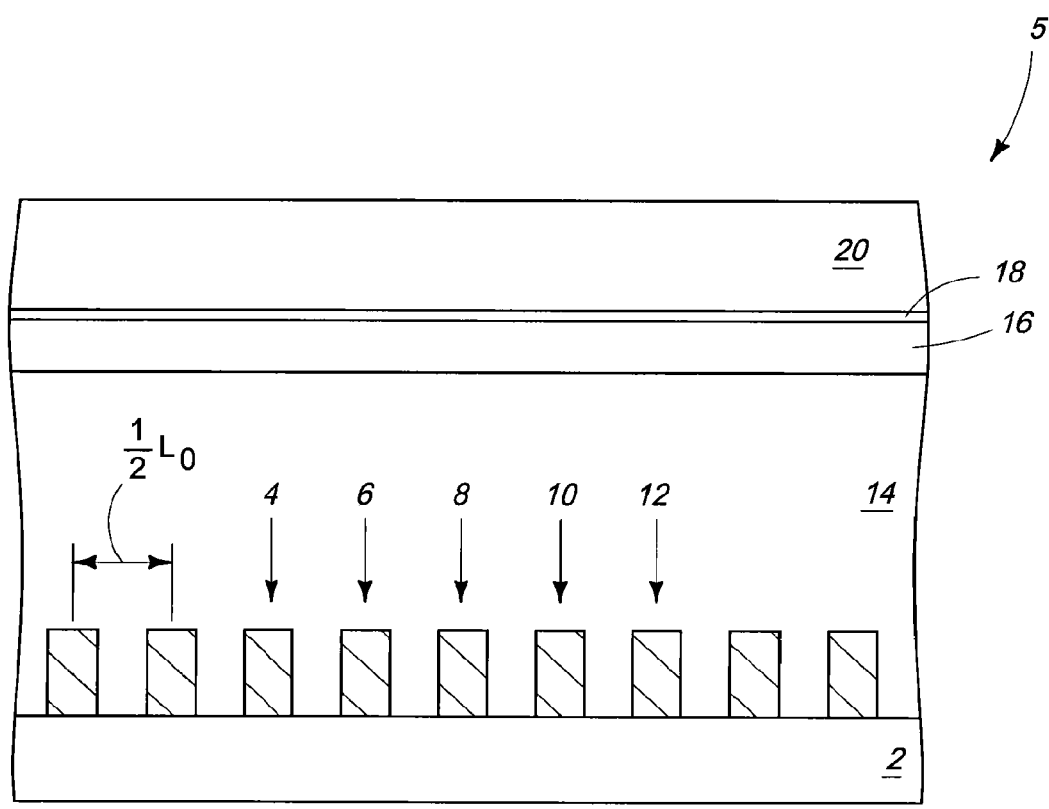

Referring to FIGS. 3 and 4, a semiconductor construction 5 is shown in top view (FIG. 3) and cross-sectional side view (FIG. 4). The construction comprises a semiconductor base 2, a plurality of electrically conductive structures formed over the base (with some of the structures being labeled as 4, 6, 8, 10 and 12), and a plurality of materials 14, 16, 18 and 20 formed over the electrically conductive structures.

The semiconductor base 2 may comprise, consist essentially of, or consist of monocrystalline silicon, and may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Although base 2 is shown to be homogenous, the base may comprise numerous layers in some embodiments. For instance, base 2 may correspond to a semiconductor substrate containing one or more layers associated with integrated circuit fabrication. In such embodiments, such layers may correspond to one or more of refractory metal layers, barrier layers, diffusion layers, insulator layers, etc.

Electrically conductive structures 4, 6, 8, 10 and 12 are illustrated to be lines that extend in and out of the page relative to the cross-section of view of FIG. 4. Such lines are shown in dashed-line (phantom) view in FIG. 3 to indicate that they are beneath other materials, and to show that the lines are parallel to one another in the illustrated example embodiment. Some aspects of the invention pertain to methodology which may be utilized to align a pattern formed within self-assembled block copolymer to an underlying level of circuitry during integrated circuit fabrication. The illustrated lines are an example of conductive structures that may be formed along a level of integrated circuitry. Other conductive structures may be utilized in other embodiments. Also, although the conductive structures are shown to be the same shape as one another, in other embodiments one or more of the conductive structures may have a different shape than the others. In the shown embodiment, the lines 4, 6, 8, 10 and 12 are at the same elevational level as one another. In other embodiments, one or more of the lines may be at an elevational level that is above or below others of the lines. The lines 4, 6, 8, 10 and 12 may be bitlines or wordlines in some embodiments.

The pattern within a self-assembled block copolymer will have an inherent periodicity $L_0$, such as the inherent periodicity described above with reference to FIGS. 1 and 2. The electrically conductive structures 4, 6, 8, 10 and 12 are spaced from one another along a pitch related to such periodicity. Such pitch is $½L_0$ in the shown example embodiment. The distance $½L_0$ is shown as a center-to-center distance between adjacent lines, rather than being shown as the edge-to-edge distance commonly utilized to describe pitch. However, the center-to-center distance and edge-to-edge distance between adjacent lines are the same in the shown embodiment; and the use of the center-to-center distance for describing the pitch is consistent with the use of center-to-center distances to describe patterns throughout this disclosure. The pitch of $½L_0$ enables alignment of the conductive structures 4, 6, 8, 10 and 12 with block copolymer domains arranged in hexagonally closest packed unit cells in some example embodiments, as will be shown and described with reference to later drawings of this disclosure.

The pitch of $½L_0$ may be sub-lithographic, and the structures 4, 6, 8, 10 and 12 may be formed to such pitch utilizing any suitable method. For instance, the features may be formed to a sub-lithographic pitch utilizing pitch multiplication methodologies (for instance, pitch doubling methodologies or pitch quadrupling methodologies) known in the art.

The material 14 that extends over and between the electrically conductive lines is electrically insulative material. Such material may be a silicon oxide-containing material; such as, for example, silicon dioxide, borophosphosilicate glass (BPSG), phosphosilicate glass (PSG), etc. In the shown embodiment, material 14 is a single thick material over the lines 4, 6, 8, 10 and 12. In other embodiments, there may be multiple materials over and between the lines in addition to, or alternatively to, the thick material 14.

Material 16 is a masking material, and in some embodiments may comprise silicon and nitrogen. For instance, material 16 may comprise, consist essentially of, or consist of silicon nitride or silicon oxynitride.

Material 18 is an antireflective coating, and in some embodiments may correspond to a bottom antireflective coating (BARC). Material 18 may comprise any suitable composition. In some embodiments, material 18 may be omitted. Material 18 may alternatively be a brush layer that is preferential wetting to the opposite block to that preferred by pedestals 36 (shown in, for example, FIGS. 14-16) or that is "neutral wetting," (in other words, that has no preference between the two blocks of the block copolymer).

Material 20 is another masking material, and in some embodiments may comprise, consist essentially of, or consist of photoresist. Materials 16 and 20 may be referred to as first and second masking materials, respectively, to distinguish the materials from one another.

Figure 6H:
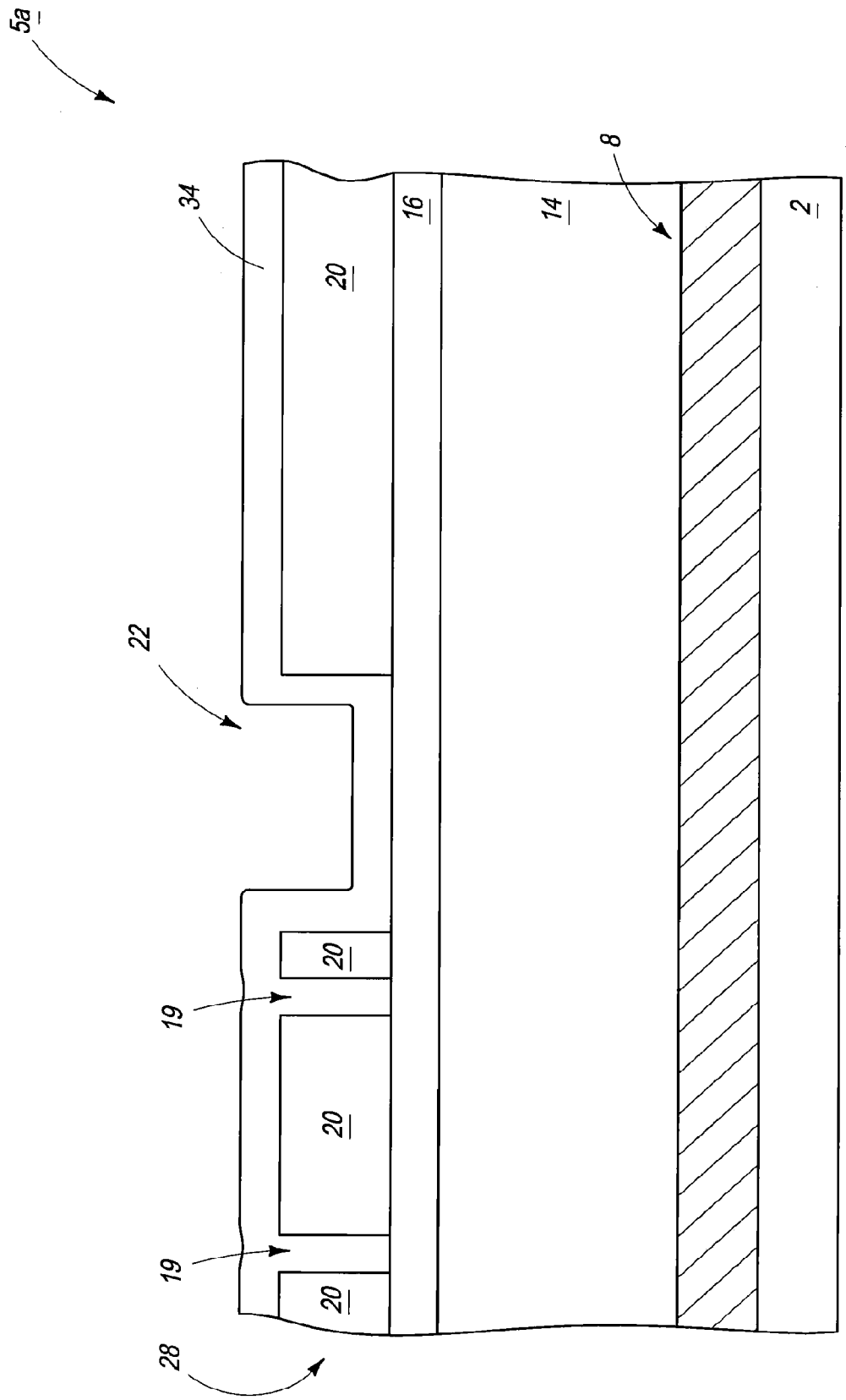
Figure 4H:
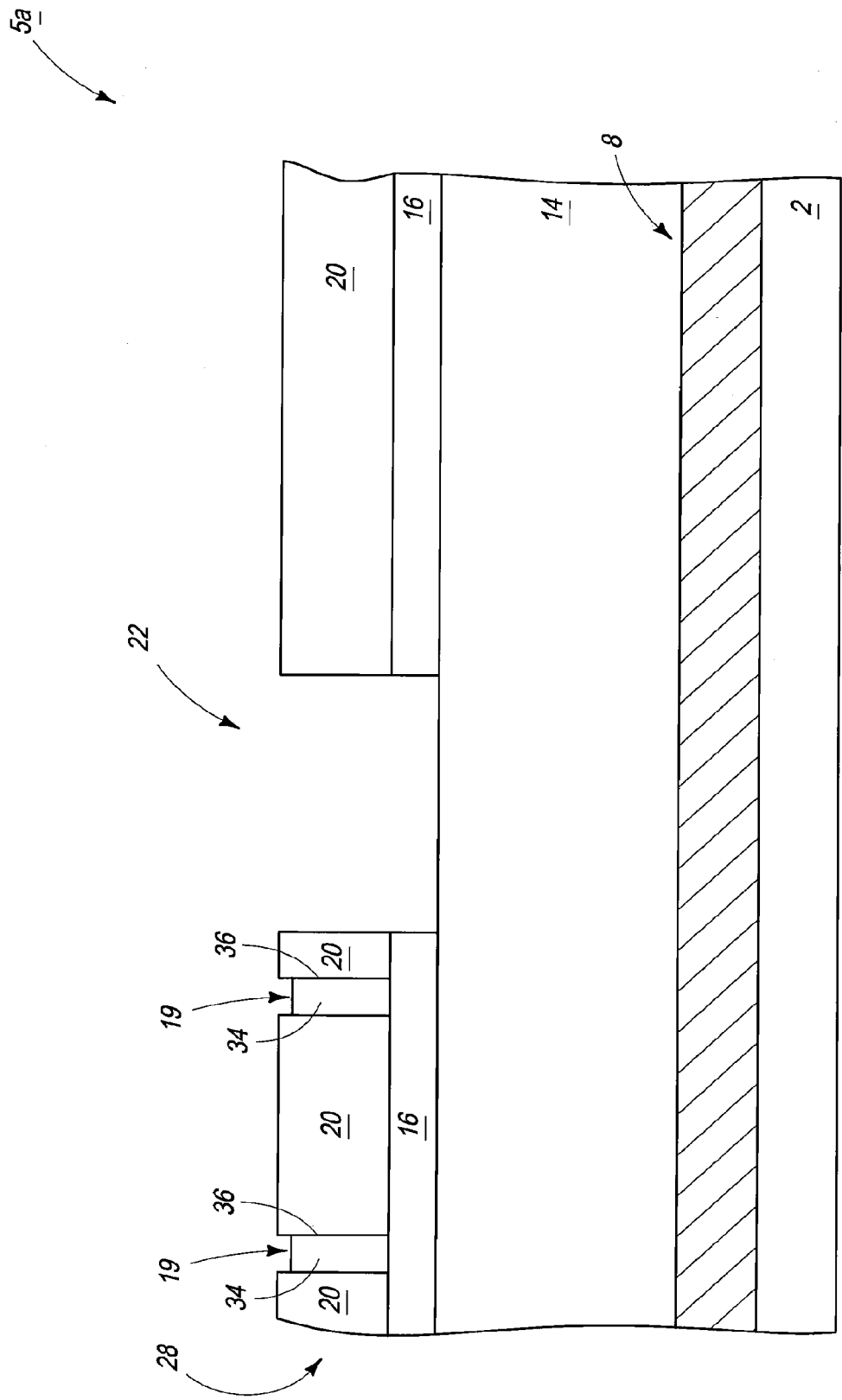
Figures 2, 4A:
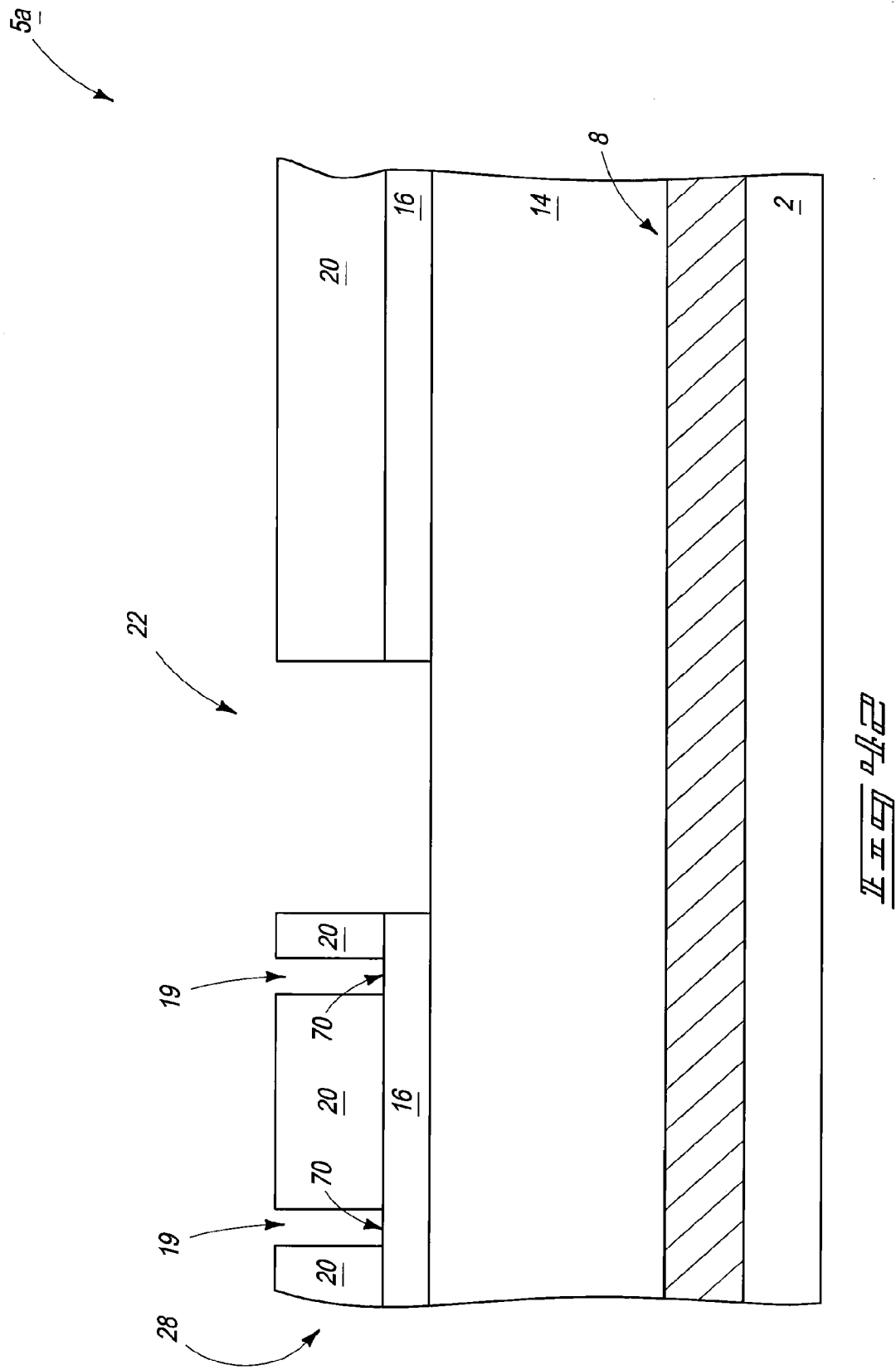

Referring to FIGS. 5-7, construction 5 is shown subsequent to photolithographic patterning of masking material 20. The patterning forms a trench 22 within masking material 20. The trench passes across conductive lines 4, 6, 8, 10 and 12. In the shown embodiment, the lines extend linearly along a first direction 15, and the trench extends linearly along a second direction 17 which is orthogonal to the first direction.

The trench 22 may have a width related to the inherent periodicity $L_0$ of block copolymer that will ultimately be utilized for forming a pattern, and in the shown embodiment has a width of about $\sqrt{3}L_0$. Such width corresponds to the center-to-center distance between even numbered rows 150 and 152 of the self-assembled block copolymer pattern shown in FIG. 1.

Patterned material 20 of FIGS. 5-7 also comprises a plurality of openings 19 formed therein. The openings are aligned with the underlying electrically conductive structures (for instance, the structures 4, 6, 8, 10 and 12). The alignment of the openings 19 in the photolithographically-patterned mask 20 relative to the underlying conductive structures may be accomplished with conventional methods of mask alignment.

The openings are arranged in a plurality of columns (with some of the columns being labeled as 24, 26, 28, 30 and 32). The columns are in one-to-one correspondence with the underlying conductive structures in the shown embodiment. The adjacent openings 19 within each column are spaced from one another by a uniform spacing interval, and in the shown embodiment such spacing interval is a center-to-center distance of $\sqrt{3}L_0$.

The columns 24, 28 and 32 are on one side of trench 22, and the columns 26 and 30 are on the other side of the trench. The columns 24, 28 and 32 are laterally offset relative to the columns 26 and 30. For instance, the column 24 on one side of the trench is laterally adjacent to the column 26 on the other side of the trench, and is laterally offset from the column 26 by a center-to-center distance of $\frac{1}{2}L_0$.

In some embodiments the openings 19 define locations of a pattern which sparsely populates a two-dimensional array, and subsequent processing (discussed below) utilizes domains of self-assembled block copolymer to further populate the two-dimensional array. In such embodiments, the locations of openings 19 may be used to pin locations of the two-dimensional array, and yet not be used for subsequent patterning of underlying material 14. Instead, it may be that only a pattern of the array formed across trench 22 with self-assembled block copolymer that is used for subsequent patterning of the underlying material 14. In such embodiments, trench 22 may be considered to define an interconnect region; and specifically to define a region where interconnects will ultimately be formed to extend through material 14 to the underlying conductive structures (for instance, the structures 4, 6, 8, 10 and 12). The regions of construction 5 laterally adjacent to trench 22 may be considered to be secondary regions, in that such regions will not be utilized for forming interconnects that extend through material 14 and to the underlying conductive structures. In the shown embodiment, secondary regions 23 and 25 are on opposing sides of trench 22. Also, in the shown embodiment the conductive structures (for instance, structures 4, 6, 8, 10 and 12) correspond to conductive lines that extend to under both of the secondary regions 23 and 25. In other embodiments, the conductive structures may have other configurations, and may extend to under only one of the secondary regions, or may not extend to under either of the secondary regions.

Referring to FIGS. 8-10, the pattern within masking material 20 is transferred through underlying materials 16 and 18 with one or more suitable etches. Such exposes an upper surface 13 of material 14 within openings 19, and within trench 22.

Figure 11:
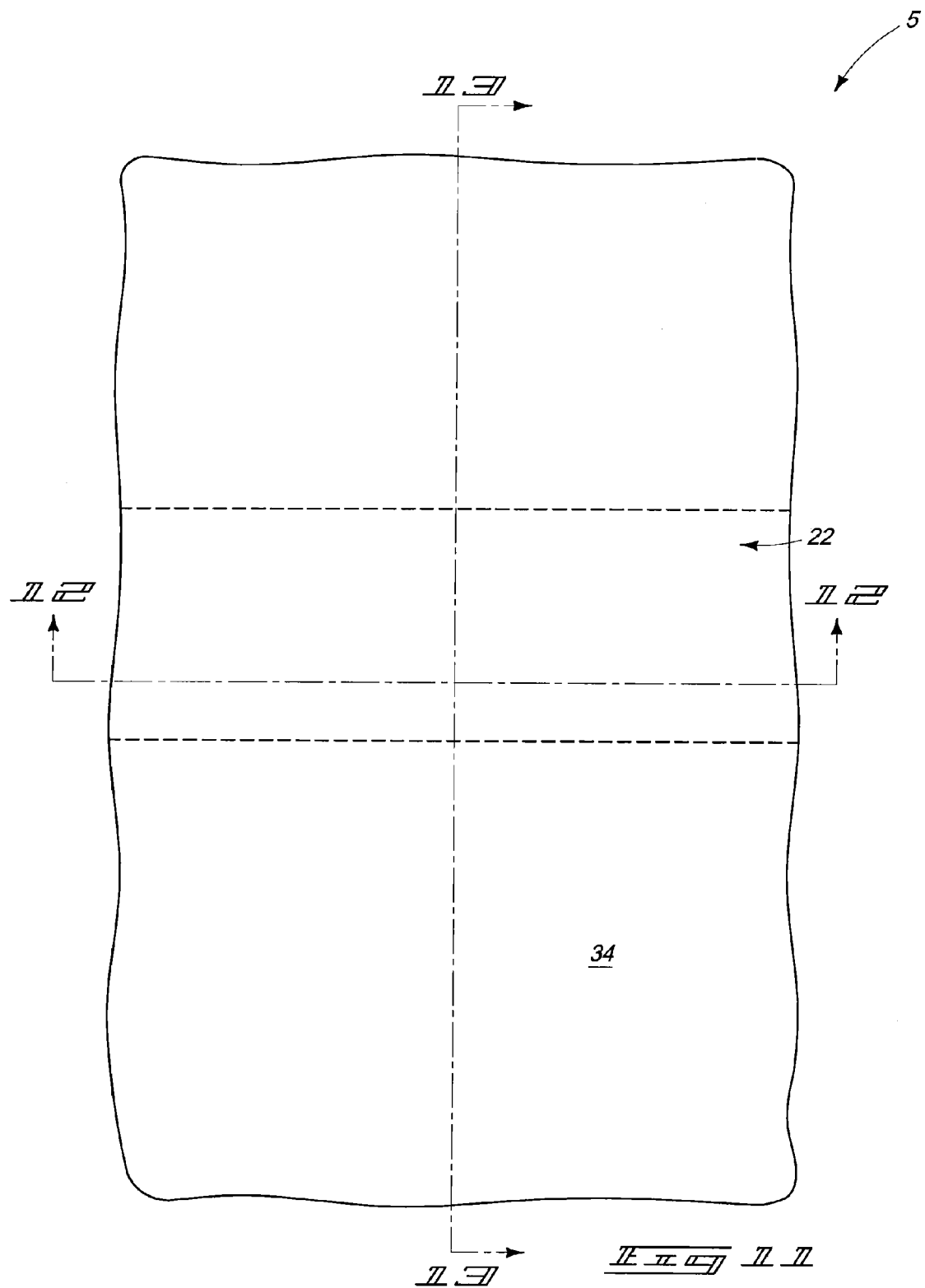
FIGS. 11-13 are a diagrammatic top view and a pair of diagrammatic cross-sectional side views of the semiconductor construction of FIGS. 3 and 4 at a processing stage subsequent to that of FIGS. 8-10. The view of FIG. 12 is along the lines 12-12 of FIGS. 11 and 13, and the view of FIG. 13 is along the lines 13-13 of FIGS. 11 and 12.
Figure 12:
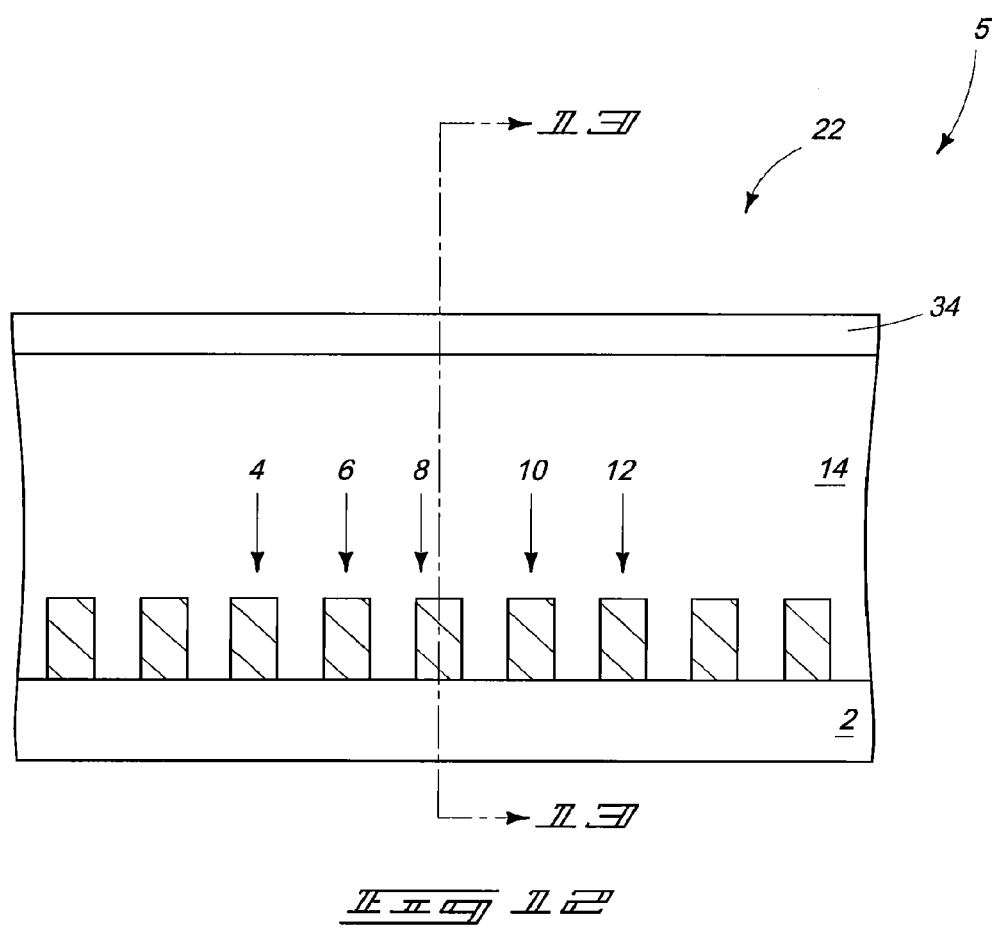
Figure 13:
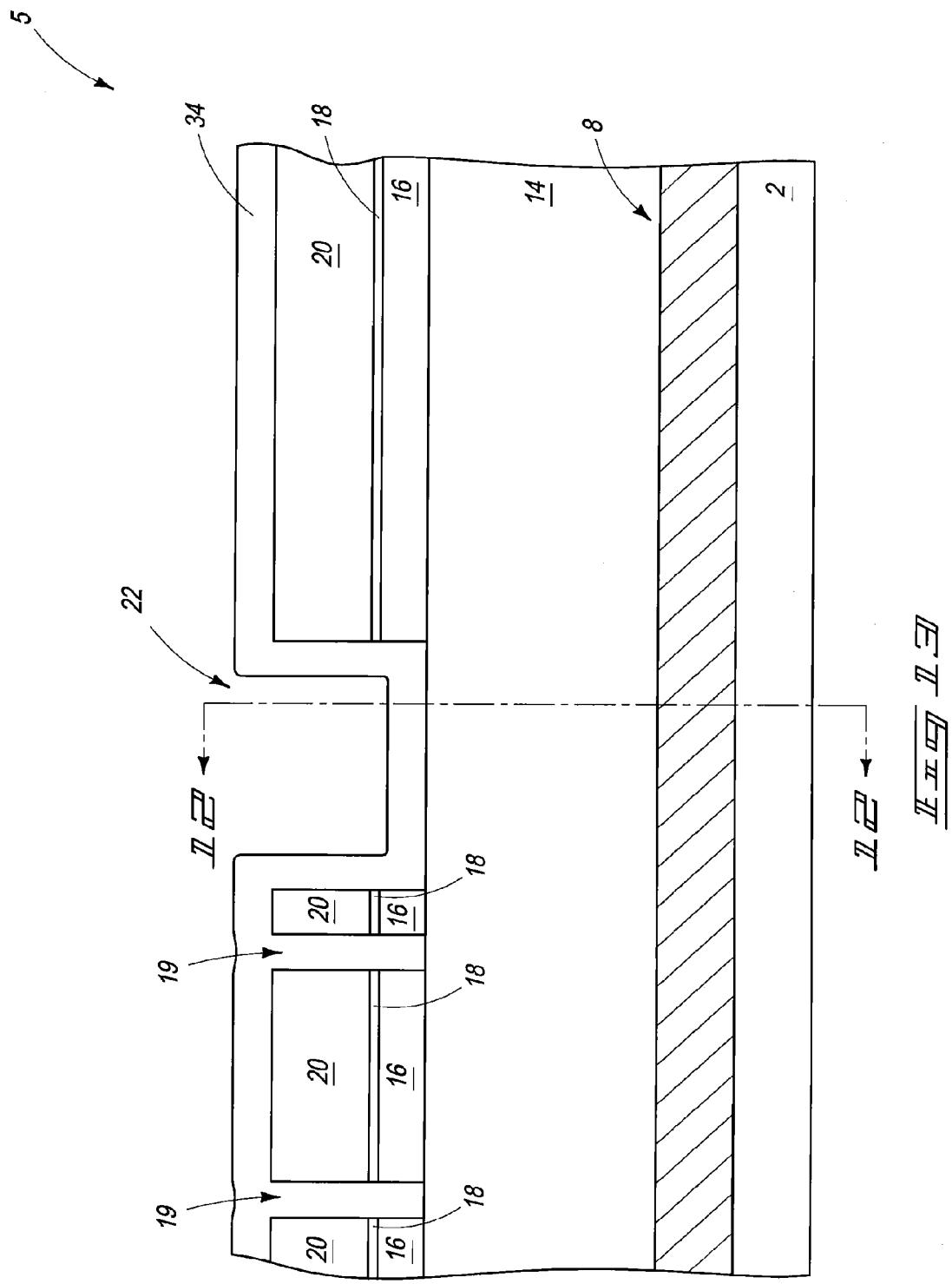

Referring to FIGS. 11-13, a conformal layer 34 is formed within openings 19 and within trench 22. The layer 34 has a thickness such that the layer fills the openings 19 (as shown in FIG. 13) and lines the trench 22. In some embodiments, the layer 34 may comprise, consist essentially of, or consist of silicon dioxide and may be formed utilizing one or both of atomic layer deposition (ALD) and chemical vapor deposition (CVD).

Figure 14:
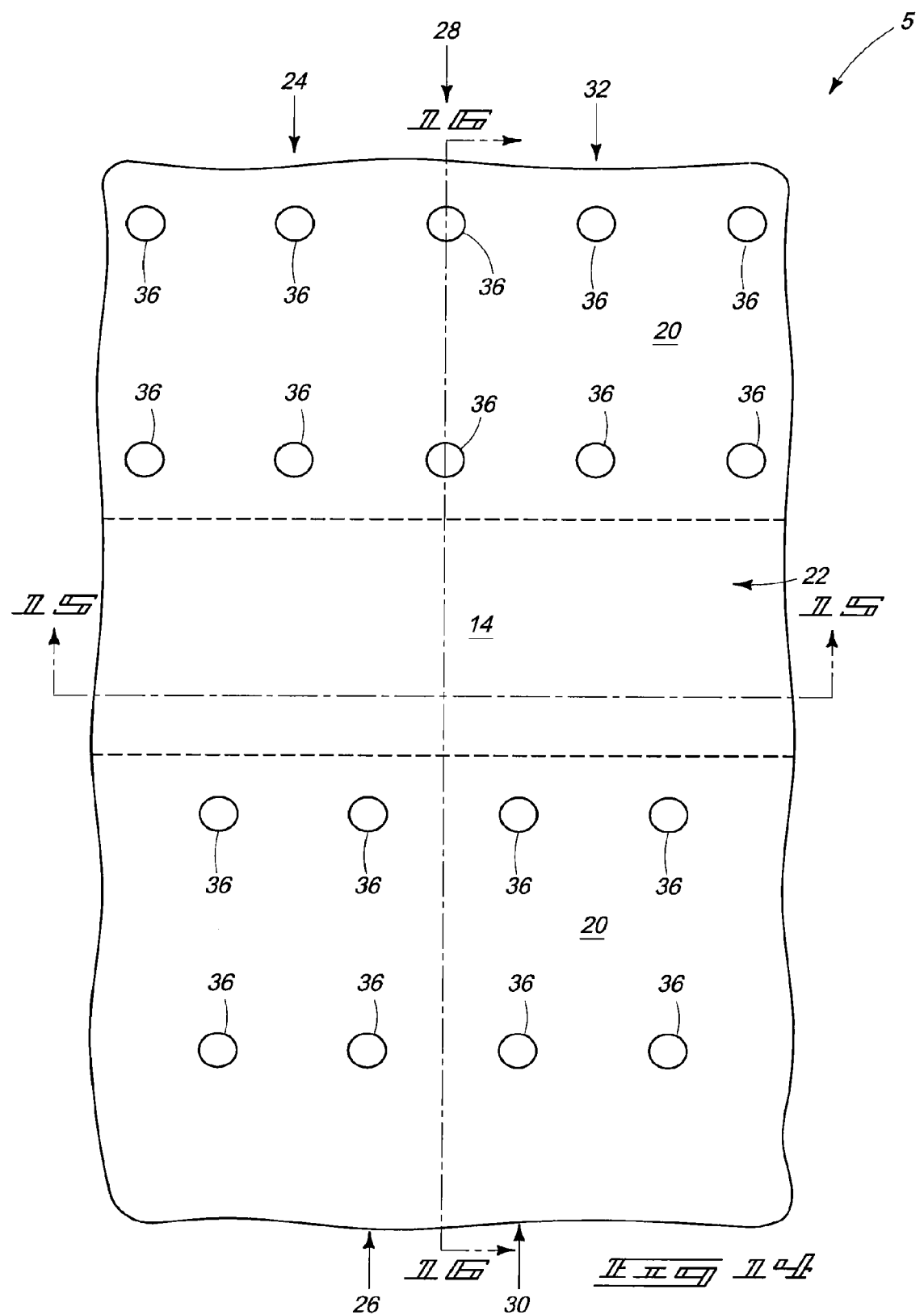
FIGS. 14-16 are a diagrammatic top view and a pair of diagrammatic cross-sectional side views of the semiconductor construction of FIGS. 3 and 4 at a processing stage subsequent to that of FIGS. 11-13. The view of FIG. 15 is along the lines 15-15 of FIGS. 14 and 16, and the view of FIG. 16 is along the lines 16-16 of FIGS. 14 and 15.
Figure 15:
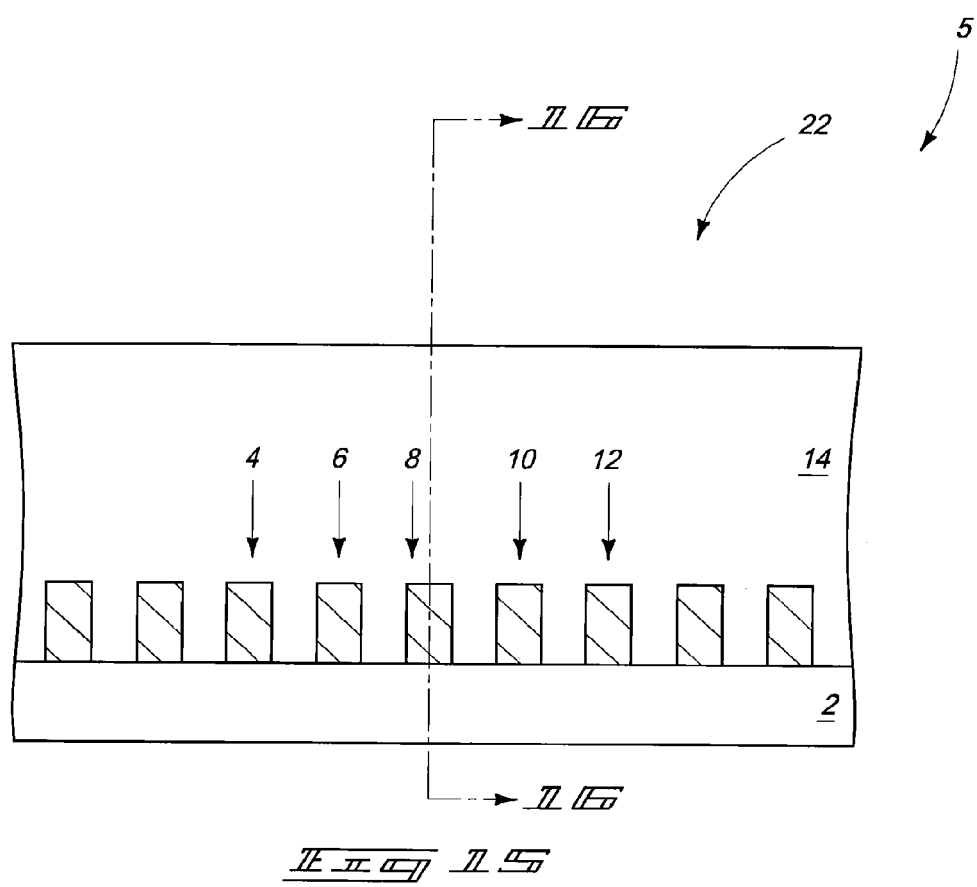
Figure 16:
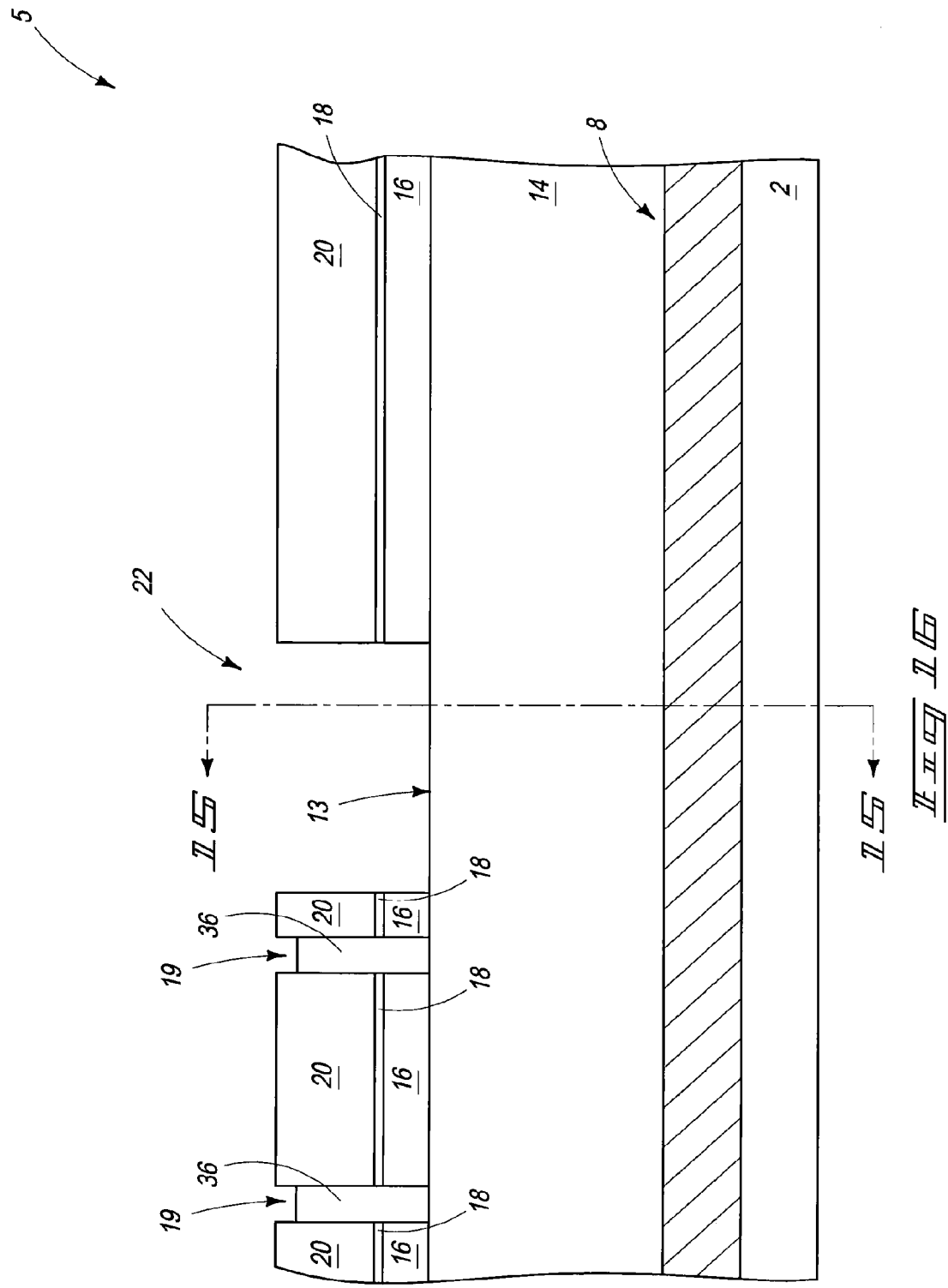

Referring to FIGS. 14-16, the layer 34 (FIGS. 11-13) is subjected to an etch which removes the layer from within trench 22 while patterning the layer within openings 19 into structures 36. In the shown embodiment such structures correspond to pedestals that extend through masking material 16 to directly contact the upper surface 13 of material 14 (FIG. 16). In embodiments in which layer 34 (FIGS. 11-13) comprises, consists essentially of, or consist of silicon dioxide, the etch utilized to remove the layer from within the trench 22 may be a fluorine-containing wet etch.

Figure 17:
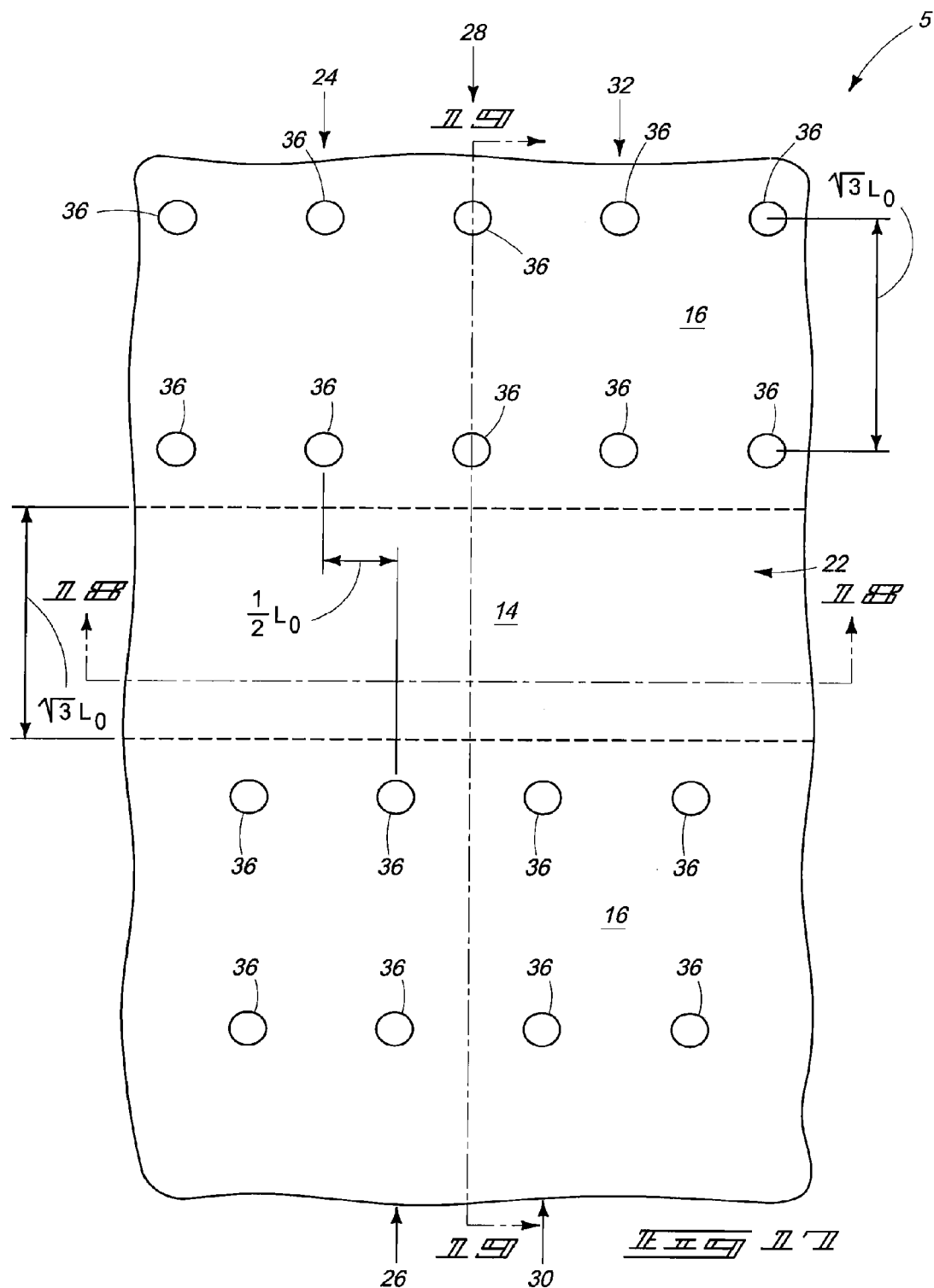
FIGS. 17-19 are a diagrammatic top view and a pair of diagrammatic cross-sectional side views of the semiconductor construction of FIGS. 3 and 4 at a processing stage subsequent to that of FIGS. 14-16. The view of FIG. 18 is along the lines 18-18 of FIGS. 17 and 19, and the view of FIG. 19 is along the lines 19-19 of FIGS. 17 and 18.
Figure 18:
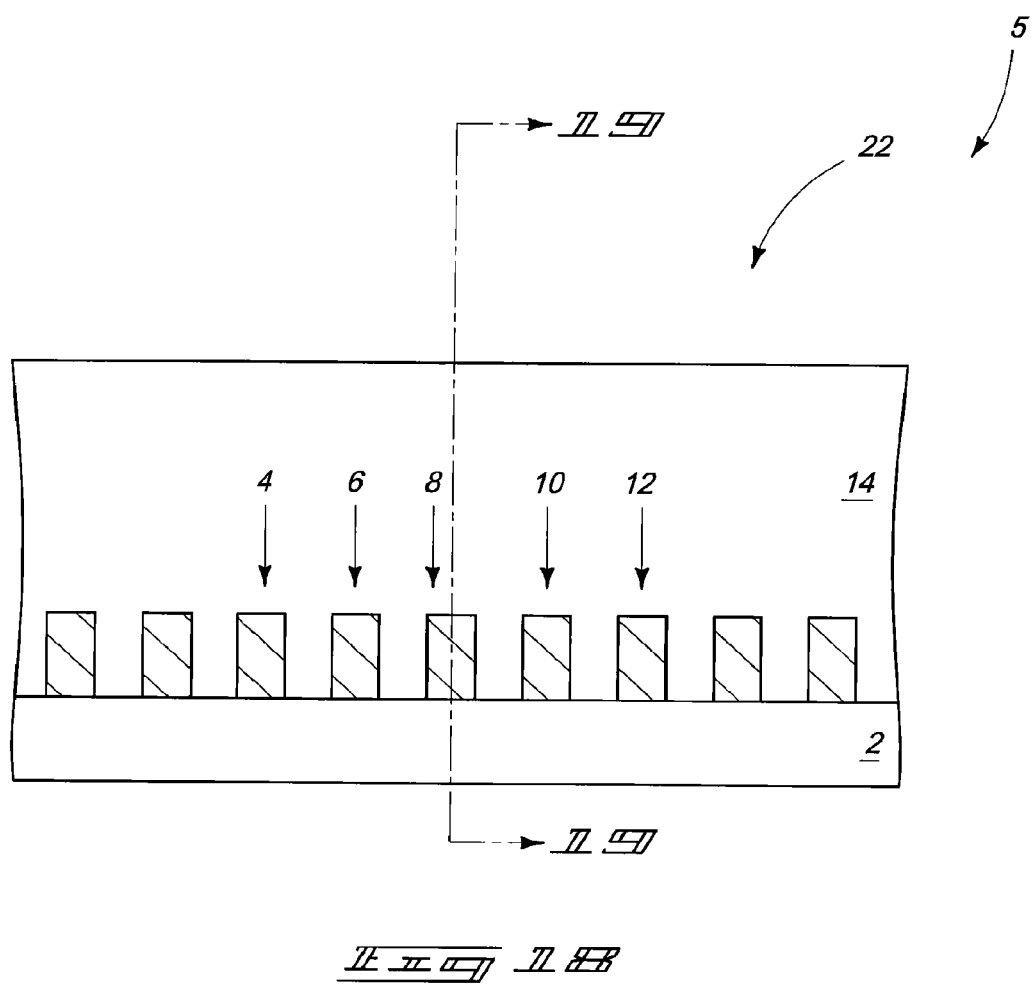
Figure 19:
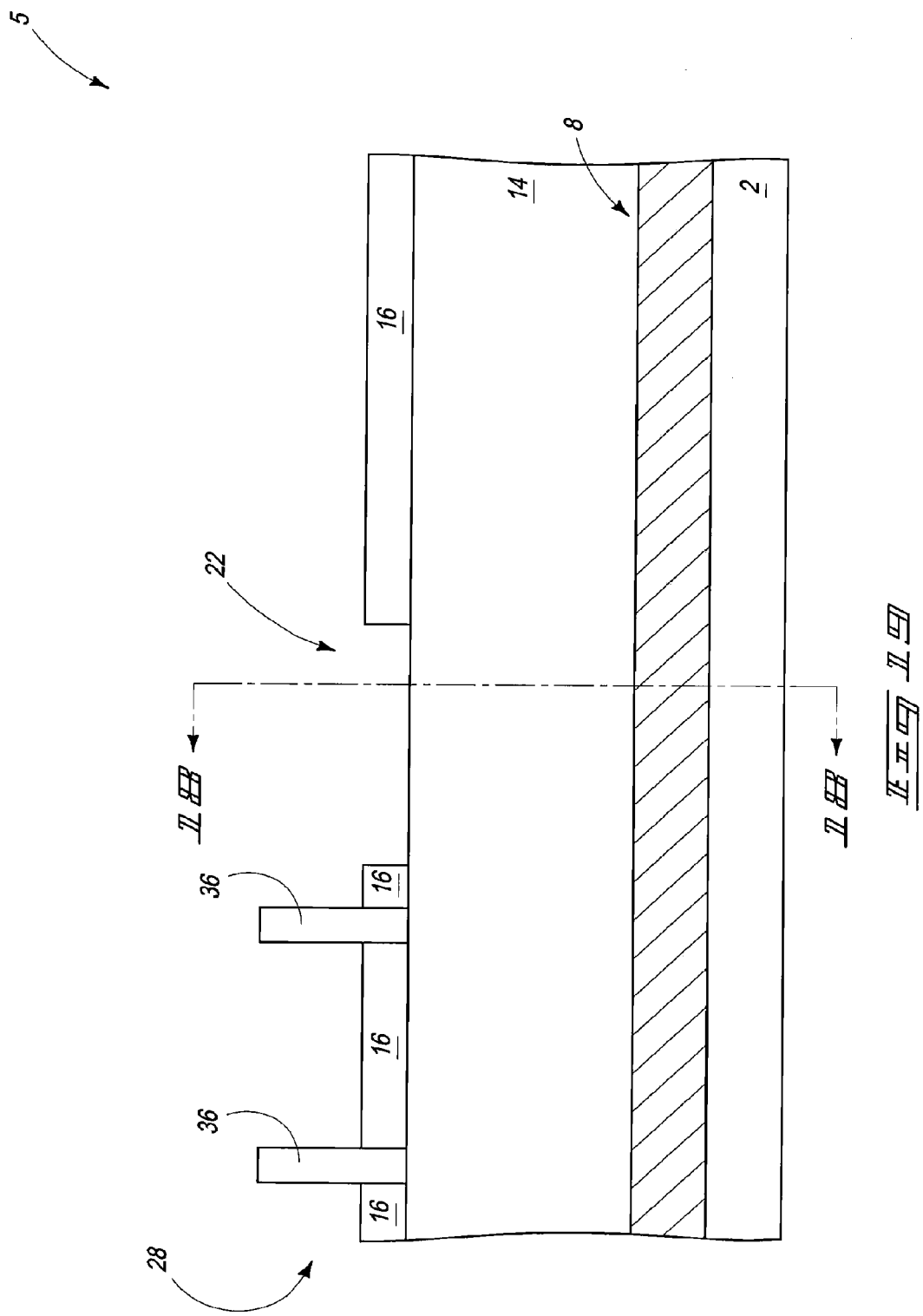

Referring to FIGS. 17-19, material 18 and photoresist masking material 20 (FIGS. 14-16) are removed. In some embodiments, materials 18 and 20 both comprise organic compositions, and thus can be removed with common processing. Although material 18 is removed in the shown example embodiment, in other embodiments it may be only material 20 which is removed. For instance, in embodiments in which material 18 forms a brush layer, the material 18 would not be removed.

The pedestals 36 remaining at the processing stage of FIGS. 17-19 are arranged in the columns 24, 26, 28, 30 and 32 discussed previously. Adjacent pedestals 36 within the same column as one another are spaced center-to-center by the distance of $\sqrt{3}L_0$; and adjacent columns are laterally offset from one another by the center-to-center distance of $\frac{1}{2}L_0$. The pedestals 36 define an initial part of a two-dimensional array that extends across insulative material 14, and that is aligned with underlying electrically conductive structures (such as the structures 4, 6, 8, 10 and 12). In some embodiments, pedestals 36 may be considered to sparsely populate such array.

Figure 20:
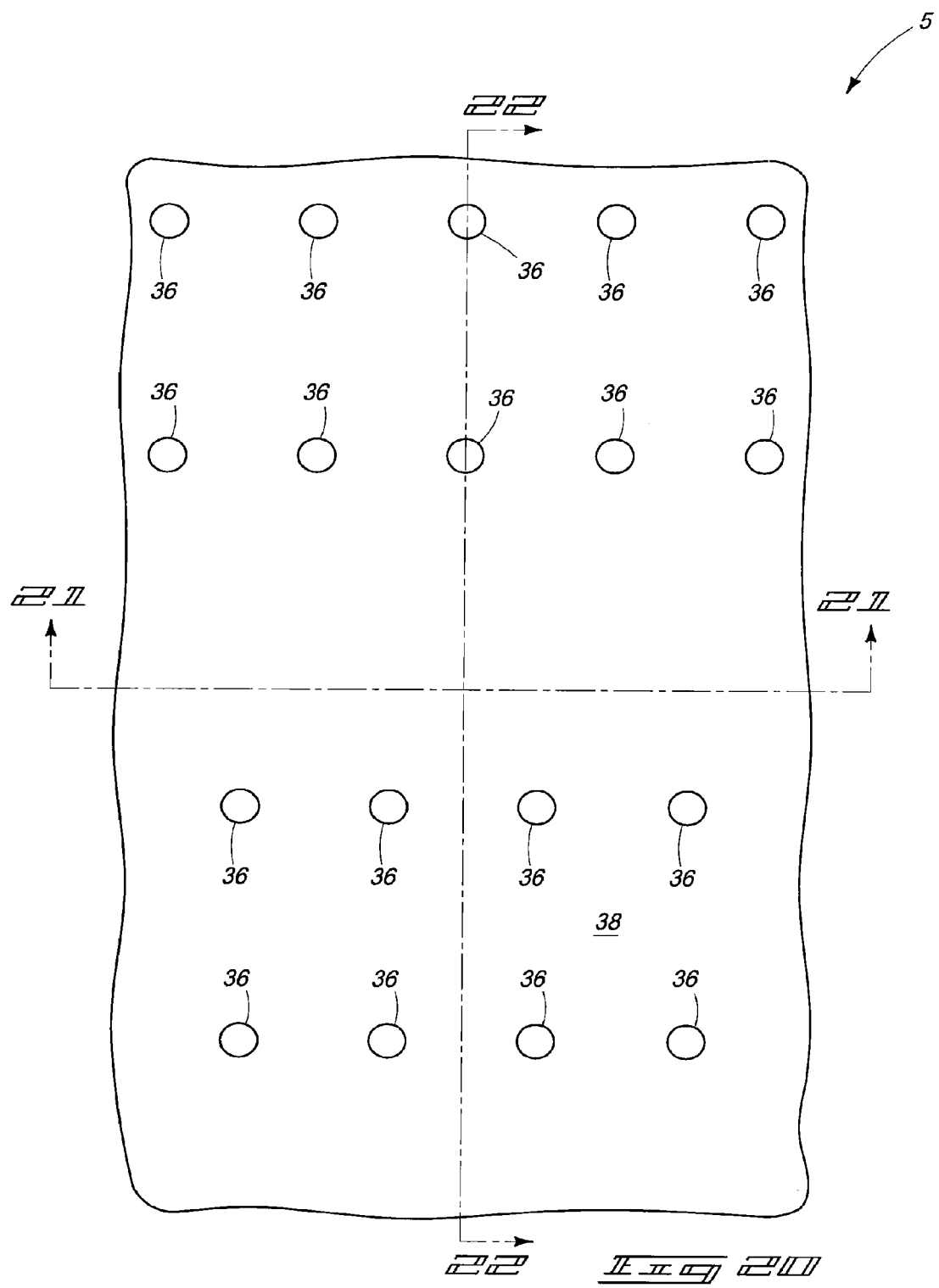
FIGS. 20-22 are a diagrammatic top view and a pair of diagrammatic cross-sectional side views of the semiconductor construction of FIGS. 3 and 4 at a processing stage subsequent to that of FIGS. 17-19. The view of FIG. 21 is along the lines 21-21 of FIGS. 20 and 22, and the view of FIG. 22 is along the lines 22-22 of FIGS. 20 and 21.
Figure 21:
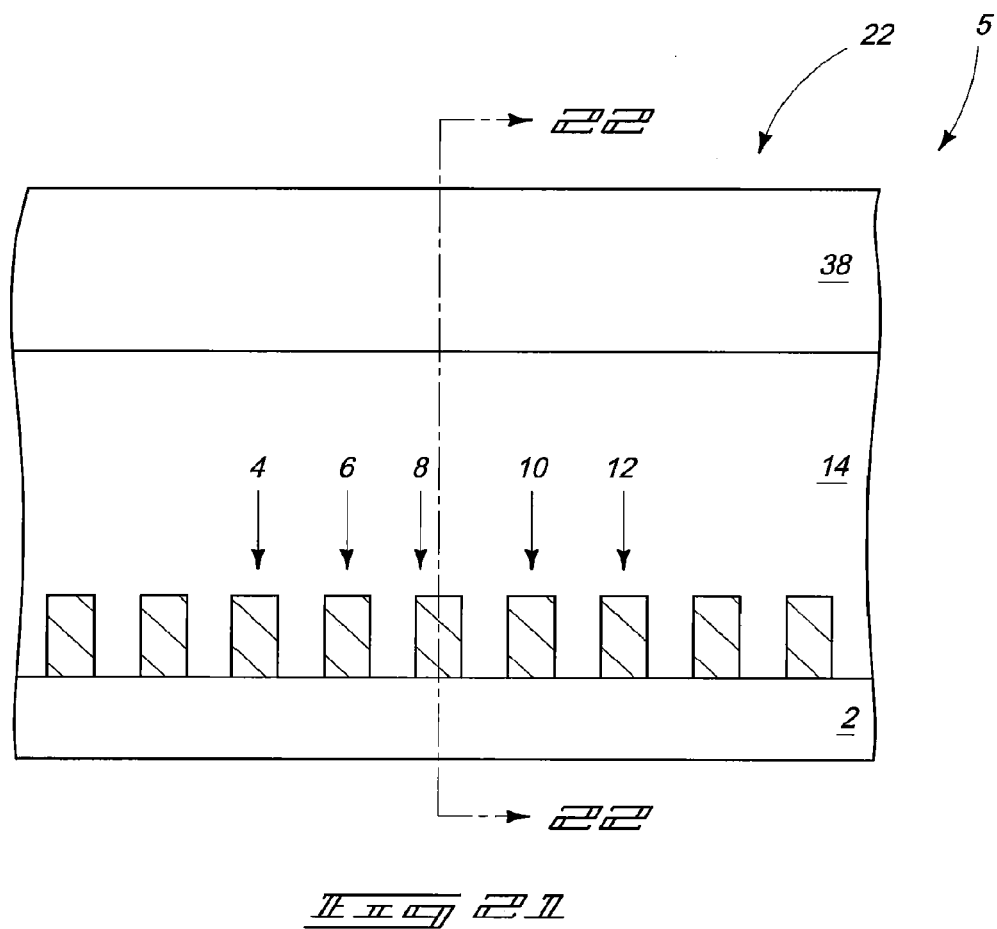
Figure 22:
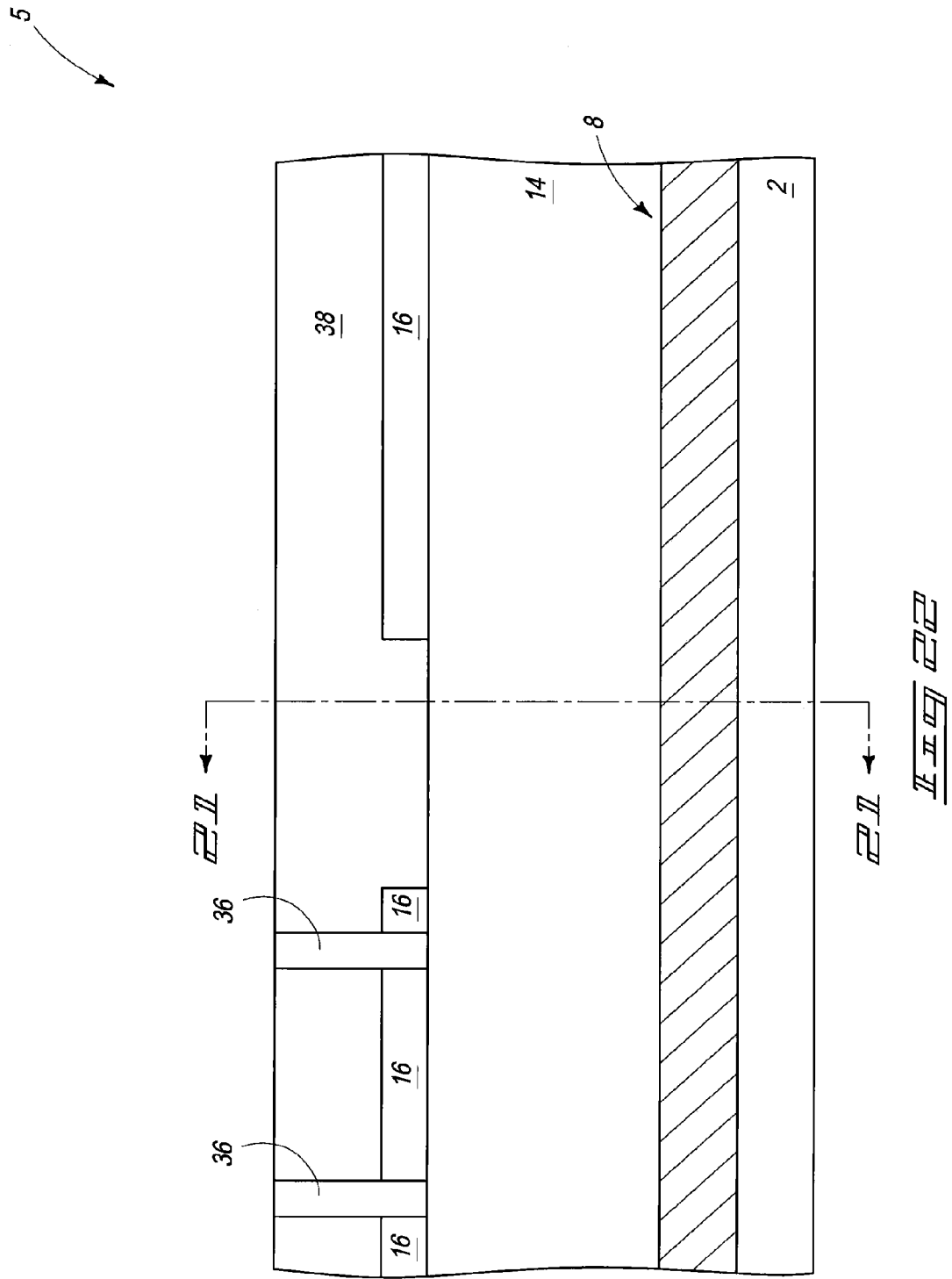

Referring to FIGS. 20-22, block copolymer 38 is spread across structures 36 and across regions of material 14 and 16 proximate such structures. The block copolymer may comprise any suitable composition, and in some embodiments may comprise, consist essentially of, or consist of PS-b-PMMA. The block copolymer may be formed to any suitable thickness. In the shown embodiment, the thickness is about the same as the heights of pedestals 36. In other embodiments the thickness may be greater than the heights of the pedestals, and in yet other embodiments the thickness may be less than the heights of the pedestals.

Figure 23:
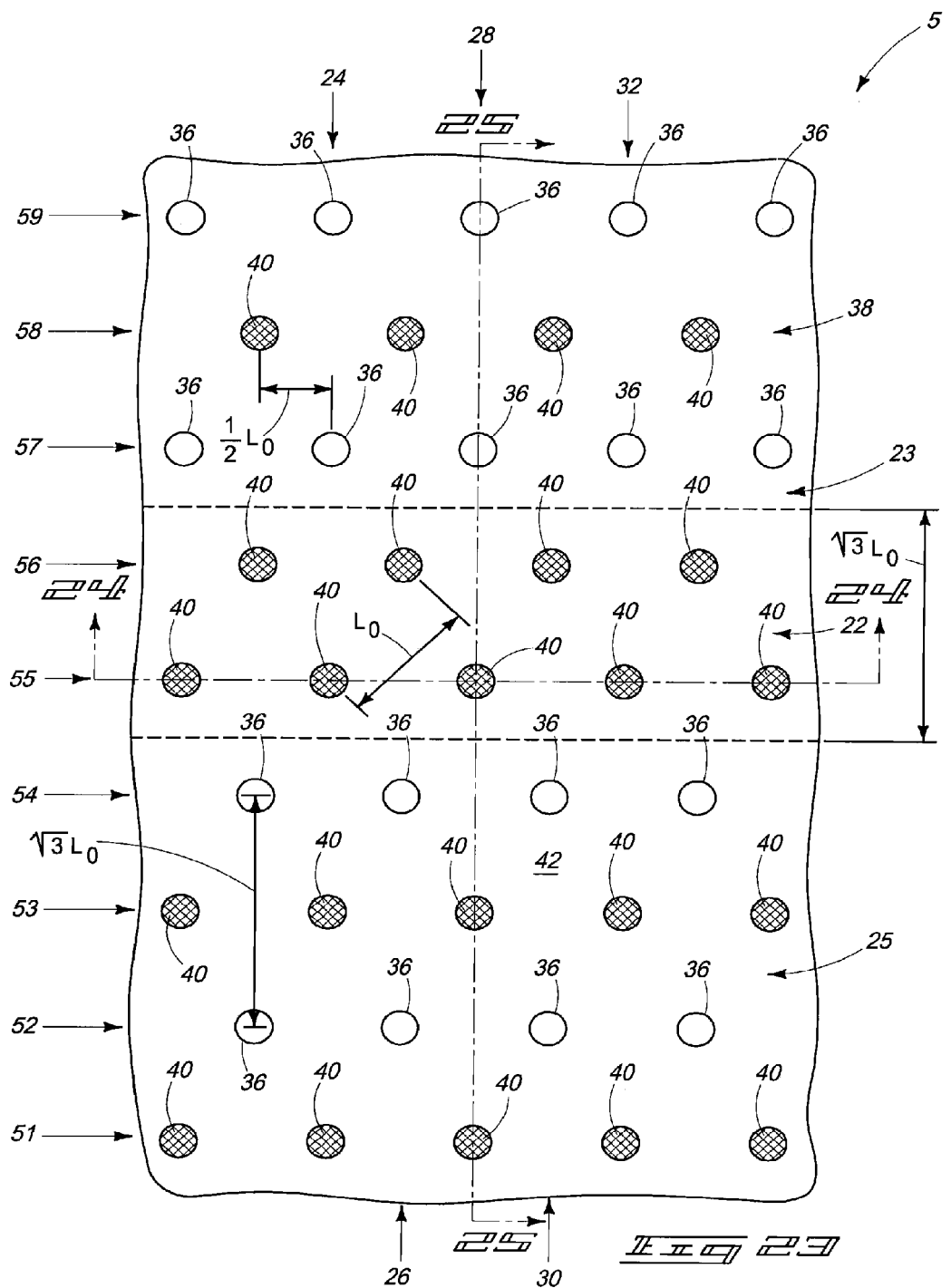
FIGS. 23-25 are a diagrammatic top view and a pair of diagrammatic cross-sectional side views of the semiconductor construction of FIGS. 3 and 4 at a processing stage subsequent to that of FIGS. 20-22. The view of FIG. 24 is along the lines 24-24 of FIGS. 23 and 25, and the view of FIG. 25 is along the lines 25-25 of FIGS. 23 and 24.
Figure 24:
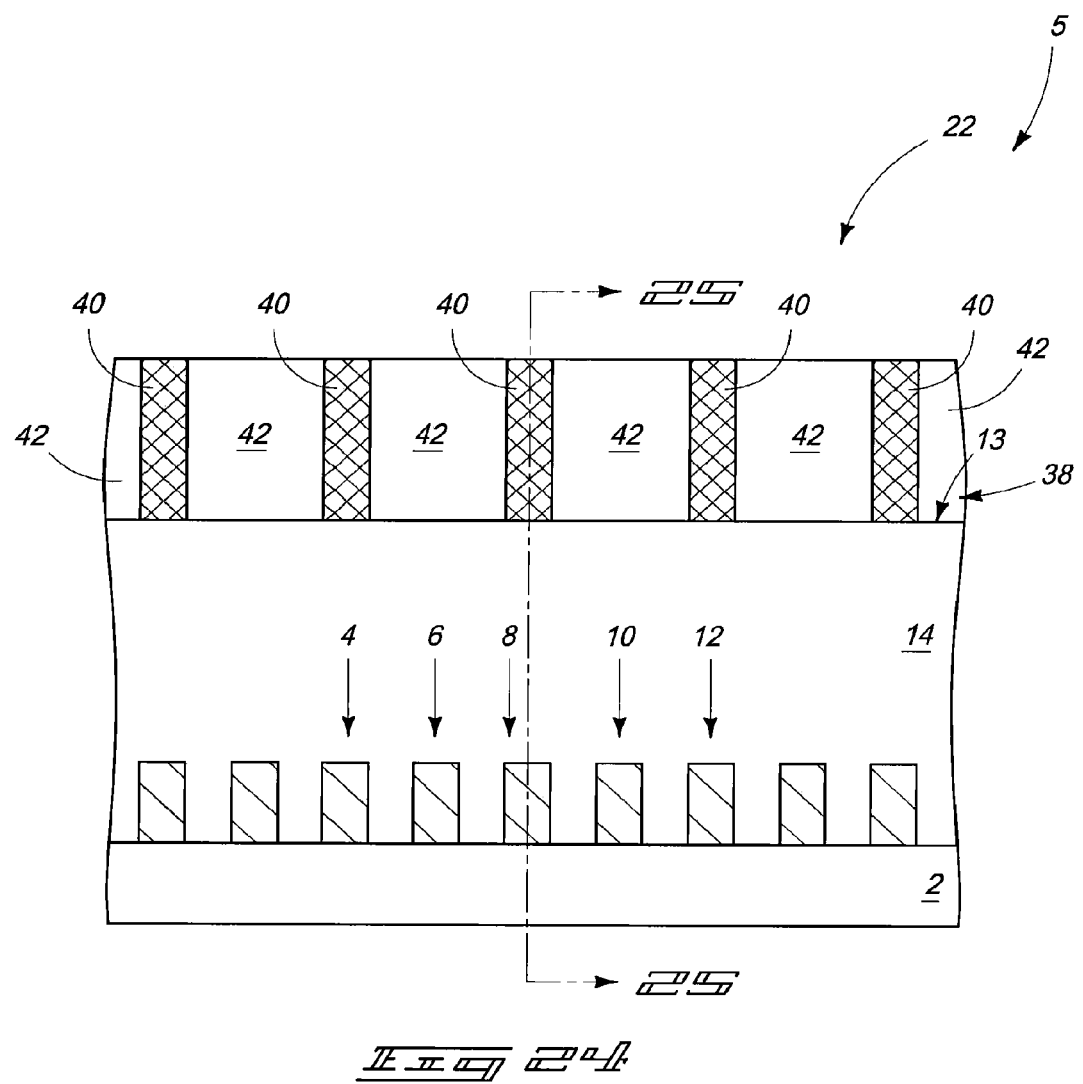
Figure 25:
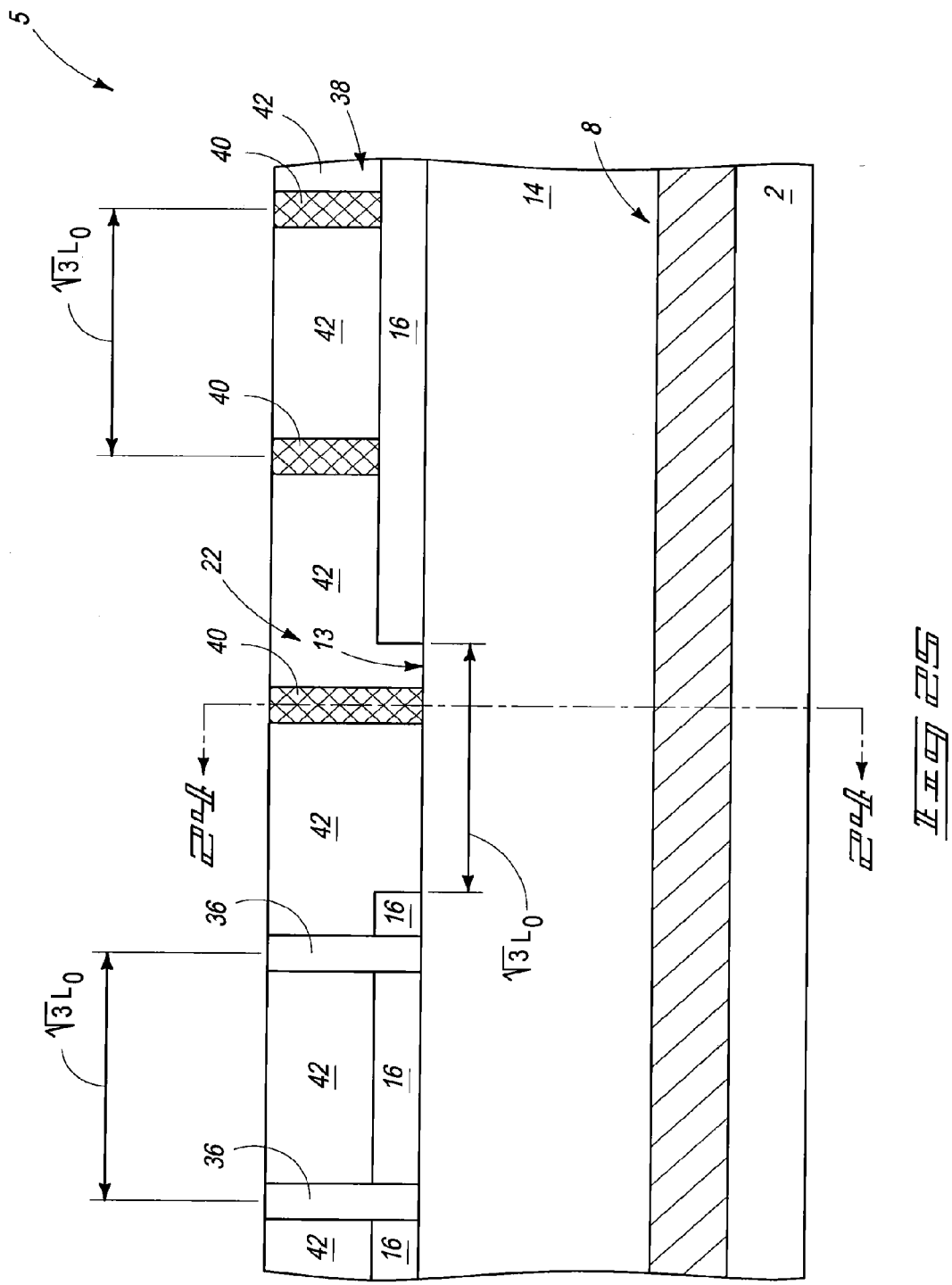

Referring to FIGS. 23-25, block copolymer 38 is treated to induce self-assembly of the block copolymer into first domains 40 and a second domain 42 surrounding the first domains. The treatment utilized to induce the self-assembly may be any suitable treatment, such as, for example, utilization of exposure to one or both of solvent vapor and temperature changes. Although the second domain 42 is shown to be contiguous across the upper surface of construction 5, in other embodiments the second domain may be broken up so that there are a plurality of the second domains instead of the single large second domain shown in FIGS. 23-25.

The self-assembled block copolymer is graphoepitaxially patterned by the structures 36 so that the first domains 40 are pinned in locations defined by structures 36. Specifically, the two-dimensional array defined by structures 36 is propagated through the block copolymer during the self-assembly process so that the first domains 40 populate such two-dimensional array. Thus, the sparsely-populated array defined by structures 36 may become fully populated through the self-assembly of the block copolymer.

The two-dimensional array is illustrated in the top view of FIG. 23, and comprises the columns 24, 26, 28, 30 and 32; together with rows 51-60 that are orthogonal to such columns. The structures 36 and domains 40 may be together considered to be features of the two-dimensional array. Thus, the embodiment of FIG. 23 may be considered to comprise a two-dimensional array that includes two types of features, with one of the feature types corresponding to the pedestals 36, and the other of the feature types corresponding to the first domains 40 of the self-assembled block copolymer. In the shown embodiment the domains 40 are cylinders that extend normal relative to the upper surface 13 of the electrically insulative material 14.

The first domains 40 within the interconnect region defined by trench 22 are in direct contact with the upper surface 13 of the electrically insulative material 14 (as shown in FIGS. 24 and 25), while the first domains outside of such interconnect region are spaced from the upper surface of the electrically insulative material 14 by at least the masking material 16. In the shown embodiment, the first domains outside of the interconnect region are spaced from the upper surface of the electrically insulative material 14 by only the masking material 16, but in other embodiments there could be other materials between the masking material and the domains 40. For example, the material 18 (shown in FIGS. 3 and 4) may be a brush layer which remains between the masking material 16 and the domains 40.

In the shown embodiment, the adjacent structures 36 within a column are spaced from one another by the distance $\sqrt{3}L_0$ that corresponds to the center-to-center distance between adjacent domains 40 in a pattern of hexagonally closest packed unit cells (as described above with reference to FIG. 1 in describing spacings between the A domains). In other embodiments, at least some of the adjacent structures 36 within a column may be spaced from one another by a multiple of $\sqrt{3}L_0$ so that domains 40 are propagated between the structures 36 during the self-assembly process. Similarly, a least some of the adjacent structures 36 within rows may be spaced from one another by multiples of $L_0$.

In the shown embodiment the structures 36 are formed on either side of trench 22, and on opposing sides of the two-dimensional array; but in other embodiments the structures may all be formed on the same side of the trench, and on the same side of the two-dimensional array as one another. Regardless, the structures 36 will sparsely populate a two-dimensional array ultimately formed from the block copolymer. In the shown embodiment no specific accommodation is made for a brush layer that may form on the sides of structures 36 during the self-assembly of the block copolymer. In some embodiments some of the illustrated spacings may be modified to accommodate such brush layer.

The shown locations of structures 36 are example locations, and in other embodiments the structures may be placed at other locations to sparsely populate a two-dimensional array. The structures 36 may be placed at any points within the secondary regions 23 and 25 that generate desired positioning of domains 40 across the interconnect region defined by trench 22.

The utilization of the structures 36 to sparsely populate the two-dimensional array pins the array to locations initially defined by the photolithographic patterning of mask 20 (FIGS. 5-7). Thus, the two-dimensional array formed at one elevational level of a semiconductor construction through self-assembly of block copolymer can be aligned with other structures formed at other elevational levels of the construction.

In the shown embodiment upper surfaces of first domain 40, second domain 42 and structures 36 are all approximately co-extensive (as shown in FIG. 25). In other embodiments structures 36 may have uppermost surfaces that are above or below the upper surfaces of domains 42 and 40.

Figure 26:
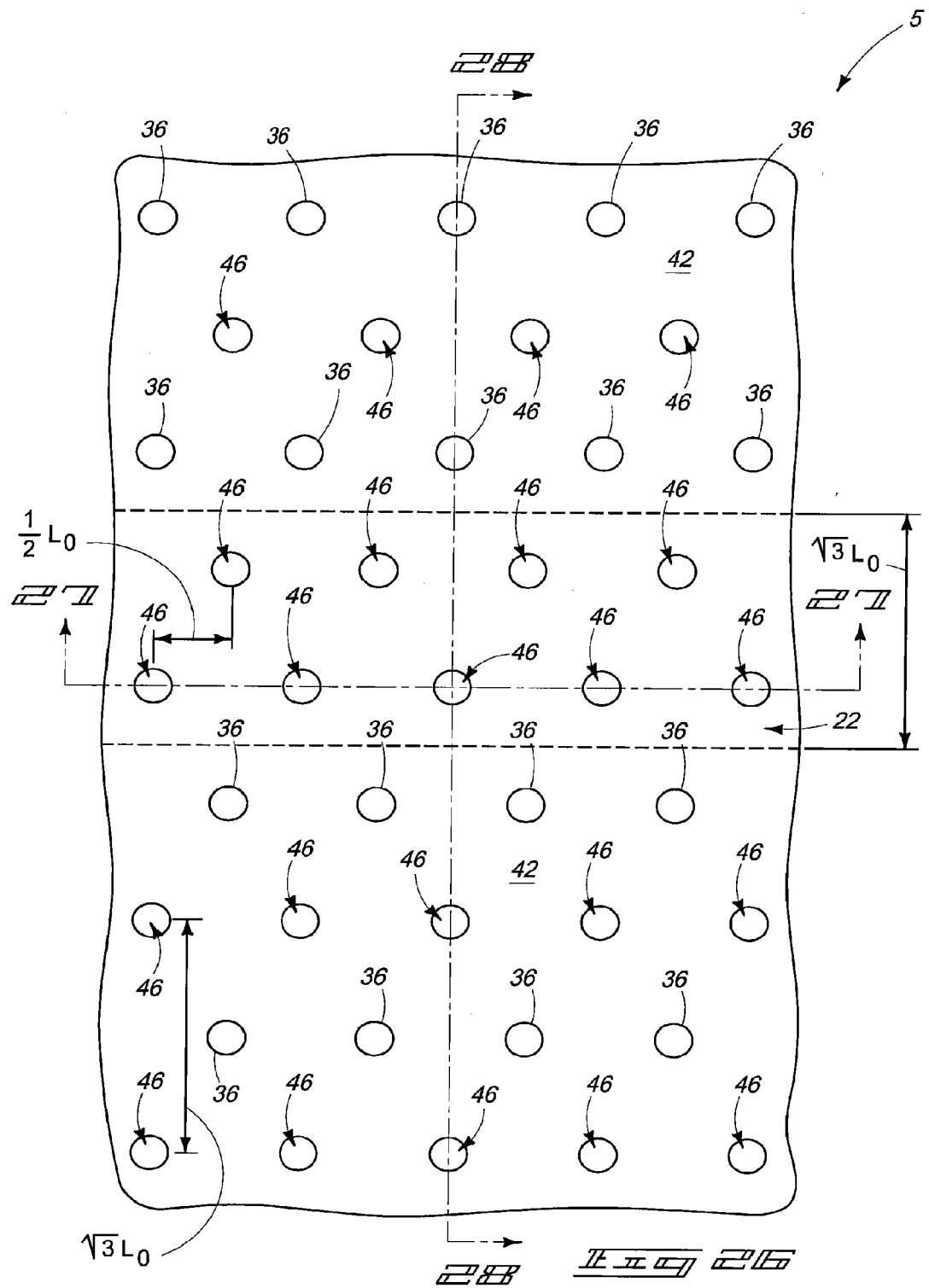
FIGS. 26-28 are a diagrammatic top view and a pair of diagrammatic cross-sectional side views of the semiconductor construction of FIGS. 3 and 4 at a processing stage subsequent to that of FIGS. 23-25. The view of FIG. 27 is along the lines 27-27 of FIGS. 26 and 28, and the view of FIG. 28 is along the lines 28-28 of FIGS. 26 and 27.
Figure 27:
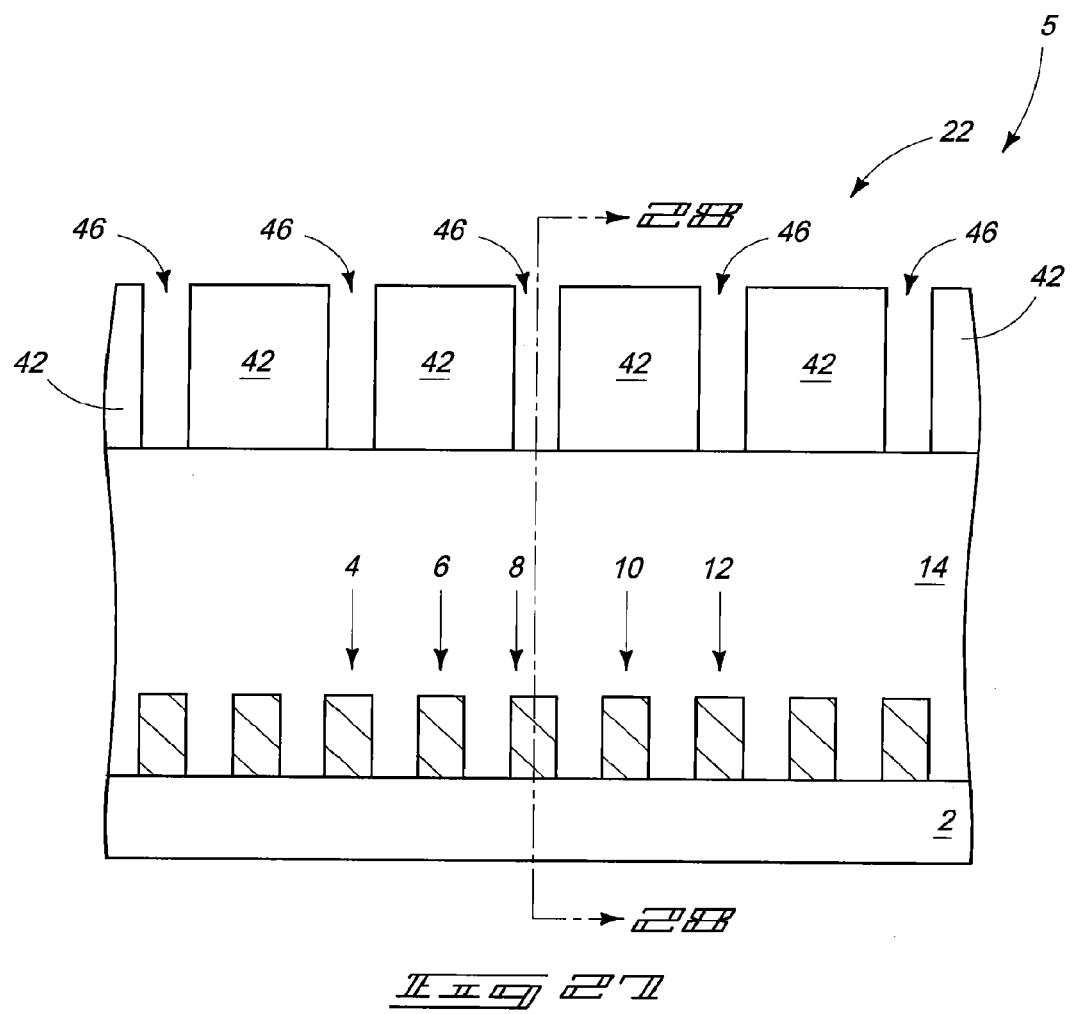
Figure 28:
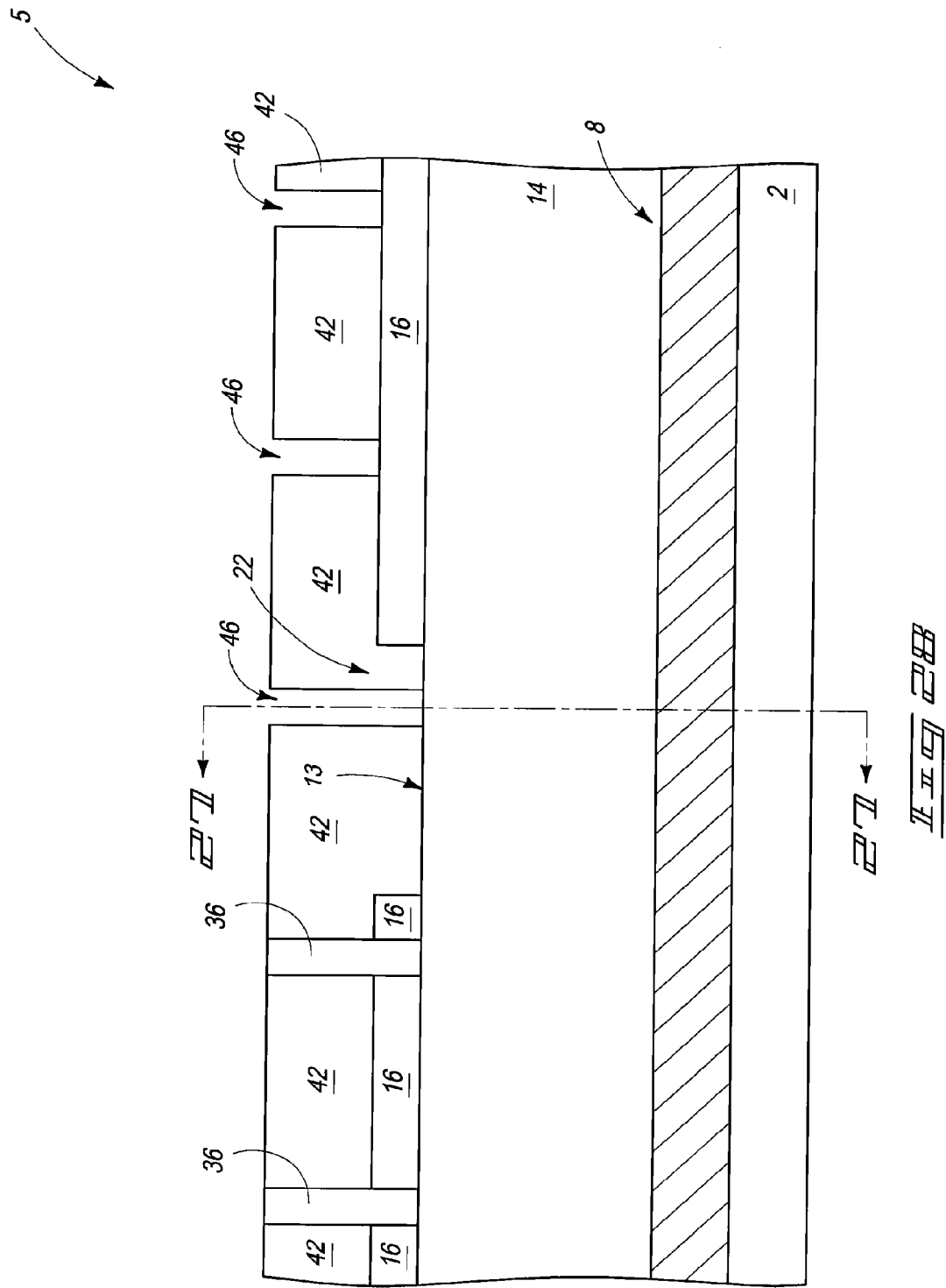

Referring to FIGS. 26-28, domains 40 (FIGS. 23-25) are removed selectively relative to domain 42 and structures 36 to form openings (which may also be referred to herein as holes) 46 extending through domain 42. The openings 46 within trench 22 extend to the upper surface 13 of electrically insulative material 14, while the openings 46 that are not within trench 22 extend to an upper surface of masking material 16. In other words, the openings within the interconnect region defined by trench 22 extend down to at least an elevational level of the uppermost surface 13 of electrically insulative 14, while the openings 46 that are not within such interconnect region do not extend down to such elevational level (as shown in FIGS. 27 and 28).

Figure 29:
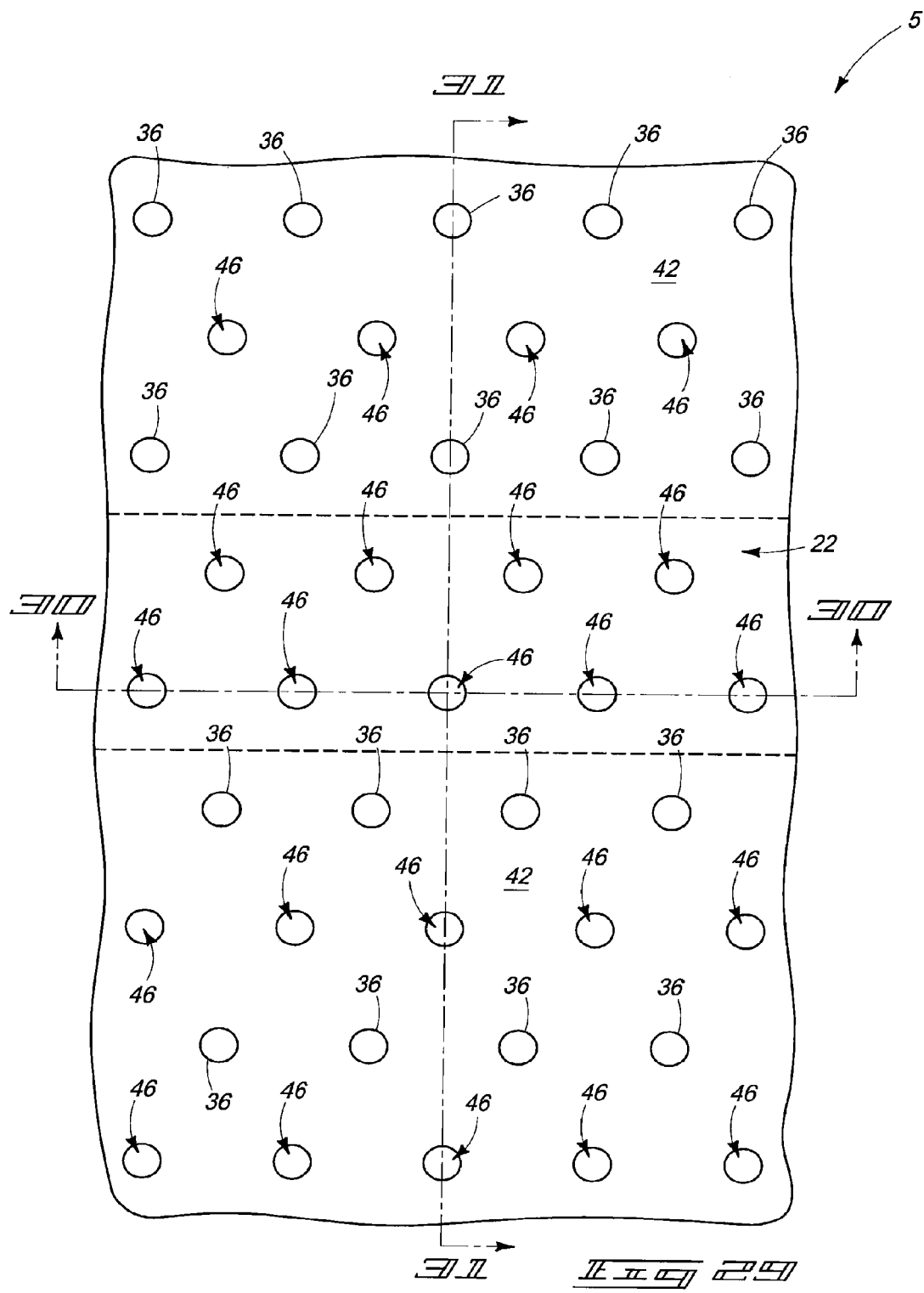
Figure 31:
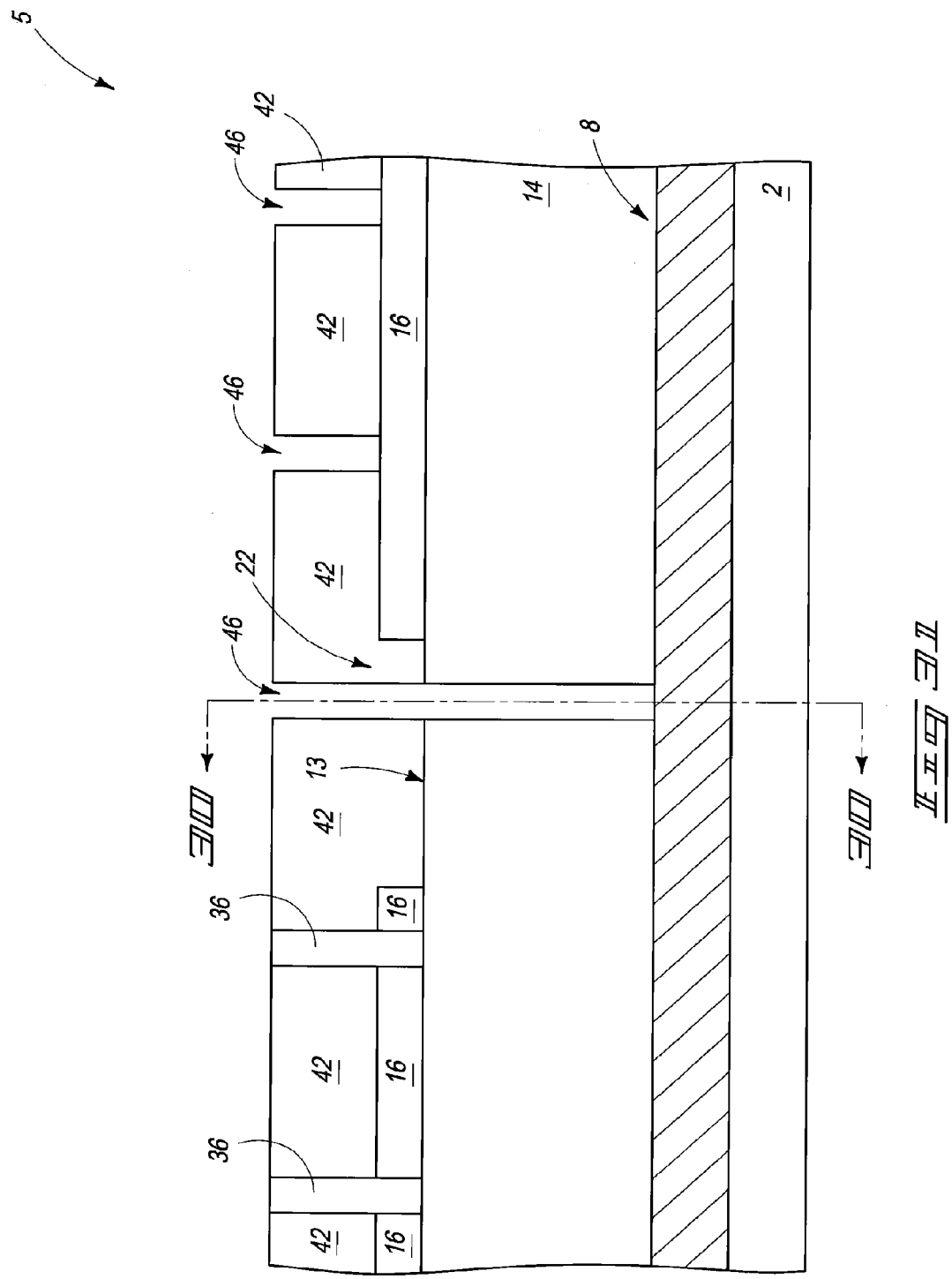

Referring to FIGS. 29-31, an etch selective for material 14 relative to the domain 42 and masking material 16 is utilized to extend some of the openings 46 through material 14 and to upper surfaces of the electrically conductive structures 4, 6, 8, 10 and 12. Specifically, the openings 46 within the interconnect region defined by trench 22 are extended through material 14, while the rest the openings are not extended. The openings extending through material 14 may be utilized as contact openings to establish electrical contact to the electrically conductive structures (for instance, the structures 4, 6, 8, 10 and 12). Specifically, electrically conductive material may be subsequently formed within the contact openings (as discussed below) to establish electrical connections to the electrically conductive structures at the bases of such openings.

Figure 32:
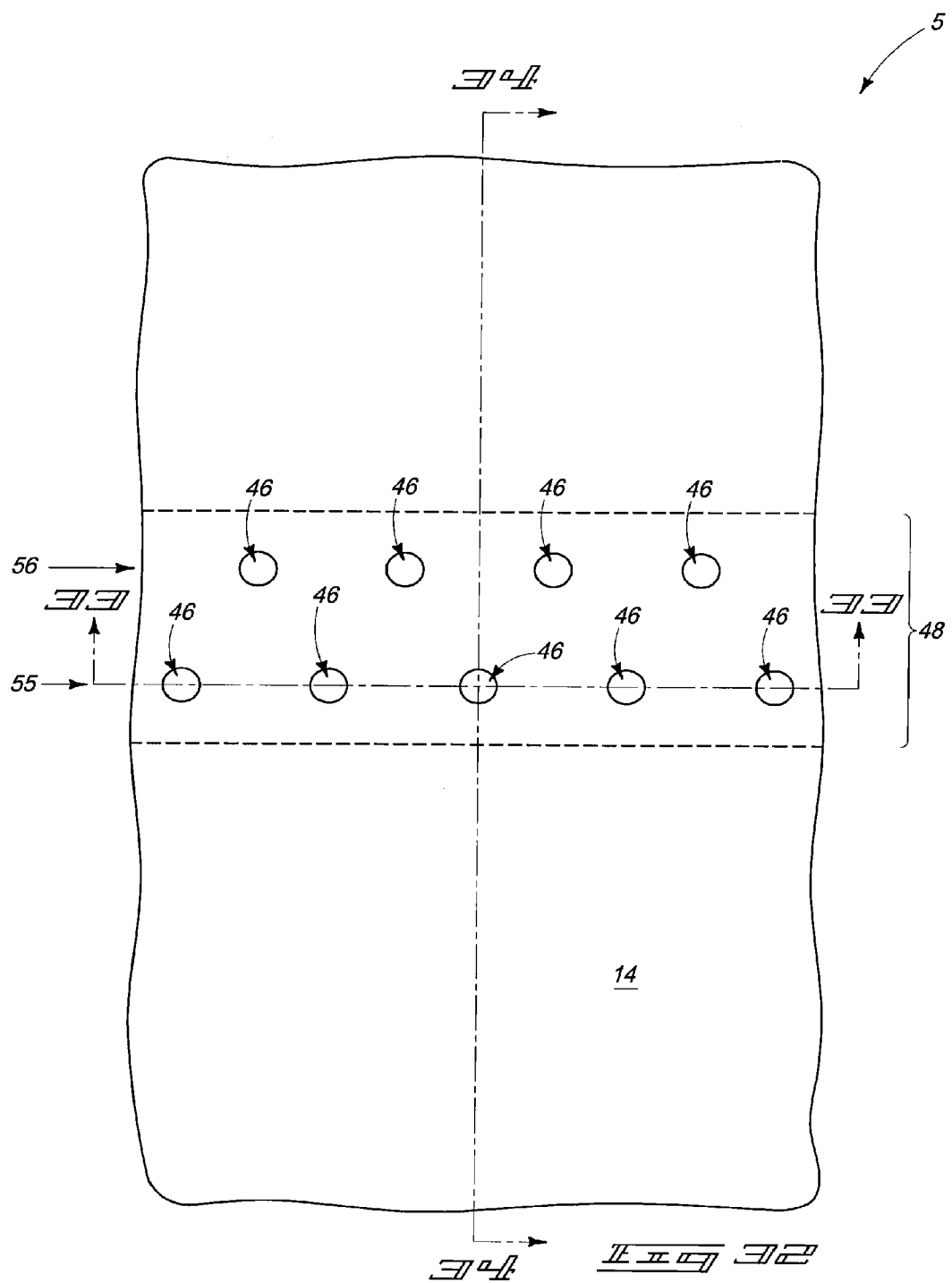
Figure 33:
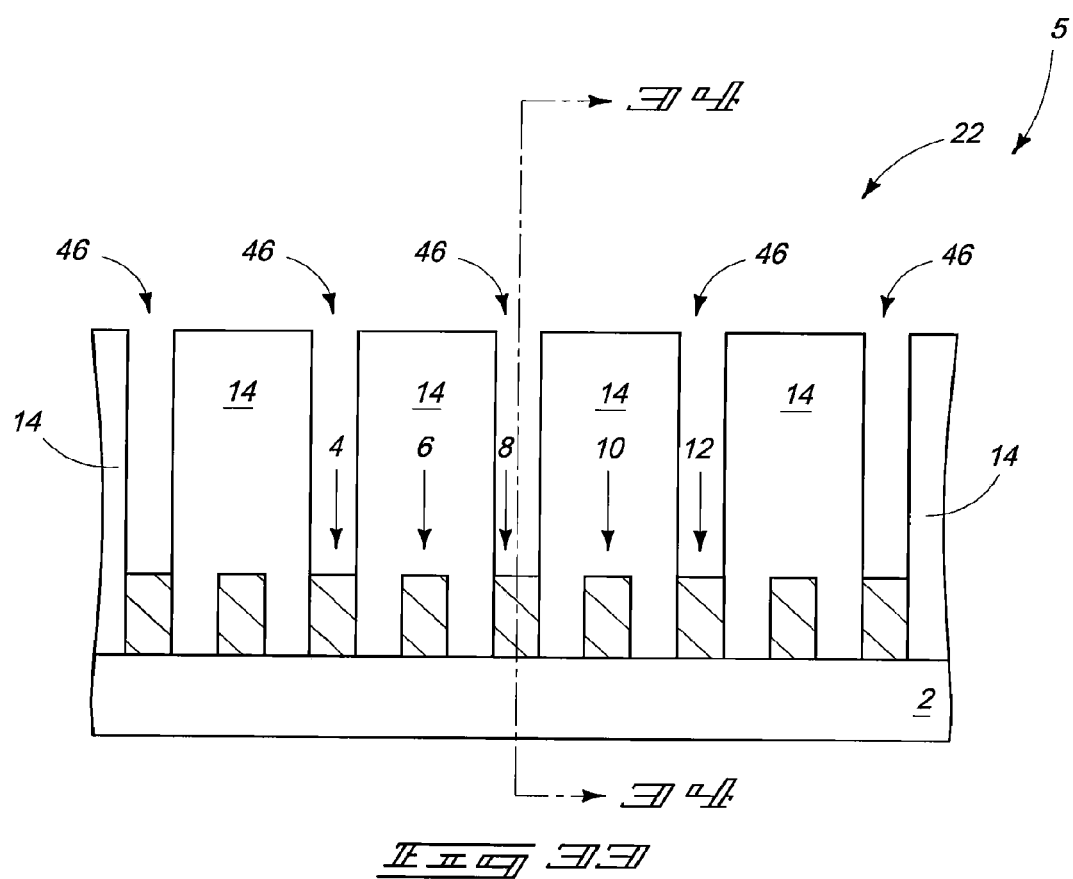
Figure 61H:
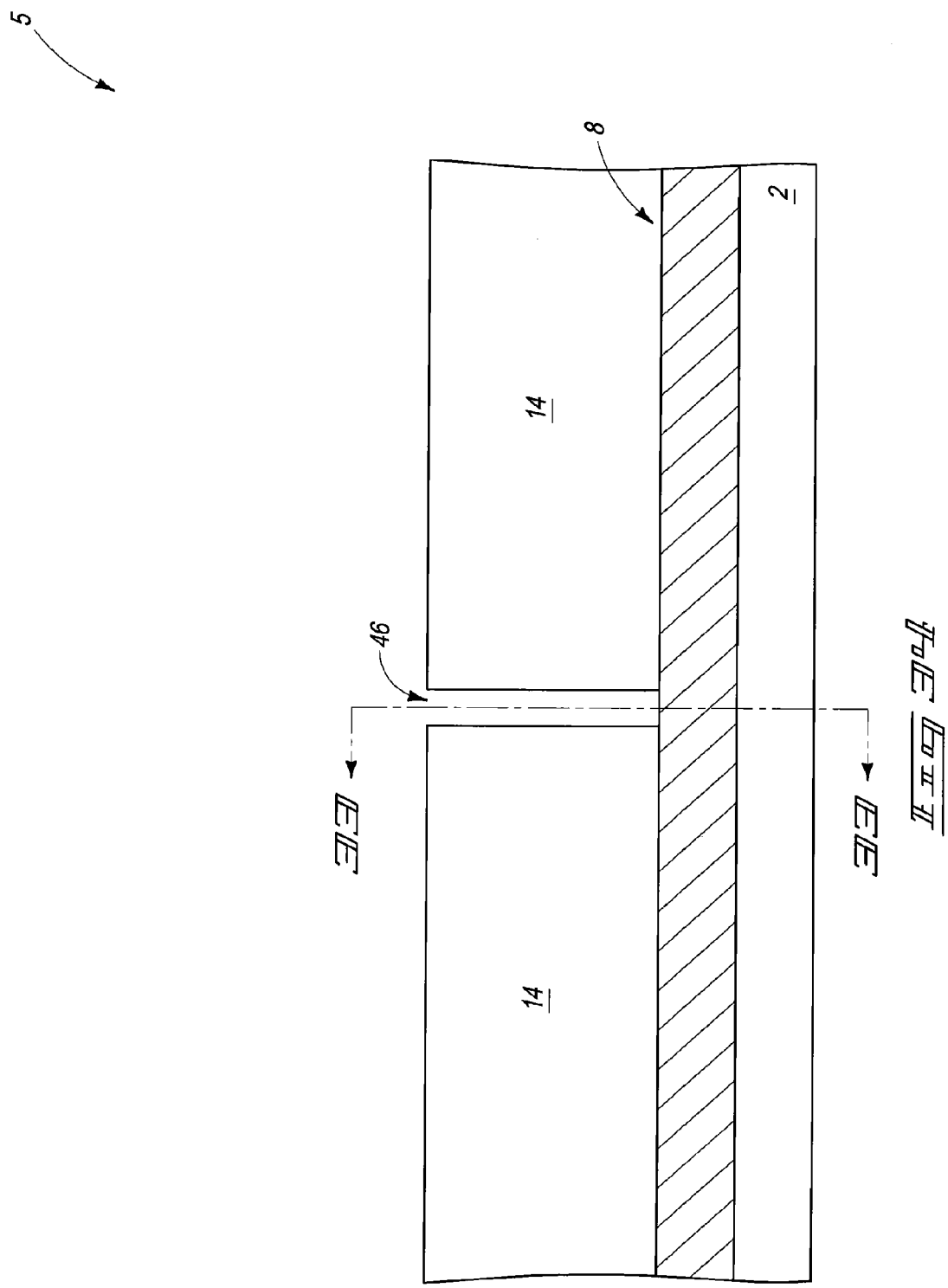

Referring to FIGS. 32-34, pedestals 36 (FIGS. 29-31), second domain 42 (FIGS. 29-31), and masking material 16 (FIGS. 29-31) are all removed from over material 14. The remaining structure has an interconnect region 48 (in the location occupied by trench 22 [FIGS. 29-31]) containing openings 46 in one-to-one correspondence with electrically conductive structures (for instance, the structures 4, 6, 8, 10 and 12). The openings are in a staggered relationship across the interconnect region, with some of the openings corresponding to row 55 of the two-dimensional array of FIG. 23, and others corresponding to row 56 of such array.

Figure 35:
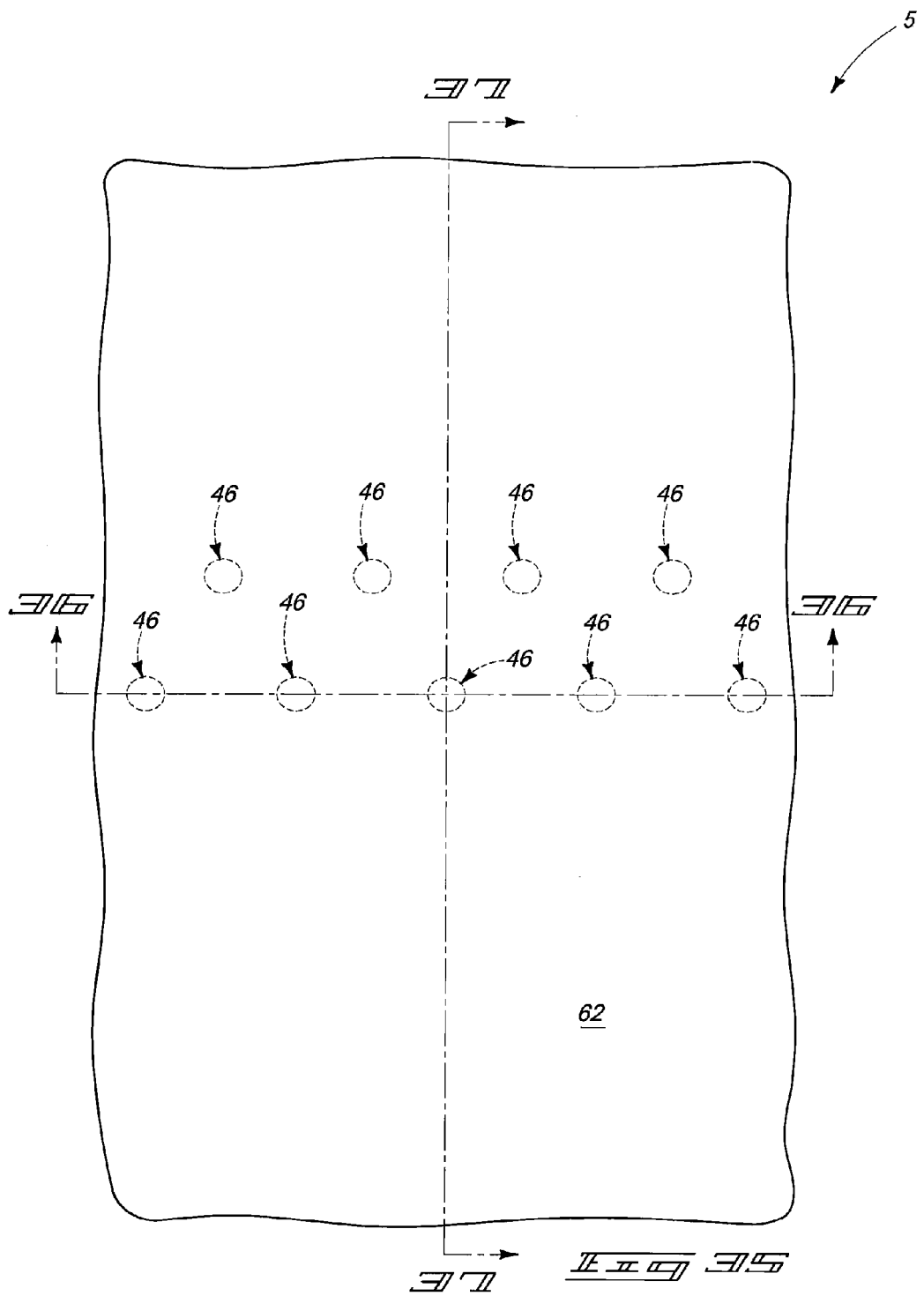

Referring to FIGS. 35-37, electrically conductive material 62 is formed across electrically insulative material 14 and within openings 46 to create electrical connections to the electrically conductive structures (for instance, the structures 4, 6, 8, 10 and 12). The openings 46 are shown in phantom view in the top view of FIG. 35 to indicate that the openings are beneath material 62. Material 62 may be left as is to form a common electrical interconnect extending to all of the electrically conductive structures (for instance, the structures 4, 6, 8, 10 and 12). In other embodiments, construction 5 may be subjected to planarization to remove material 62 from over material 14 so that the electrical interconnects to the electrically conductive structures become electrically isolated from one another.

The processing described above with reference to FIGS. 3-37 utilizes pedestal-type structures 36 for graphoepitaxy patterning of block copolymer. Other methods may be utilized for patterning of the block copolymer, and for pinning the patterned block copolymer into a desired orientation. FIGS. 38-47 illustrate another example embodiment method for pinning patterned block copolymer into a desired orientation. Similar numbering will be used to describe FIGS. 38-47 as is used above in describing FIGS. 3-37, where appropriate.

Referring to FIG. 38, a semiconductor construction 5a is shown at a processing stage subsequent to that of FIGS. 3 and 4, and along the same cross-sectional view as FIG. 7. Construction 5a comprises the electrically conductive structure 8, insulative material 14, masking material 16, and masking material 20 described previously. Construction 5a does not comprise the antireflective layer (18 of FIGS. 3 and 4) in the shown embodiment, but could in other embodiments. Openings 19 extend through masking material 20 to an upper surface of masking material 16, and a trench 22 also extends through masking material 20 to the upper surface of masking material 16.

Referring to FIG. 39, layer 34 is formed within openings 19 and within trench 22. Layer 34 may comprise the same compositions as discussed above regarding FIGS. 11-13, and may be formed with the same methods discussed above.

Referring to FIG. 40, the layer 34 (FIG. 39) is subjected to an etch which removes the layer from within trench 22 while patterning the layer within openings 19 into structures 36.

Referring to FIG. 41, the construction 5a is shown after the material 16 exposed within trench 22 is removed with an etch selective for material 16 relative to material 20 and structures 36. Such etch extends trench 22 through the material 16.

Referring to FIG. 42, the structures 36 (FIG. 41) are removed from within openings 19. In some embodiments the structures may be only partially removed, as discussed below with reference to FIG. 48.

The removal of structures 36 (which are shown in FIG. 41) exposes regions 70 of masking material 16 within the openings 19.

Referring to FIG. 43, the regions 70 are treated to render the regions to be more wettable by one of the domains of a block copolymer than by another of the domains (the treated regions are diagrammatically demarcated with dashed lines 71). The treated regions 70 can thus pin a self-assembled block copolymer pattern into a desired orientation across construction 5a. The treatment of regions 70 may comprise chemically modifying such regions, and/or forming a layer over the regions. In some embodiments, buttons of silicon dioxide may be formed over material 16 within openings 19 to pin self-assembled PS-b-PMMA into a desired orientation. In some embodiments the buttons of silicon dioxide may remain in the openings 19 as remnants of the structures 36 (FIG. 41) as discussed below with reference to FIG. 48. Although not shown, a brush layer of a material analogous to material 18 (shown in FIGS. 3 and 4) may be present at the processing stage of FIG. 43, and may be chemically modified and/or removed during formation of the treated regions 70.

Figure 44:
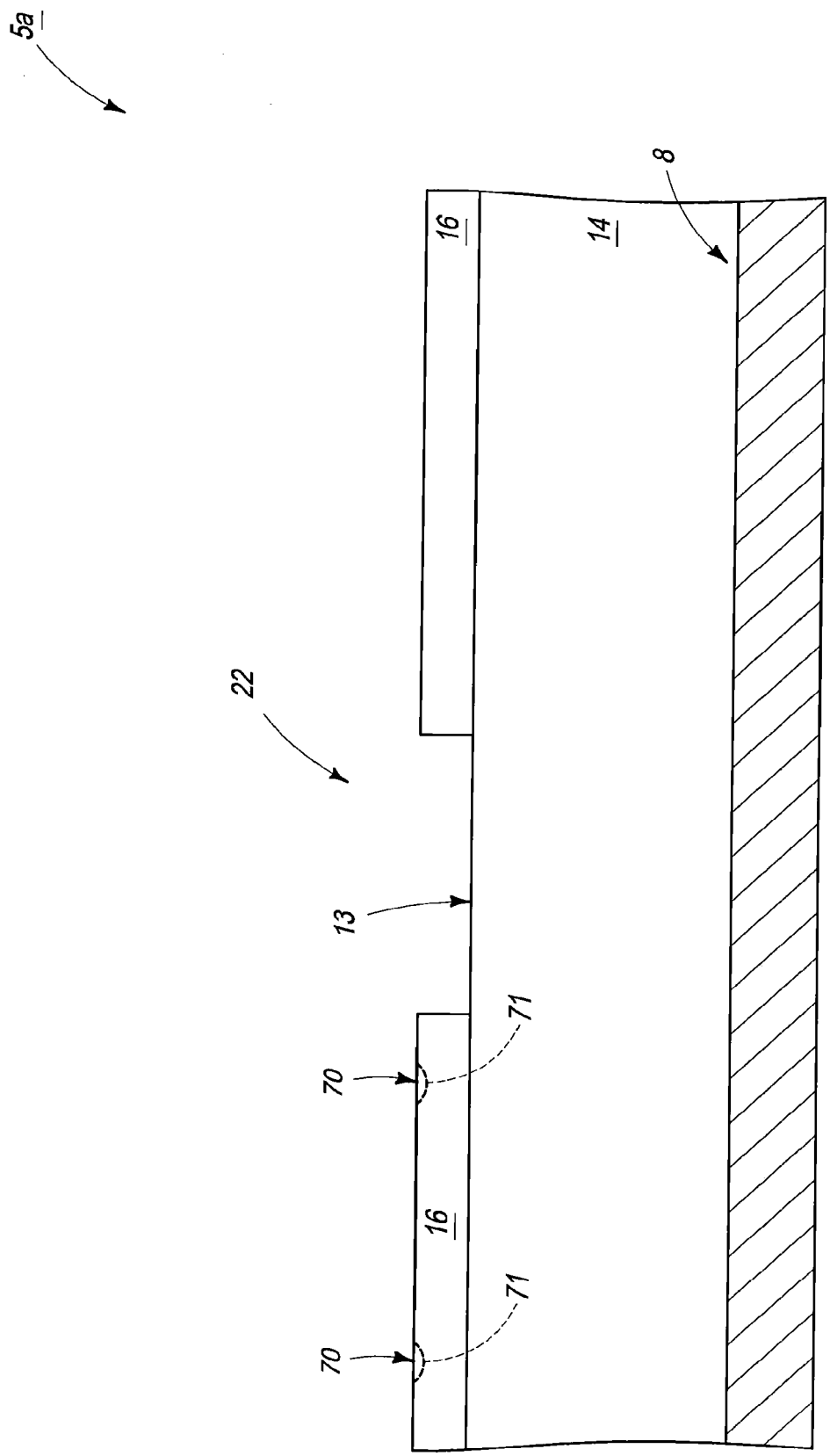
Figure 4B:
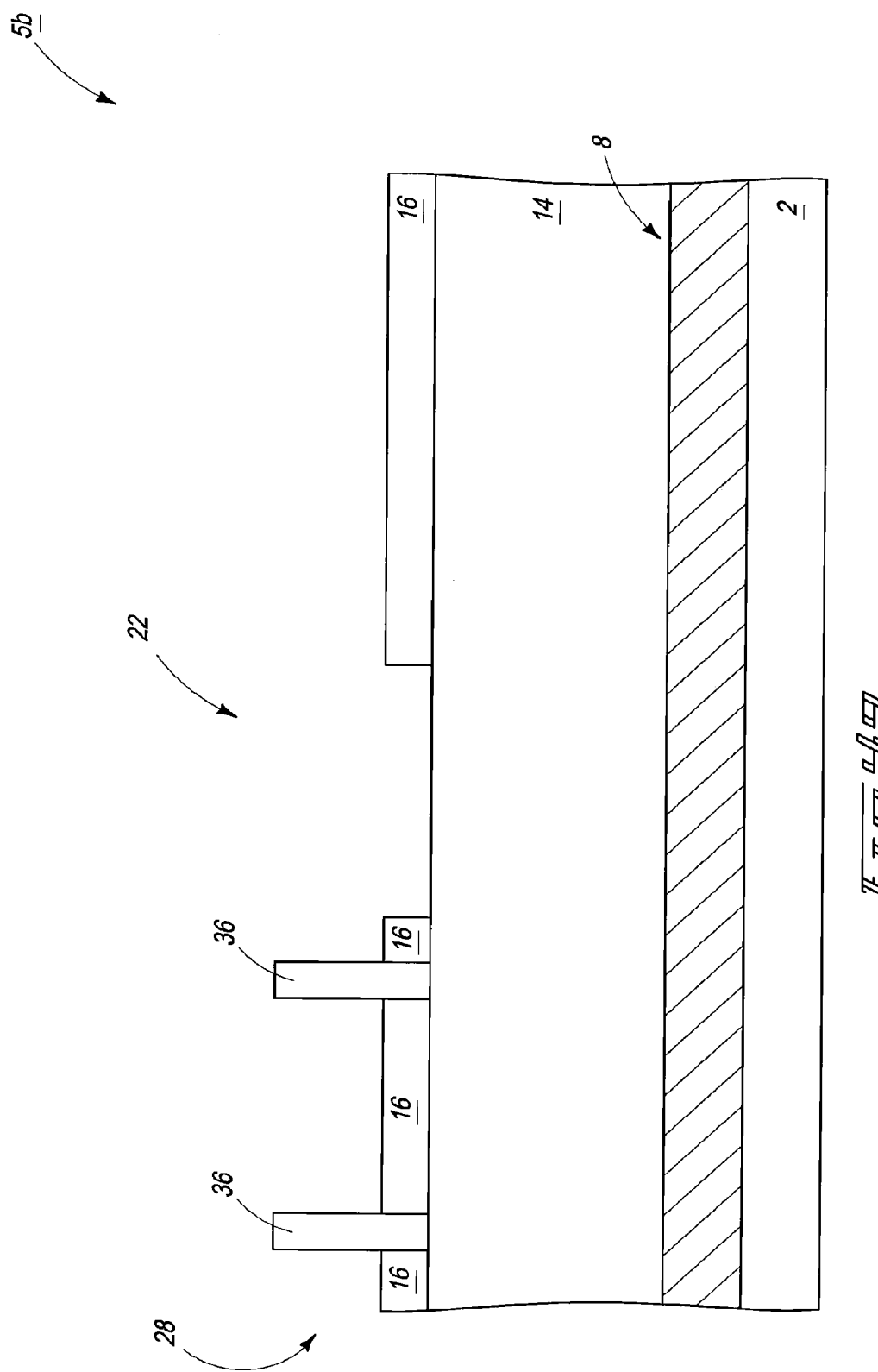
Figure 63H:
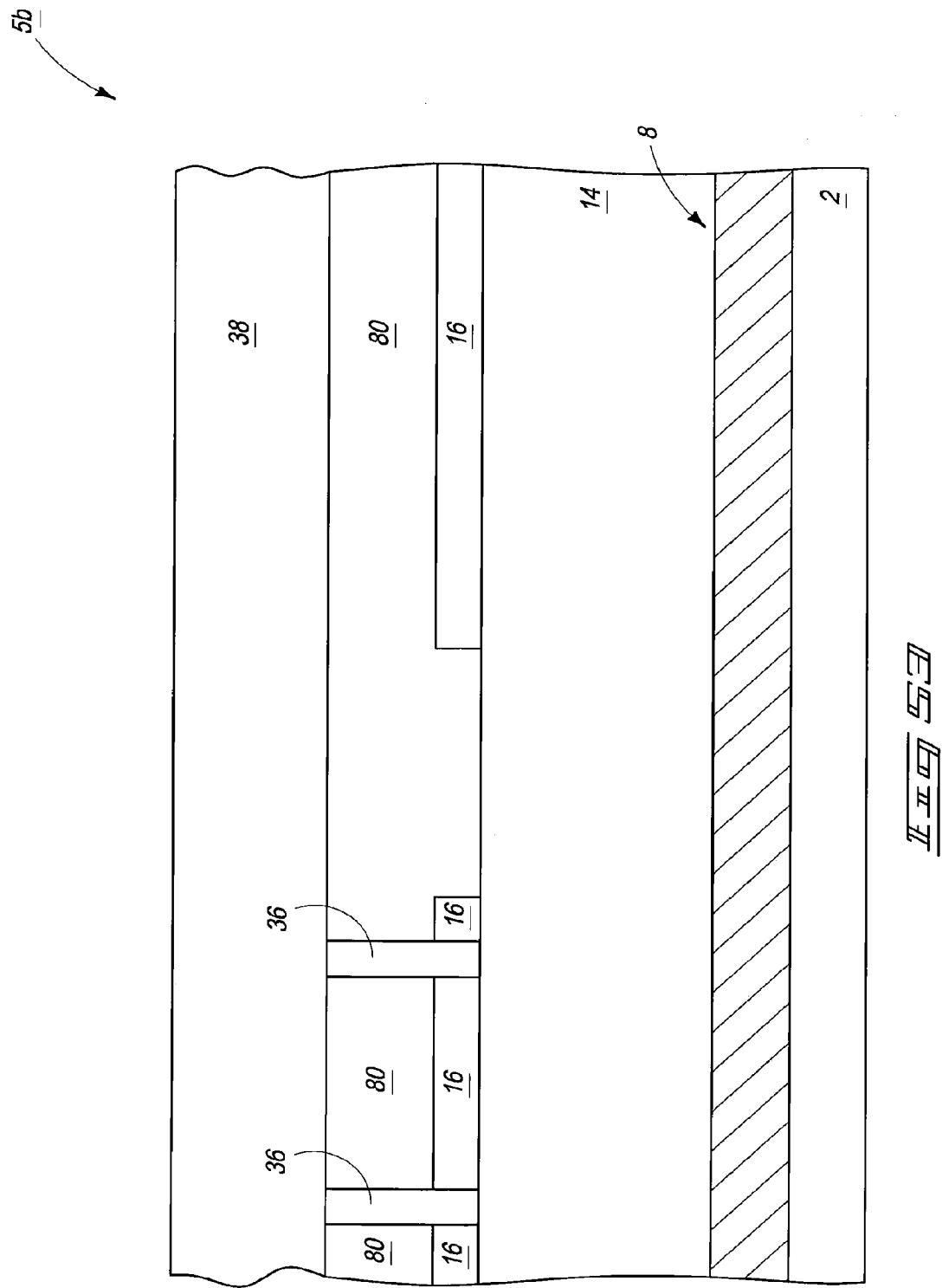

Referring to FIGS. 44 and 45, masking material 20 is stripped from over material 16. Such leaves the treated regions 70 along columns (for instance, the columns 24a, 26a, 28a, 30a and 32a shown in FIG. 45) analogous to the columns discussed above with reference to FIGS. 17-19. The treated regions 70 thus correspond to features arranged in a pattern which sparsely populates a two-dimensional array. In some embodiments, the treated regions may be referred to as spots arranged to sparsely populate a two-dimensional array.

Referring to FIGS. 46 and 47, construction 5a is shown at a processing stage analogous to that of FIGS. 23-25. Specifically, block copolymer has been applied over the construction and then subjected to conditions which induce self-assembly of the block copolymer to thereby create a pattern of first domains 40 and a second domain 42. The pattern formed within the block copolymer is aligned relative to the treated regions 70, and thus can be aligned relative to the patterned mask 20 (FIG. 38) utilized to create such treated regions. FIG. 42 shows that the patterned block copolymer forms the same two-dimensional array of features as the patterned block copolymer described above with reference to FIG. 23. However, the two-dimensional array of FIG. 23 contains two different types of features, with one of the features being the first domains 40 of the self-assembled block copolymer, and the other type of features being the structures 36. In contrast, the two-dimensional array of FIG. 47 contains only a single type of features, with all of such features being the first domains 40 of the self-assembled block copolymer. As discussed above with reference to FIG. 43, some of the treated regions 70 may comprise buttons of silicon dioxide, and accordingly some of the features of the two-dimensional array of FIG. 47 may differ from others in that some may contain a button of silicon dioxide while others do not. However, all of the features will primarily comprise first domains 40, and thus may be considered to be of the same type as one another.

FIG. 48 shows construction 5a at a processing stage subsequent to that of FIG. 41, and shows an embodiment in which structures 36 (FIG. 41) are only partially removed to leave buttons of material 34 remaining over regions 70. In subsequent processing, masking material 20 may be removed to form a structure analogous to that of FIGS. 44 and 45 (which has the buttons of material 34 over regions 70), and the buttons may be utilized as a sparsely populated array to align domains of block copolymer during self-assembly of the block copolymer (analogously to the alignment described with reference to FIGS. 46 and 47).

FIGS. 49-56 illustrate another example embodiment method of utilizing lithographically-patterned features as a sparsely populated array that pins block copolymer domains into a desired alignment.

FIGS. 49 and 50 show a construction 5b at a processing stage identical to that discussed above with reference to FIGS. 17-19. The construction comprises the pedestals 36 passing through material 16 and arranged over material 14, and comprises the trench 22 extending through material 16.

Referring to FIGS. 51 and 52, a film of material 80 is formed over materials 14 and 16, and between pedestals 36. Pedestals 36 have upper surfaces projecting through material 80, and such upper surfaces define a sparsely-populated array that will ultimately be utilized to pin block copolymer domains into a desired alignment. Material 80 may comprise a composition that is neutral-wetting relative to the individual blocks of the block copolymer, or preferential wetting to the opposite block preferred by pedestals 36. In some embodiments the material 80 may comprise a random distribution of the subunits of the block copolymer. Material 80 may be made insoluble to block copolymer and casting solvent by cross-linking and/or any other suitable process. In some embodiments material 80 may be referred to as a fill material, in that it fills gaps between the pedestals 36.

Figure 54:
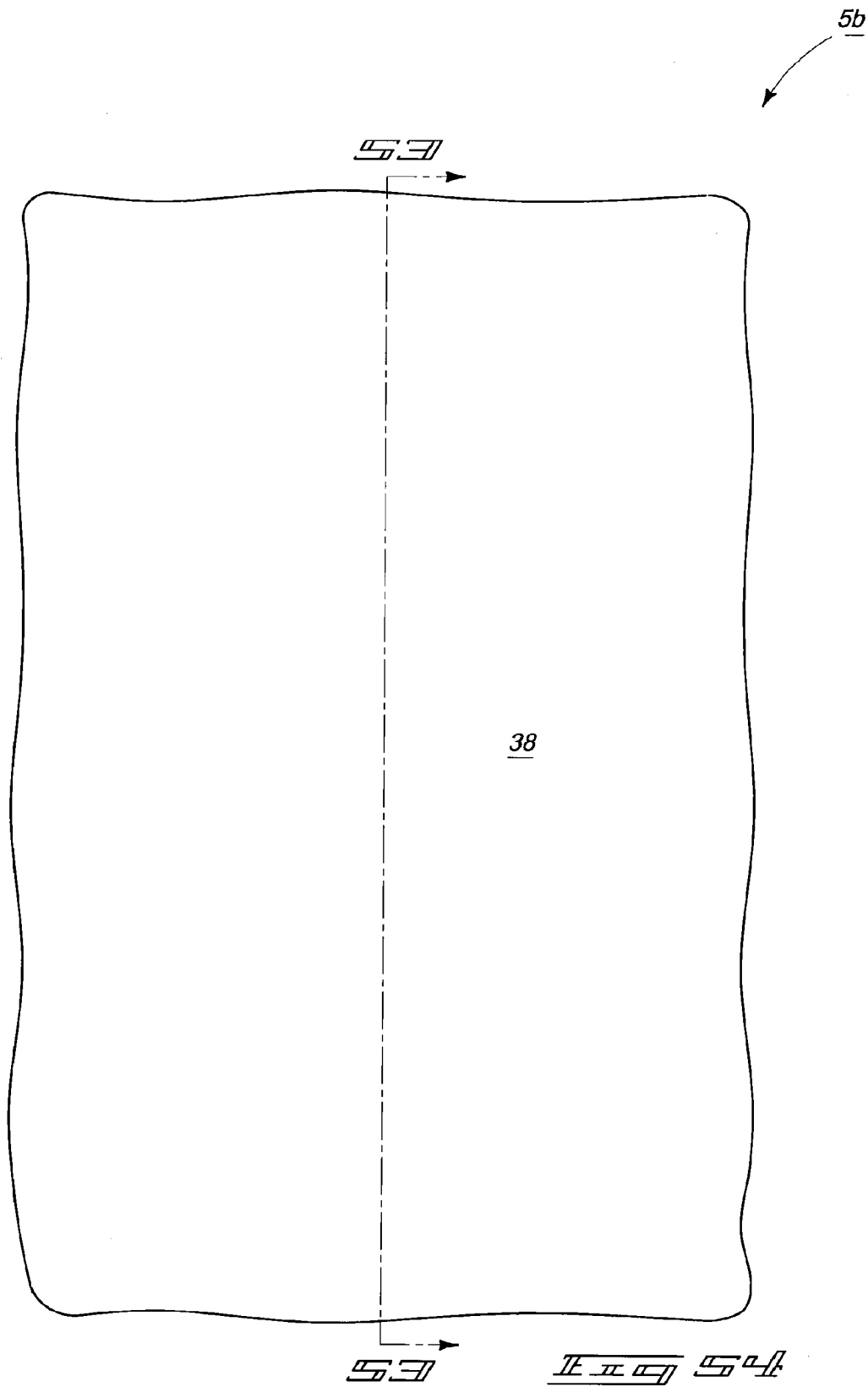

Referring to FIGS. 53 and 54, block copolymer 38 is formed over the film of material 80 and across pedestals 36.

Referring to FIGS. 55 and 56, the block copolymer 38 (FIGS. 53 and 54) is treated to induce self-assembly of the block copolymer into first domains 40 and a second domain 42 surrounding the first domains. The treatment utilized to induce the self-assembly may be any suitable treatment, such as, for example, utilization of exposure to one or both of solvent vapor and temperature changes. Although the second domain 42 is shown to be contiguous across the upper surface of construction 5*b*, in other embodiments the second domain may be broken up so that there are a plurality of the second domains instead of the single large second domain shown in FIG. 56.

Some of the domains 40 are aligned with upper surfaces of pedestals 36 due to the pedestals comprising a composition which is selectively wet by one subunit of the block copolymer relative to another subunit of the block copolymer. In some embodiments cross-linking material may be provided across the pedestals 36 and/or material 80 to lock the domains to the pedestals and/or material 80. The cross-linking material may be provided over upper surfaces of pedestals 36 and/or over an upper surface of material 80 prior to provision of block copolymer 38 (FIGS. 53 and 54).

The domains 40 may be removed with process analogous to that described above with reference to FIGS. 26-28 to form contact openings over an interconnect region. Subsequently, the contact openings may be extended through the fill material 80 and the insulative material 14 with processing analogous to that of FIGS. 29-31, and then filled with electrically conductive material with processing analogous to that of FIGS. 35-37.

The embodiments described with reference to FIGS. 1-56 are specifically illustrated as utilizing block copolymer which arranges in hexagonal closest packed unit cells. In other embodiments, other block copolymer may be utilized; such as, for example, block copolymer which arranges in cubic unit cells. Also, although the embodiments of FIGS. 1-56 are illustrated utilizing block copolymer which arranges to form domains corresponding to vertical cylinders, in other embodiments other types of block copolymer may be utilized. The graphoepitaxy applications of FIGS. 3-37 may be, for example, conducted utilizing block copolymer which arranges to form domains corresponding to spherical micelles.

Although the embodiments illustrated herein utilize a lithographically-patterned mask to define the locations of the features of a sparsely-populated array, in other embodiments such locations could be defined with other technologies. For instance, the locations could be defined utilizing sub-lithographic methodologies, such as, for example, pitch multiplication methodologies.

Some of the embodiments described herein form a pattern of openings within block copolymer (for instance, the openings 46 of FIG. 27), and then transfer such openings directly into an underlying material 14 (as shown, for example, at the processing stage of FIG. 30). In other embodiments (not shown), a hard mask may be formed over material 14, and the openings may be transferred into the hard mask and then into material 14. In some applications the block copolymer may not be robust enough or thick enough to fully pattern layer 14 if only the block copolymer is utilized as a mask, and the hard mask can be used in such applications to enable the material 14 to be fully patterned.

The embodiments discussed above may be utilized to form integrated circuitry. Such integrated circuitry may have numerous applications, and may be, for example, utilized in electronic systems, such as, computers, cars, airplanes, clocks, cellular phones, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. A method of forming patterns, comprising:
   forming a semiconductor substrate to comprise a set of electrically conductive structures under a material;
   forming features across the material in a pattern which sparsely populates a two-dimensional array in two directions wherein the two directions define a plane generally parallel with an upper surface of the semiconductor substrate, the two-dimensional array being aligned relative to the set of electrically conductive structures;
   forming block copolymer across the features and across a region proximate the features, and then inducing self-assembly of the block copolymer into first and second domains; the pattern from the features being propagated through the self-assembled block copolymer to further populate the two-dimensional array using the first domains of the self-assembled block copolymer;
   selectively removing the first domains relative to the second domains to form a pattern of openings through the self-assembled block copolymer;
   transferring a pattern of at least some of the openings through the material to extend the openings to the electrically conductive structures; and
   forming electrically conductive material within the openings to form electrical contacts extending through the material and to the electrically conductive structures.

2. The method of claim 1 wherein the features are formed on opposing sides of the two-dimensional array, but not across a middle of the two-dimensional array.

3. The method of claim 1 wherein the features are pedestals.

4. The method of claim 1 wherein the features are treated surface regions which are selectively wettable by one subunit of the block copolymer relative to another subunit of the block copolymer.

5. The method of claim 1 wherein the transferring of the pattern through the material comprises transferring the pattern of only some of the openings formed through the self-assembled block copolymer.

6. A method of forming patterns, comprising:
   forming a semiconductor substrate to comprise an electrically insulative material over a set of electrically conductive structures; an interconnect region being defined as a region across the electrically conductive structures, and regions on opposing sides of the interconnect region being defined as secondary regions;
   forming a two-dimensional array of features over the electrically insulative material in two directions wherein the two directions define a plane generally parallel with an upper surface of the semiconductor substrate, the two-dimensional array extending across the interconnect region and across the secondary regions; a section of the two-dimensional array being over the interconnect region;
   transferring a pattern of the section of the two-dimensional array through the electrically insulative material to form contact openings that extend through the electrically insulative material and to the electrically conductive structures; and forming electrically conductive material within the contact openings to form electrical contacts extending through the electrically insulative material and to the electrically conductive structures.

7. The method of claim 6 wherein the two-dimensional array includes only a single type of the feature; said single type being a domain of self-assembled block copolymer.

8. The method of claim 6 wherein the two-dimensional array includes two types of the features; one type being pedestals of a first material, and the other type being domains of self-assembled block copolymer.

9. The method of claim 8 wherein the domains are cylinders that extend normal relative to an upper surface of the electrically insulative material.

10. The method of claim 9 wherein the domains are the only type of the features within the interconnect region, and wherein the transferring of the section of the two-dimensional array through the electrically insulative material comprises removing the domains selectively relative to material adjacent the domains to form a pattern of openings within the interconnect region, and then using an etch to transfer such pattern into the electrically insulative material and thereby form the contact openings.

11. The method of claim 6 wherein the forming of the two-dimensional array includes forming pedestals of a first material to start the array, and then self-assembling block copolymer in a graphoepitaxy process in which a pattern from the pedestals is propagated through the self-assembled block copolymer to complete the array.

12. The method of claim 6 wherein the forming of the two-dimensional array includes forming spots of a first material in a pattern of a portion of the array, the first material being selectively wettable by one block of a block copolymer relative to another, and then self-assembling the block copolymer in an epitaxial process in which a pattern from the spots is propagated through the self-assembled block copolymer to form the array.

13. The method of claim 6 wherein the electrically conductive structures are electrically conductive lines that are under the interconnect region, and that extend to under at least one of the secondary regions.

14. The method of claim 6 wherein the electrically conductive structures are electrically conductive lines that are under the interconnect region, and that extend to under both of the secondary regions.

15. The method of claim 14 wherein the interconnect region is a stripe that extends linearly along a first direction, and wherein the lines extend linearly along a second direction that is substantially perpendicular to the first direction.

16. The method of claim 6 further comprising forming a masking material to be over the secondary regions and not over the interconnect region; and wherein the two-dimensional array of features includes pedestals that extend through the masking material to an upper surface of the electrically insulative material.

17. The method of claim 16 wherein the electrically insulative material is a silicon oxide-containing material, and wherein the masking material comprises silicon and nitrogen.

18. The method of claim 17 wherein the pedestals consist of silicon dioxide.

19. The method of claim 16 further comprising removing the masking material and the pedestals from over the electrically insulative material prior to forming the electrically conductive material within the contact openings.

20. The method of claim 6 wherein no portions of the two-dimensional array over the secondary regions is transferred into the electrically insulative material.

21. A method of forming patterns, comprising:
providing a semiconductor substrate comprising an upper surface;
forming features across a material in a pattern which partially populates a two-dimensional array in two directions wherein the two directions define a plane generally parallel with the upper surface of the semiconductor substrate; and
forming block copolymer across the features and across a region proximate the features, and inducing self-assembly of the block copolymer into first and second domains; the pattern from the features being propagated through the self-assembled block copolymer to further populate the two-dimensional array using the first domains of the self-assembled block copolymer.

22. The method of claim 21 further comprising selectively removing the first domains relative to the second domains to form a pattern of openings through the self-assembled block copolymer.

23. The method of claim 22 further comprising transferring a pattern of at least some of the openings through the material.

24. The method of claim 23 further comprising forming electrically conductive material within the openings to form electrical contacts extending through the material.

* * * * *

UNITED STATES PATENT AND TRADEMARK OFFICE
CERTIFICATE OF CORRECTION

| | | |
|---|---|---|
| PATENT NO. | : 8,815,497 B2 | Page 1 of 1 |
| APPLICATION NO. | : 13/941747 | |
| DATED | : August 26, 2014 | |
| INVENTOR(S) | : Millward et al. | |

It is certified that error appears in the above-identified patent and that said Letters Patent is hereby corrected as shown below:

On the title page, Item [72], line 4, delete "Clifton," and insert -- Clifton Park, --, therefor.

Signed and Sealed this
Twenty-eighth Day of October, 2014

Michelle K. Lee
*Deputy Director of the United States Patent and Trademark Office*